(12) United States Patent
Kimura et al.

(10) Patent No.: US 11,856,792 B2
(45) Date of Patent: *Dec. 26, 2023

(54) SEMICONDUCTOR DEVICE AND ELECTRONIC DEVICE

(71) Applicant: Semiconductor Energy Laboratory Co., Ltd., Atsugi (JP)

(72) Inventors: Hajime Kimura, Atsugi (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,940

(22) Filed: Aug. 10, 2022

(65) Prior Publication Data

US 2022/0384522 A1    Dec. 1, 2022

Related U.S. Application Data

(63) Continuation of application No. 17/278,675, filed as application No. PCT/IB2019/058507 on Oct. 7, 2019, now Pat. No. 11,417,704.

(30) Foreign Application Priority Data

Oct. 19, 2018   (JP) .................................. 2018-197383
Jul. 26, 2019   (JP) .................................. 2019-138187

(51) Int. Cl.
  *H10B 61/00*   (2023.01)
  *H03K 19/20*   (2006.01)
  *H10B 63/00*   (2023.01)

(52) U.S. Cl.
  CPC ............. *H10B 61/20* (2023.02); *H03K 19/20* (2013.01); *H10B 61/10* (2023.02); *H10B 63/30* (2023.02)

(58) Field of Classification Search
  None
  See application file for complete search history.

(56) References Cited

U.S. PATENT DOCUMENTS 6,493,263 B1   12/2002   Shibata et al.
10,650,766 B2   5/2020   Kurokawa et al.
(Continued)

FOREIGN PATENT DOCUMENTS

JP   02-059956 A   2/1990
JP   2007-241475 A   9/2007
(Continued)

OTHER PUBLICATIONS

International Search Report (Application No. PCT/IB2019/058507) dated Dec. 17, 2019.
(Continued)

*Primary Examiner* — Jany Richardson
(74) *Attorney, Agent, or Firm* — ROBINSON INTELLECTUAL PROPERTY LAW OFFICE, P.C.; Eric J. Robinson

(57) ABSTRACT

A semiconductor device that can perform product-sum operation with low power consumption is provided. The semiconductor device includes first and second circuits; the first circuit includes a first holding node and the second circuit includes a second holding node. The first circuit is electrically connected to first and second input wirings and first and second wirings, the second circuit is electrically connected to the first and second input wirings and the first and second wirings, and the first and second circuits each have a function of holding first and second potentials corresponding to first data at the first and second holding nodes. When a potential corresponding to second data is input to each of the first and second input wirings, the first circuit outputs a current to one of the first wiring and the second wiring and the second circuit outputs a current to the (Continued)

other of the first wiring and the second wiring. The currents output from the first and second circuits to the first wiring or the second wiring are determined in accordance with the first and second potentials held at the first and second holding nodes.

6 Claims, 42 Drawing Sheets

(56) References Cited

U.S. PATENT DOCUMENTS

| | | | |
|---|---|---|---|
| 10,885,877 B2 | 1/2021 | Kurokawa | |
| 11,062,666 B2 | 7/2021 | Kurokawa et al. | |
| 11,101,302 B2 * | 8/2021 | Ikeda | H01L 29/7869 |
| 11,373,612 B2 | 6/2022 | Kurokawa et al. | |
| 2005/0275647 A1 | 12/2005 | Numao | |
| 2017/0154909 A1 | 6/2017 | Ishizu | |
| 2017/0270405 A1 * | 9/2017 | Kurokawa | G06N 3/08 |
| 2018/0181862 A1 | 6/2018 | Ikeda | |
| 2019/0019458 A1 | 1/2019 | Teraguchi | |
| 2020/0006567 A1 | 1/2020 | Endo et al. | |
| 2021/0118408 A1 | 4/2021 | Kurokawa | |

FOREIGN PATENT DOCUMENTS

| | | |
|---|---|---|
| JP | 2018-109968 A | 7/2018 |
| TW | 201832197 | 9/2018 |
| WO | WO-2018/134701 | 7/2018 |
| WO | WO-2018/138603 | 8/2018 |

OTHER PUBLICATIONS

Written Opinion (Application No. PCT/IB2019/058507) dated Dec. 17, 2019.

Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.

Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.

Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.

Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

Akyel.K et al., "DRC2: Dynamically Reconfigurable Computing Circuit based on memory architecture", IEEE International Conference on Rebooting Computing, Oct. 17, 2016, pp. 1-8 pages.

Agrawal.A et al., "X-SRAM: Enabling In-Memory Boolean Computations in CMOS Static Random Access Memories", IEEE Transactions on Circuits and Systems, Jul. 2, 2018, pp. 1-14.

Taiwanese Office Action (Application No. 108136531) dated Apr. 27, 2023.

* cited by examiner

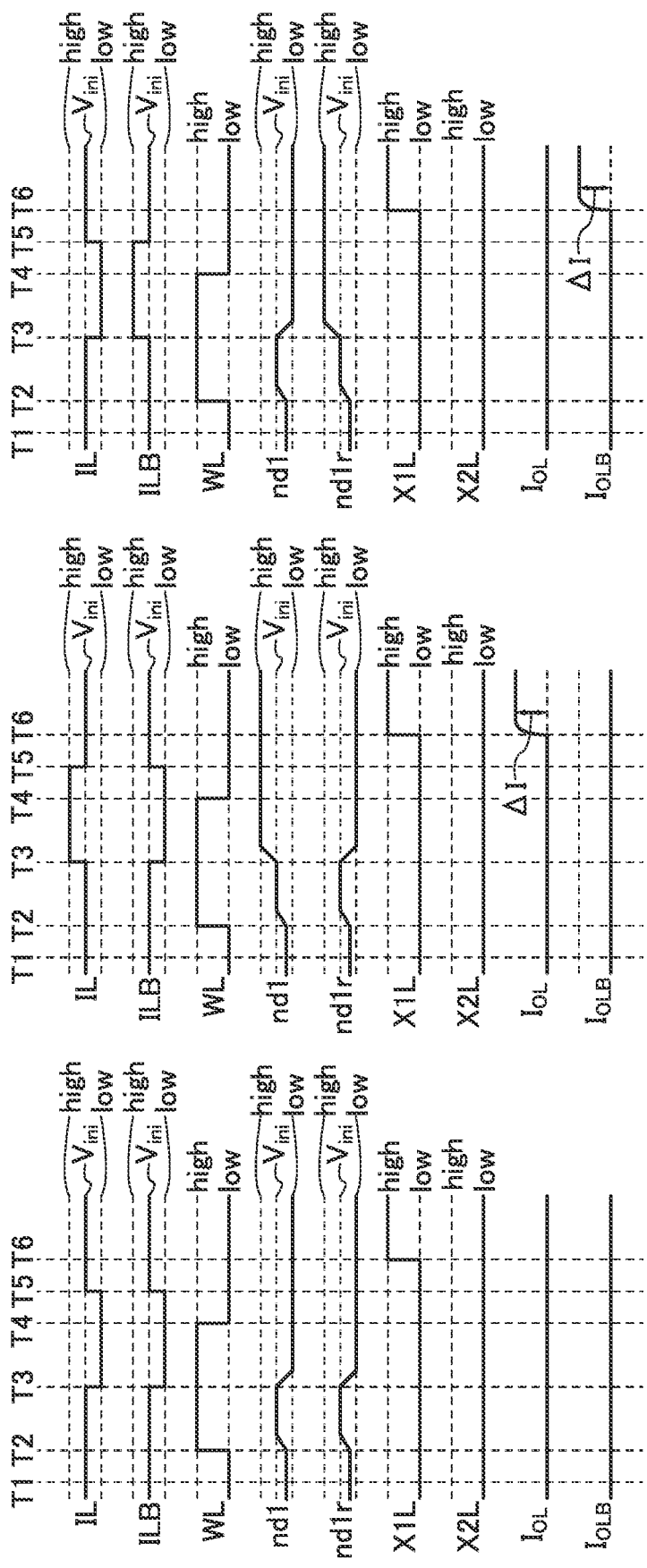

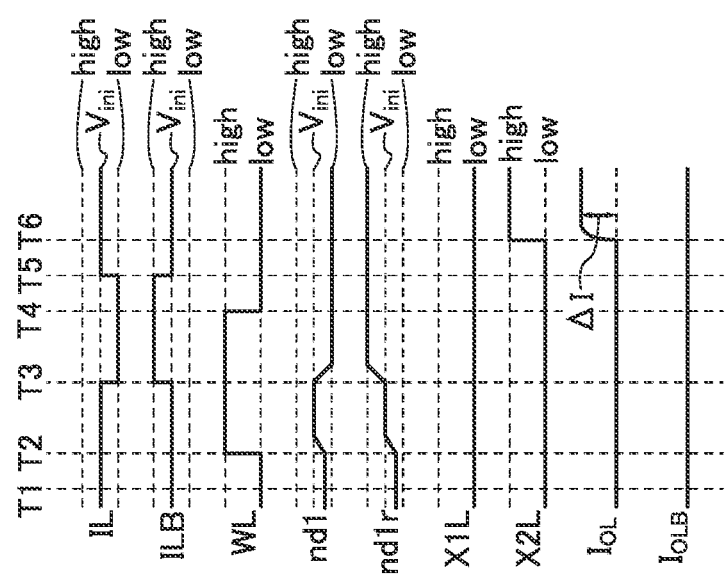
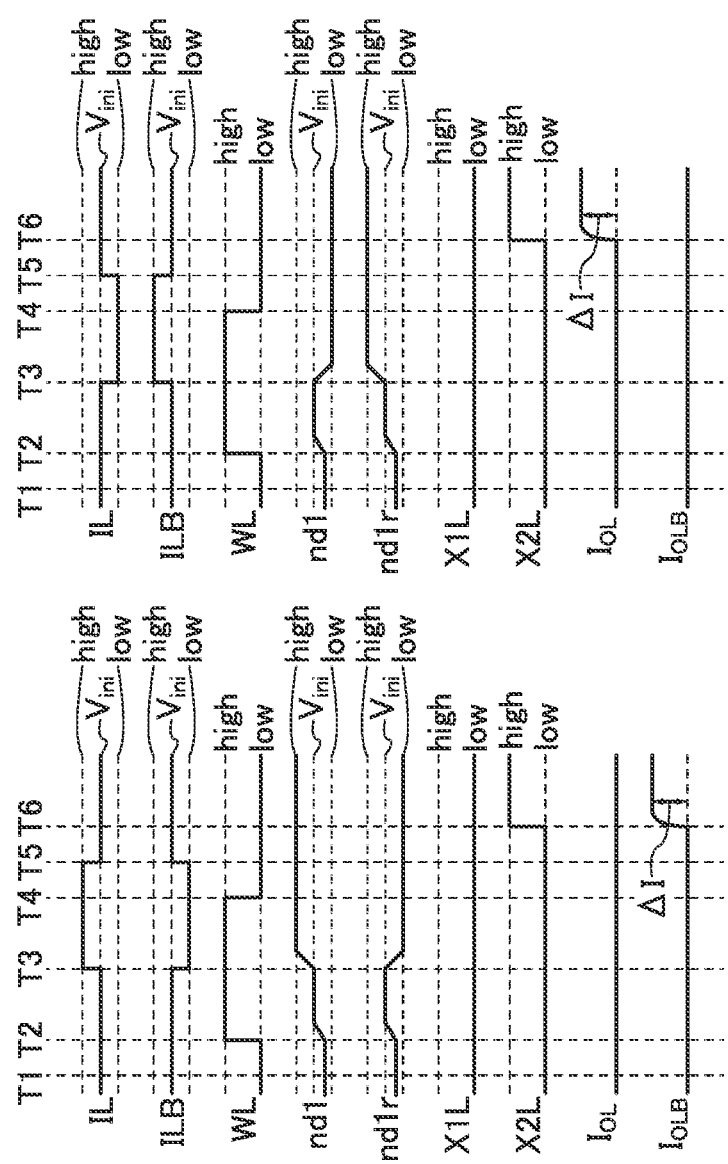
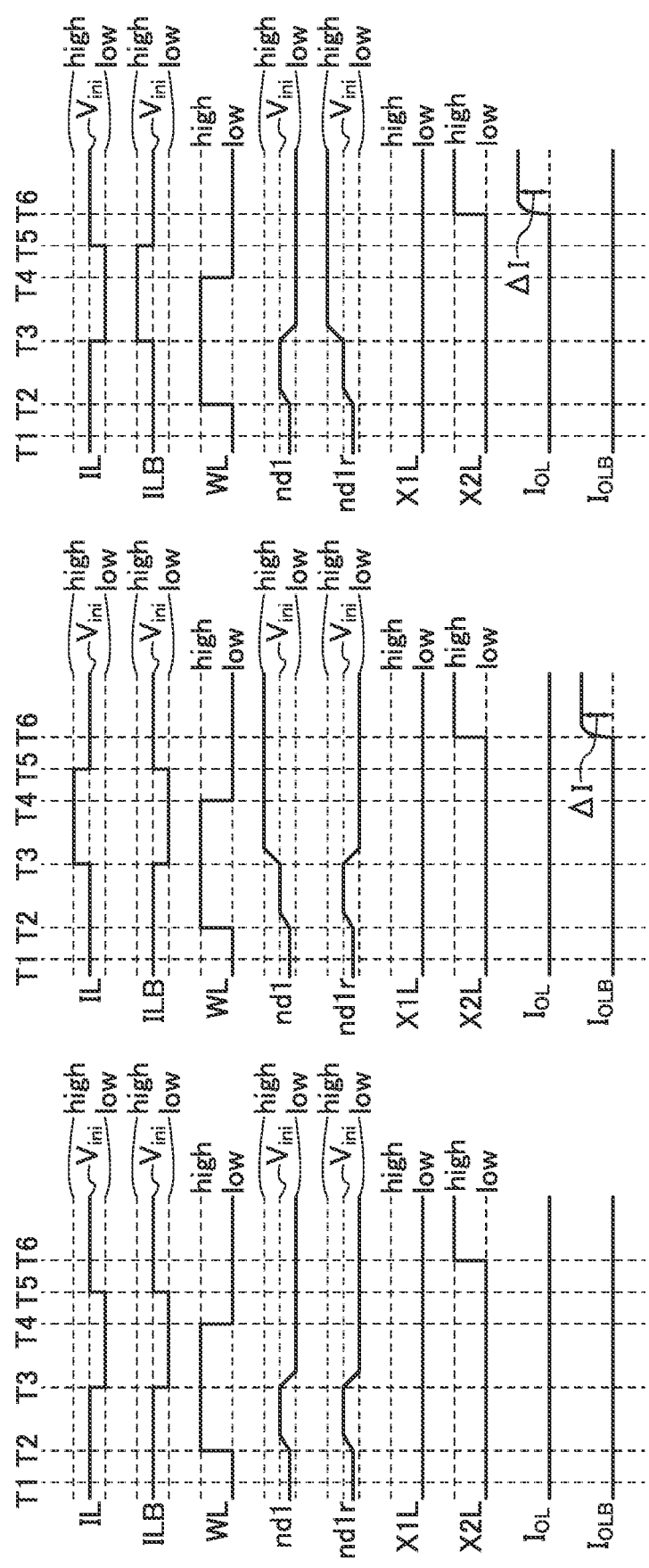

600A

600A

600A

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to neurons and synapses of the human brain. Such integrated circuits may therefore be called "neuromorphic", "brain-morphic", or "brain-inspired" circuits. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including neurons and synapses is referred to as an artificial neural network (ANN). For example, Non-Patent Document 1 and Non-Patent Document 2 each disclose an arithmetic device including an artificial neural network constructed using SRAM (Static Random Access Memory).

REFERENCE

Non-Patent Document

[Non-Patent Document 1] M. Kang et al., "IEEE Journal Of Solid-State Circuits", 2018, Volume 53, No. 2, pp. 642-655.
[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

In general, an artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed; for example, the number of the connection strengths and the number of parameters indicating the signals are determined in accordance with the scale of the artificial neural network. That is, in the artificial neural network, as the number of layers, the number of neurons, and the like increase, the number of circuits corresponding to the neurons and synapses also increases, which sometimes makes the amount of arithmetic operation enormous.

As the number of circuits included in a chip increases, the power consumption increases and the amount of heat generated when a device is driven also increases. In particular, a larger amount of heat generation is more likely to affect the characteristics of circuit elements included in a chip; thus, a circuit constituting the chip preferably includes circuit elements that are less affected by temperature.

An object of one embodiment of the present invention is to provide a semiconductor device and the like including a hierarchical artificial neural network. Another object of one embodiment of the present invention is to provide a semiconductor device and the like with low power consumption. Another object of one embodiment of the present invention is to provide a semiconductor device and the like that are less affected by environmental temperature. Another object of one embodiment of the present invention is to provide a novel semiconductor device and the like.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including a first circuit and a second circuit. The first circuit includes a first holding node; the second circuit includes a second holding node; the first circuit is electrically connected to a first input wiring, a second input wiring, a first wiring, and a second wiring; the second circuit is electrically connected to the first input wiring, the second input wiring, the first wiring, and the second wiring; the first circuit has a function of holding a first potential corresponding to first data at the first holding node; the second circuit has a function of holding a second potential corresponding to the first data at the second holding node; the first circuit has a function of outputting a current corresponding to the first potential to the first wiring when a high-level potential is input to the first input wiring and a low-level potential is input to the second input wiring, a function of outputting a current corresponding to the first potential to the second wiring when a low-level potential is input to the first input wiring and a high-level potential is input to the second input wiring, and a function of not outputting a current corresponding to the first potential to the first wiring and the second wiring when a low-level potential is input to the first input wiring and a low-level potential is input to the second input wiring; and the second circuit has a function of outputting a current corresponding to the second potential to the second wiring when a high-level potential is input to the first input wiring and a low-level potential is input to the second input wiring, a function of outputting a current corresponding to the second potential to the first wiring when a low-level potential is input to the first input wiring and a high-level potential is input to the second input wiring, and a function of not outputting a current corresponding to the second potential to the first wiring and the second wiring when a low-level potential is input to the first input wiring and a low-level potential is input to the second input wiring.

(2)

Another embodiment of the present invention is the semiconductor device with the above structure (1). The first circuit includes first to fourth transistors and a first capacitor; the second circuit includes fifth to eighth transistors and a second capacitor; the first holding node is electrically connected to a first terminal of the first transistor, a gate of the second transistor, and a first terminal of the first capacitor; a first terminal of the second transistor is electrically connected to a second terminal of the first capacitor; a second terminal of the second transistor is electrically connected to a first terminal of the third transistor and a first terminal of the fourth transistor; a gate of the third transistor is electrically connected to the first input wiring; a gate of the fourth transistor is electrically connected to the second input wiring; a second terminal of the third transistor is electrically connected to the first wiring; a second terminal of the fourth transistor is electrically connected to the second wiring; the second holding node is electrically connected to a first terminal of the fifth transistor, a gate of the sixth transistor, and a first terminal of the second capacitor; a first terminal of the sixth transistor is electrically connected to a second terminal of the second capacitor; a second terminal of the sixth transistor is electrically connected to a first terminal of the seventh transistor and a first terminal of the eighth transistor; a gate of the seventh transistor is electrically connected to the first input wiring; a gate of the eighth transistor is electrically connected to the second input wiring; a second terminal of the seventh transistor is electrically connected to the second wiring; and a second terminal of the eighth transistor is electrically connected to the first wiring.

(3)

Another embodiment of the present invention is the semiconductor device according to (1) above. The first circuit includes first to fourth transistors, a ninth transistor, and a first capacitor; the second circuit includes fifth to eighth transistors, a tenth transistor, and a second capacitor; the first holding node is electrically connected to a first terminal of the first transistor, a gate of the second transistor, a gate of the ninth transistor, and a first terminal of the first capacitor; a second terminal of the first capacitor is electrically connected to a first terminal of the second transistor and a first terminal of the ninth transistor; a second terminal of the second transistor is electrically connected to a first terminal of the third transistor; a second terminal of the ninth transistor is electrically connected to a first terminal of the fourth transistor; a gate of the third transistor is electrically connected to the first input wiring; a gate of the fourth transistor is electrically connected to the second input wiring; a second terminal of the third transistor is electrically connected to the first wiring; a second terminal of the fourth transistor is electrically connected to the second wiring; the second holding node is electrically connected to a first terminal of the fifth transistor, a gate of the sixth transistor, a gate of the tenth transistor, and a first terminal of the second capacitor; a second terminal of the second capacitor is electrically connected to a first terminal of the sixth transistor and a first terminal of the tenth transistor; a second terminal of the sixth transistor is electrically connected to a first terminal of the seventh transistor; a second terminal of the tenth transistor is electrically connected to a first terminal of the eighth transistor; a gate of the seventh transistor is electrically connected to the first input wiring; a gate of the eighth transistor is electrically connected to the second input wiring; a second terminal of the seventh transistor is electrically connected to the second wiring; and a second terminal of the eighth transistor is electrically connected to the first wiring.

(4)

Another embodiment of the present invention is the semiconductor device with the above structure (1). The first circuit includes first to fourth transistors, a first logic circuit, and a second logic circuit; the second circuit includes fifth to eighth transistors, a third logic circuit, and a fourth logic circuit; the first to fourth logic circuits each have a function of outputting an inverted signal of a signal input to an input terminal from an output terminal; the first holding node is electrically connected to an input terminal of the first logic circuit, an output terminal of the second logic circuit, a first terminal of the first transistor, and a gate of the second transistor; an output terminal of the first logic circuit is electrically connected to an input terminal of the second logic circuit; a second terminal of the second transistor is electrically connected to a first terminal of the third transistor and a first terminal of the fourth transistor; a gate of the third transistor is electrically connected to the first input wiring; a gate of the fourth transistor is electrically connected to the second input wiring; a second terminal of the third transistor is electrically connected to the first wiring; a second terminal of the fourth transistor is electrically connected to the second wiring; the second holding node is electrically connected to an input terminal of the third logic circuit, an output terminal of the fourth logic circuit, a first terminal of the fifth transistor, and a gate of the sixth transistor; an output terminal of the third logic circuit is electrically connected to an input terminal of the fourth logic circuit; a second terminal of the sixth transistor is electrically connected to a first terminal of the seventh transistor and a first terminal of the eighth transistor; a gate of the seventh transistor is electrically connected to the first input wiring; a gate of the eighth transistor is electrically connected to the second input wiring; a second terminal of the seventh transistor is electrically connected to the second wiring; and a second terminal of the eighth transistor is electrically connected to the first wiring.

(5)

Another embodiment of the present invention is the semiconductor device with the above structure (1). The first circuit includes first to fourth transistors, a first logic circuit, and a second logic circuit; the second circuit includes sixth to eighth transistors; the first logic circuit and the second logic circuit each have a function of outputting an inverted signal of a signal input to an input terminal from an output terminal; the first holding node is electrically connected to an input terminal of the first logic circuit, an output terminal of the second logic circuit, a first terminal of the first transistor, and a gate of the second transistor; an output terminal of the first logic circuit is electrically connected to an input terminal of the second logic circuit; a second terminal of the second transistor is electrically connected to a first terminal of the third transistor and a first terminal of the fourth transistor; a gate of the third transistor is electrically connected to the first input wiring; a gate of the fourth transistor is electrically connected to the second input wiring; a second terminal of the third transistor is electrically connected to the first wiring; a second terminal of the fourth transistor is electrically connected to the second wiring; the second holding node is electrically connected to the input terminal of the second logic circuit, the output terminal of the first logic circuit, and a gate of the sixth transistor; a second terminal of the sixth transistor is electrically connected to a first terminal of the seventh transistor and a first terminal of the eighth transistor; a gate of the seventh transistor is electrically connected to the first input wiring; a gate of the eighth transistor is electrically connected to the second input wiring; a second terminal of the seventh transistor is electrically connected to the second wiring; and a second terminal of the eighth transistor is electrically connected to the first wiring.

(6)

Another embodiment of the present invention is a semiconductor device including a first circuit and a second circuit. The first circuit includes a first load circuit; the second circuit includes a second load circuit; the first load circuit and the second load circuit each include a first terminal and a second terminal; the first load circuit and the second load circuit each have a function of changing a resistance between the first terminal and the second terminal in accordance with first data; the first circuit is electrically connected to a first input wiring, a second input wiring, a first wiring, and a second wiring; the second circuit is electrically connected to the first input wiring, the second input wiring, the first wiring, and the second wiring; the first circuit has a function of outputting a current corresponding to the resistance of the first load circuit to the first wiring when a high-level potential is input to the first input wiring and a low-level potential is input to the second input wiring, a function of outputting a current corresponding to the resistance of the first load circuit to the second wiring when a low-level potential is input to the first input wiring and a high-level potential is input to the second input wiring, and a function of not outputting a current corresponding to the resistance of the first load circuit to the first wiring and the second wiring when a low-level potential is input to the first input wiring and a low-level potential is input to the second input wiring; and the second circuit has a function of outputting a current corresponding to the resistance of the second load circuit to the second wiring when a high-level potential is input to the first input wiring and a low-level potential is input to the second input wiring, a function of outputting a current corresponding to the resistance of the second load circuit to the first wiring when a low-level potential is input to the first input wiring and a high-level potential is input to the second input wiring, and a function of not outputting a current corresponding to the resistance of the second load circuit to the first wiring and the second wiring when a low-level potential is input to the first input wiring and a low-level potential is input to the second input wiring.

(7)

Another embodiment of the present invention is the semiconductor device with the above structure (6). The first circuit includes a third transistor and a fourth transistor; the second circuit includes a seventh transistor and an eighth transistor; the first terminal of the first load circuit is electrically connected to a first terminal of the third transistor and a first terminal of the fourth transistor; a gate of the third transistor is electrically connected to the first input wiring; a gate of the fourth transistor is electrically connected to the second input wiring; a second terminal of the third transistor is electrically connected to the first wiring; a second terminal of the fourth transistor is electrically connected to the second wiring; the first terminal of the second load circuit is electrically connected to a first terminal of the seventh transistor and a first terminal of the eighth transistor; a gate of the seventh transistor is electrically connected to the first input wiring; a gate of the eighth transistor is electrically connected to the second input wiring; a second terminal of the seventh transistor is electrically connected to the second wiring; and a second terminal of the eighth transistor is electrically connected to the first wiring.

(8)

Another embodiment of the present invention is the semiconductor device with the above structure (7). The first circuit includes a first transistor; the second circuit includes a second transistor; a first terminal of the first transistor is electrically connected to the first terminal of the first load circuit; and a first terminal of the second transistor is electrically connected to the first terminal of the second load circuit.

(9)

Another embodiment of the present invention is the semiconductor device with any one of the above structures (6) to (8). The first load circuit includes any one of a variable resistor, an MTJ element, and a phase-change memory; and the second load circuit includes any one of a variable resistor, an MTJ element, and a phase-change memory.

(10)

Another embodiment of the present invention is the semiconductor device with any one of the above structures (1) to (9), including a third circuit and a fourth circuit. The third circuit has a function of inputting a potential corresponding to the second data to the first input wiring and the second input wiring; and the fourth circuit has a function of comparing currents flowing from the first wiring and the second wiring and outputting a potential corresponding to a product of the first data and the second data from an output terminal of the fourth circuit.

(11)

An electronic device including the semiconductor device according to any one of (1) to (10) above and performing arithmetic operation of a neural network by the semiconductor device.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, the switch has a function of being in a conduction state (on state) or a non-conduction state (off state) to determine whether a current flows or not.

For example, in the case where X and Y are functionally connected, at least one circuit that enables functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y For example, even when another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples, and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be expressed as the "potential". The ground potential does not necessarily mean 0 V. Potentials are relative values, and the potential applied to a wiring or the like is sometimes changed depending on the reference potential.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to terms used in the specification and the like, and the description can be made appropriately according to circumstances. For example, the expression "an insulator positioned over (on) a top surface of a conductor" can be replaced with the expression "an insulator positioned on a bottom surface of a conductor" when the direction of a drawing showing these components is rotated by 180°.

Furthermore, the term "over" or "under" does not necessarily mean that a component is placed directly on or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, a term such as an "electrode" or a "wiring" does not limit the function of a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

Effect of the Invention

One embodiment of the present invention can provide a semiconductor device and the like including a hierarchical artificial neural network. Alternatively, one embodiment of the present invention can provide a semiconductor device and the like with low power consumption. Alternatively, one embodiment of the present invention can provide a semiconductor device and the like that are less affected by environmental temperature. Alternatively, one embodiment of the present invention can provide a novel semiconductor device and the like.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 13A, FIG. 13B, and FIG. 13C are timing charts showing operation examples of a circuit included in a semiconductor device.

FIG. 14A, FIG. 14B, and FIG. 14C are timing charts showing operation examples of a circuit included in a semiconductor device.

MODE FOR CARRYING OUT THE INVENTION

Figure 1A:
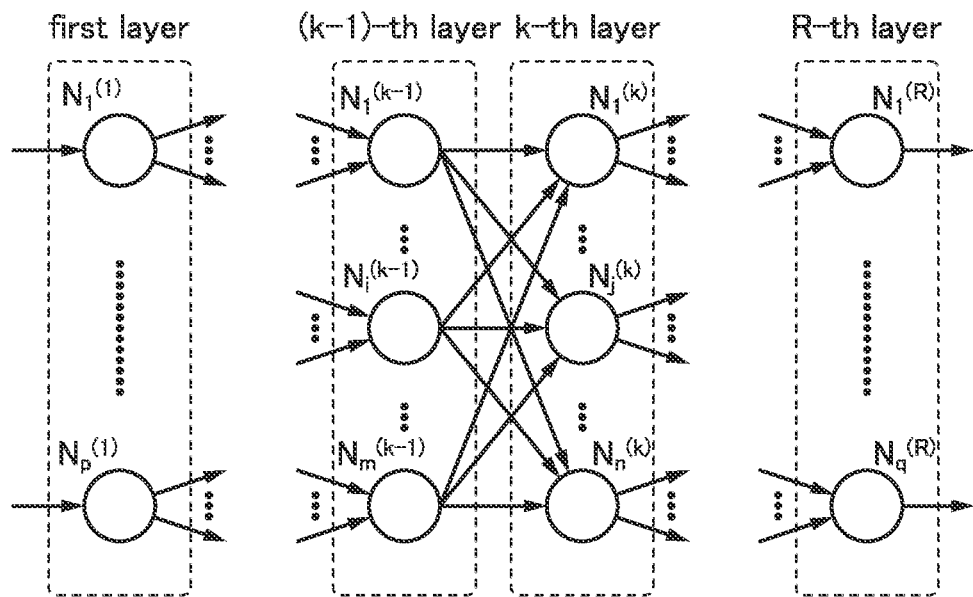
FIG. 1A and FIG. 1B are diagrams illustrating a hierarchical neural network.

In an artificial neural network (hereinafter, referred to as a neural network), the connection strength between synapses can be changed when existing data is given to the neural network. The processing for determining a connection strength by providing a neural network with existing data in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. Moreover, when an OS FET or an OS transistor is described, it can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, an arithmetic circuit that is a semiconductor device of one embodiment of the present invention and performs arithmetic operation of a neural network will be described.

<Hierarchical Neural Network>

First, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 1A is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 1A illustrates the (k−1)-th layer and the k-th layer (here, k is an integer greater than or equal to 3 and less than or equal to R−1) as the intermediate layers, and does not show the other intermediate layers.

Each of the layers of the neural network 100 includes one or a plurality of neurons. In FIG. 1A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

FIG. 1A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made with a focus on the neuron $N_j^{(k)}$ in the k-th layer.

Figure 1B:
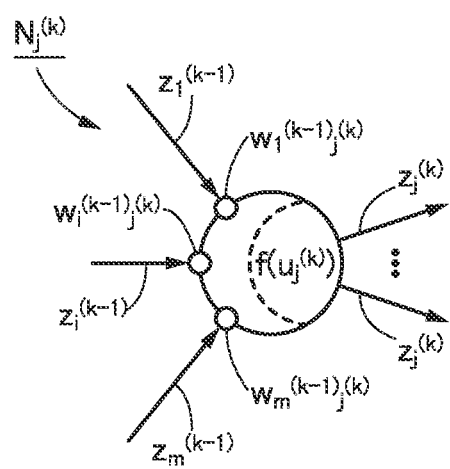

FIG. 1B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as weight coefficient) of the synapse that connects the neurons to each other. In the neural network 100, a signal output from a neuron in one layer is multiplied by a corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)(k)}_j$, a signal input to the neuron $N_j^{(k)}$ in the k-th layer can be expressed by Formula (1.1).

[Formula 1]

$$w_i^{(k-1)(k)}_j \cdot z_i^{(k-1)} \quad (1.1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_{1(k-1)}$ to $z_m^{(k-1)}$ are multiplied by respective weight coefficients ($w_1^{(k-1)(k)}_j$ to $w_m^{(k-1)(k)}_j$). Then, $w_1^{(k-1)(k)}_j \cdot z$ to $w_m^{(k-1)(k)}_j \cdot z_m^{(k-1)}$ are input to the neuron $N_j^{(k)}$ in the k-th layer. At that time, the total sum $u_j^{(k)}$ of the signals input to the neuron $N_j^{(k)}$ in the k-th layer is expressed by Formula (1.2).

[Formula 2]

$$u_j^{(k)} = \sum_{i=1}^{m} w_{ij}^{(k-1)(k)} \cdot z_i^{(k-1)} \quad (1.2)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 3]

$$z_j^{(k)} = f(u_j^{(k)}) \quad (1.3)$$

A function $f(u_j^{(k)})$ is an activation function in a hierarchical neural network, and a step function, a linear ramp function, a sigmoid function, or the like can be used. Note that the activation function may be the same or different among all neurons. Additionally, the neuron activation function may be the same or different between the layers.

Signals output from the neurons in the layers may each be an analog value or a digital value. For example, a binary or ternary digital value may be used. In the case of an analog value, for example, a linear ramp function or a sigmoid function is used as the activation function. In the case of a binary digital value, a step function with an output of −1 or 1 or an output of 0 or 1 is used. Alternatively, the neurons in the layers may each output a ternary or higher-level signal; in this case, a step function with an output of −1, 0, or 1 or a step function with an output of 0, 1, or 2 is used as a ternary activation function.

The neural network 100 performs operation in which by input of an input signal to the first layer (the input layer), output signals are sequentially generated in layers from the first layer (the input layer) to the last layer (the output layer) according to Formulae (1.1) to (1.3) on the basis of the signals input from the previous layers, and the output signals are output to the subsequent layers. The signal output from the last layer (the output layer) corresponds to the calculation results of the neural network 100.

<Configuration Example of Arithmetic Circuit>

Here, the description is made on an example of an arithmetic circuit that is capable of performing the arithmetic operation in Formula (1.2) and Formula (1.3) in the above-described neural network 100. Note that in the arithmetic circuit, for example, a weight coefficient of a synapse circuit of the neural network 100 has two levels (a combination of "−1" and "+1", a combination of "0" and "+1", or the like) or three levels (a combination of "−1", "0", and "1" or the like), and a neuron activation function is a function with an output of two levels (a combination of "−1" and "+1", a combination of "0" and "+1", or the like) or three levels (a combination of "−1", "0", and "1" or the like). In this specification and the like, one of a weight coefficient and a value of a signal (referred to as an arithmetic value in some cases) input from a neuron in the previous layer to a neuron in the subsequent layer is referred to as first data, and the other is referred to as second data.

Figure 2:
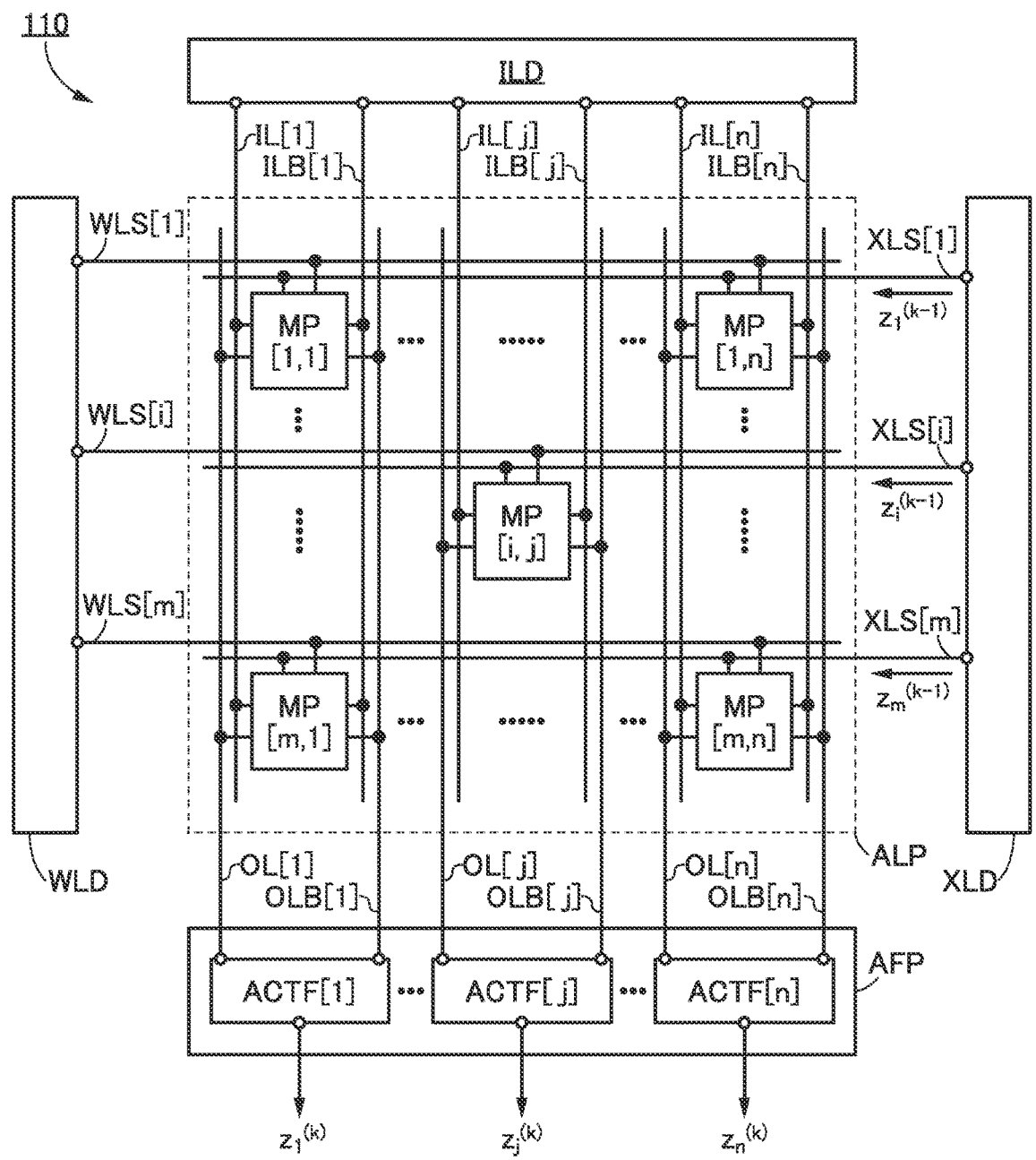
FIG. 2 is a circuit diagram showing a configuration example of a semiconductor device.

An arithmetic circuit 110 illustrated in FIG. 2 is a semiconductor device including an array portion ALP, a circuit ILD, a circuit WLD, a circuit XLD, and a circuit AFP, for example. The arithmetic circuit 110 is a circuit that processes the signals $z_1^{(k-1)}$ to $z_m^{(k-1)}$ input to the neuron $N_1^{(k)}$ to the neuron $N_n^{(k)}$ in the k-th layer in FIG. 1A and FIG. 1B and generates signals $z_1^{(k)}$ to $z_n^{(k)}$ respectively output from the neuron $N_1^{(k)}$ to the neuron $N_n^{(k)}$.

Note that the whole or part of the arithmetic circuit 110 may be used for applications other than a neural network and AI. For example, in the case where product-sum operation processing or matrix operation processing is performed in calculation for graphics, calculation for scientific calculation, or the like, the processing may be performed using the whole or part of the arithmetic circuit 110. In other words, the whole or part of the arithmetic circuit 110 may be used for not only calculation for AI but also general calculation.

The circuit ILD is electrically connected to a wiring IL[1] to a wiring IL[n] and a wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The array portion ALP includes m×n circuits MP, for example. The circuits MP are arranged in a matrix of m rows and n columns in the array portion ALP, for example. Note that in FIG. 2, the circuit MP in the i-th row and the j-th column (here, i is an integer greater than or equal to 1 and less than or equal to m, and j is an integer greater than or equal to 1 and less than or equal to n) is denoted as a circuit MP[i,j]. Note that FIG. 2 illustrates only the circuit MP[1,1], the circuit MP[m,1], the circuit MP[i,j], the circuit MP[1,n], and the circuit MP[m,n] and does not show the other circuits MPC.

The circuit MP[i,j] is electrically connected to a wiring IL[j], a wiring ILB[j], a wiring WLS[i], a wiring XLS[i], a wiring OL[j], and a wiring OLB[j], for example.

The circuit MP[i,j] has a function of holding a weight coefficient between the neuron $N_i^{(k-1)}$ and the neuron $N_j^{(k)}$ (referred to as one of the first data and the second data in some cases, and here referred to as the first data), for example. Specifically, the circuit MP[i,j] holds information (e.g., a potential, a resistance, or a current value) corresponding to the first data (weight coefficient) input from the wiring IL[j] and the wiring ILB[j]. In addition, the circuit MP[i,j] has a function of outputting the product of a signal $z_i^{(k-1)}$ output from the neuron $N_i^{(k-1)}$ (referred to as the other of the first data and the second data in some cases, and here referred to as the second data) and the first data. As a specific example, when the second data $z_i^{(k-1)}$ is input from the wiring XLS[i], the circuit MP[i,j] outputs to the wiring OL[j] and the wiring OLB[j] information (e.g., a current or a voltage) corresponding to the product of the first data and the second data or an information (e.g., a current or a voltage) current related to the product of the first data and the second data. Note that although the example in which the wiring IL[j] and the wiring ILB[j] are provided is described, one embodiment of the present invention is not limited thereto. Either one of the wiring IL[j] and the wiring ILB[j] may be provided. Note that although the example in which the wiring OL[j] and the wiring OLB[j] are provided is described, one embodiment of the present invention is not limited thereto. Either one of the wiring OL[j] and the wiring OLB[j] may be provided.

<<Circuit ILD>>

The circuit ILD has a function of inputting to the circuit MP[1,1] to the circuit MP[m,n] information (e.g., a potential, a resistance, or a current value) corresponding to first data $w_1^{(k-1)}{}_1^{(k)}$ to $w_m^{(k-1)}{}_n^{(k)}$ which are weight coefficients, through the wiring IL[1] to the wiring IL[n] and the wiring ILB[1] to the wiring ILB[n], for example. As a specific example, the circuit ILD supplies to the circuit MP[i,j] information (e.g., a potential, a resistance, or a current value) corresponding to the first data $w_i^{(k-1)}{}_j^{(k)}$ which is a weight coefficient, through the wiring IL[j] and the wiring ILB[j].

<<Circuit WLD>>

The circuit WLD has a function of selecting the circuit MP to which information (e.g., a potential, a resistance, or a current value) corresponding to the first data input from the circuit ILD is to be written, for example. In the case where information (e.g., a potential, a resistance, or a current value) is written to the circuit MP[i,1] to the circuit MP[i,n] positioned in the i-th row of the array portion ALP, for example, the circuit WLD supplies to the wiring WLS[i] a signal for bringing switching elements for writing included in the circuit MP[i,1] to the circuit MP[i,n] into an on state or an off state, and supplies to the wiring WLS a potential for bringing switching elements for writing included in the circuits MP in rows other than the i-th row into an off state, for example. Although an example of the case where the wiring WLS[i] is provided is described, one embodiment of the present invention is not limited thereto. For example, a plurality of wirings may be provided as the wiring WLS[i].

<<Circuit XLD>>

The circuit XLD has a function of supplying to the circuit MP[1,1] to the circuit MP[m,n] the second data $z_1^{(k-1)}$ to $z_m^{(k-1)}$ corresponding to arithmetic values output from the neuron $N_1^{(k-1)}$ to a neuron $N_m^{(k)}$, through the wiring XLS[1] to the wiring XLS[m], for example. Specifically, the circuit XLD supplies to the circuit MP[i,1] to the circuit MP[i,n] information (e.g., a potential or a current value) corresponding to the second data $z_i^{(k-1)}$ output from the neuron $N_i^{(k-1)}$, through the wiring XLS[i]. Although the case where the wiring XLS[i] is provided is described, one embodiment of the present invention is not limited thereto. For example, a plurality of wirings may be provided as the wiring XLS[i].

<<Circuit AFP>>

The circuit AFP includes a circuit ACTF[1] to a circuit ACTF[n], for example. The circuit ACTF[j] is electrically connected to the wiring OL[j] and the wiring OLB[j], for example. The circuit ACTF[j] generates a signal depending on information (e.g., a potential or a current value) input from the wiring OL[j] and the wiring OLB[j], for example. For example, information input from the wiring OL[j] and information input from the wiring OLB[j] (e.g., potentials or current values) are compared and a signal depending on the comparison result is generated. The signal corresponds to the signal $z_j^{(k)}$ output from the neuron $N_j^{(k)}$. That is, the circuit ACTF[1] to the circuit ACTF[n] function as circuits that perform arithmetic operation of an activation function of the above-described neural network, for example. However, one embodiment of the present invention is not limited thereto. For example, the circuit ACTF[1] to the circuit ACTF[n] may have a function of converting an analog signal into a digital signal. Alternatively, for example, the circuit ACTF[1] to the circuit ACTF[n] may have a function of amplifying an analog signal and outputting the amplified signal, i.e., a function of converting output impedance. Note that although the example of the case where the circuit ACTF is provided is described, one embodiment of the present invention is not limited thereto. The circuit ACTF is not necessarily provided.

Figure 3A:
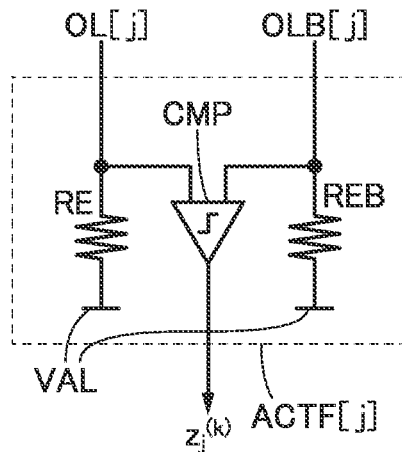
FIG. 3A, FIG. 3B, FIG. 3C, FIG. 3D, FIG. 3E, and FIG. 3F are circuit diagrams showing configuration examples of a circuit included in a semiconductor device.

The circuit ACTF[1] to the circuit ACTF[n] can have a circuit configuration illustrated in FIG. 3A, for example. FIG. 3A illustrates a circuit that generates the signal $z_j^{(k)}$ in accordance with currents input from the wiring OL[j] and the wiring OLB[j], for example. Specifically, FIG. 3A shows an example of a circuit that performs arithmetic operation of an activation function and outputs the output signal $z_j^{(k)}$ expressed by a binary value.

In FIG. 3A, the circuit ACTF[j] includes a resistor RE, a resistor REB, and a comparator CMP. The resistor RE and the resistor REB have a function of converting a current into a voltage. Therefore, not only the resistor but also an element or a circuit can be used as long as the element or the circuit has a function of converting a current into a voltage. The wiring OL[j] is electrically connected to a first terminal of the resistor RE and a first input terminal of the comparator CMP, and the wiring OLB[j] is electrically connected to a first terminal of the resistor REB and a second input terminal of the comparator CMP. A second terminal of the resistor RE is electrically connected to a wiring VAL, and a second terminal of the resistor REB is electrically connected to the wiring VAL. Note that the second terminal of the resistor RE and the second terminal of the resistor REB may be connected to the same wiring. Alternatively, they may be connected to different wirings having the same potential.

The resistances of the resistor RE and the resistor REB are preferably equal to each other. For example, the difference between the resistances of the resistor RE and the resistor REB is desirably within 10%, further preferably within 5%. However, one embodiment of the present invention is not limited thereto. Depending on the case or according to circumstances, the resistances of the resistor RE and the resistor REB may be different values.

The wiring VAL functions as a wiring for supplying a constant voltage, for example. The constant voltage can be, for example, a high-level potential VDD, a low-level potential VSS, a ground potential (GND), or the like. The constant voltage is preferably set as appropriate in accordance with the configuration of the circuit MP. Note that the wiring VAL may be supplied with not a constant voltage but a pulse signal, for example.

A voltage between the first terminal and the second terminal of the resistor RE is determined in accordance with a current flowing from the wiring OL[j]. Thus, a voltage corresponding to the resistance of the resistor RE and the current is input to the first input terminal of the comparator CMP. Similarly, a voltage between the first terminal and the second terminal of the resistor REB is determined in accordance with a current flowing from the wiring OLB[j]. Thus, a voltage corresponding to the resistance of the resistor REB and the current is input to the second input terminal of the comparator CMP.

The comparator CMP has a function of comparing voltages input to the first input terminal and the second input terminal and outputting a signal from an output terminal of the comparator CMP depending on the comparison result, for example. For example, the comparator CMP can output a high-level potential from the output terminal of the comparator CMP in the case where the voltage input to the second input terminal is higher than the voltage input to the first input terminal, and can output a low-level potential from the output terminal of the comparator CMP in the case where the voltage input to the first input terminal is higher than the voltage input to the second input terminal. In other words, since two potentials, a high-level potential and a low-level potential, are output from the output terminal of the comparator CMP, the circuit ACTF[j] can output the binary output signal $z_j^{(k)}$. For example, the high-level potential and the low-level potential output from the output terminal of the comparator CMP can correspond to "+1" and "−1" of the output signal $z_j^{(k)}$, respectively. Depending on the case, the high-level potential and the low-level potential output from the output terminal of the comparator CMP may correspond to "+1" and "0" of the output signal $z_j^{(k)}$, respectively.

Figure 3B:
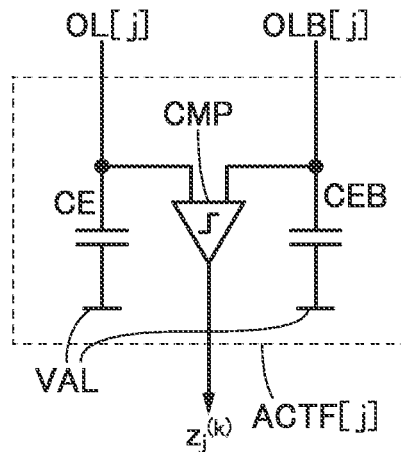
Figure 3C:
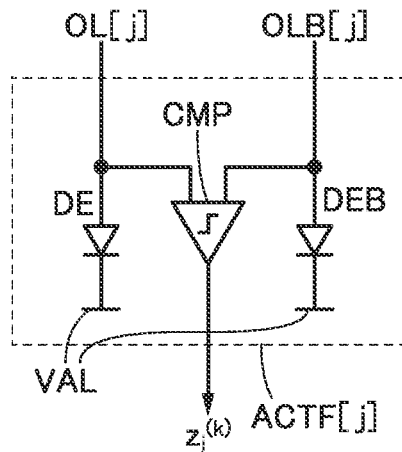

Although the resistor RE and the resistor REB are used for the circuit ACTF[j] in FIG. 3A, not only the resistor but also an element or a circuit can be used as long as the element or the circuit has a function of converting a current into a voltage. Thus, each of the resistor RE and the resistor REB of the circuit ACTF[j] in FIG. 3A can be replaced with another circuit element. For example, the circuit ACTF[j] illustrated in FIG. 3B is a circuit including a capacitor CE and a capacitor CEB instead of the resistor RE and the resistor REB included in the circuit ACTF[j] in FIG. 3A, and can perform operation substantially the same as that of the circuit ACTF[j] in FIG. 3A. Note that the capacitances of the capacitor CE and the capacitor CEB are preferably equal to each other. For example, the difference between the capacitances of the resistor CE and the resistor CEB is desirably within 10%, further preferably within 5%. However, one embodiment of the present invention is not limited thereto. A circuit for initializing charge accumulated in the capacitor CE and the capacitor CEB may be provided. For example, a switch may be provided in parallel to the capacitor CE. In other words, a second terminal of the switch may be connected to the wiring VAL, and a first terminal of the switch may be connected to a first terminal of the capacitor CE, the wiring OL[j], and the first input terminal of the comparator CMP. Alternatively, the second terminal of the switch may be connected to a wiring different from the wiring VAL, and the first terminal of the switch may be connected to the first terminal of the capacitor CE, the wiring OL[j], and the first input terminal of the comparator CMP. In addition, the circuit ACTF[j] illustrated in FIG. 3C is a circuit including a diode element DE and a diode element DEB instead of the resistor RE and the resistor REB included in the circuit ACTF[j] in FIG. 3A, and can perform operation substantially the same as that of the circuit ACTF[j] in FIG. 3A. It is desirable that the directions of the diode element DE and the diode element DEB (connection portions of an anode and a cathode) change as appropriate in accordance with the level of potential of the wiring VAL.

Figure 3D:
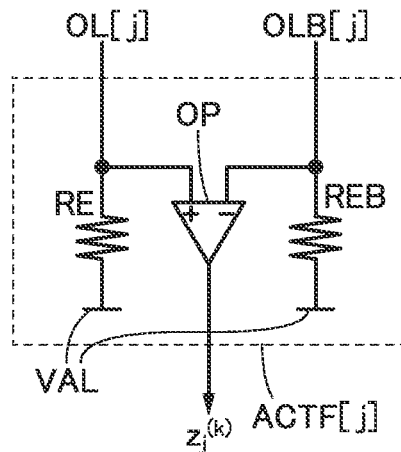

The comparator CMP included in the circuits ACTF[j] in FIG. 3A to FIG. 3C can be replaced with an operational amplifier OP, for example. The circuit ACTF[j] illustrated in FIG. 3D shows a circuit diagram in which the comparator CMP of the circuit ACTF[j] in FIG. 3A is replaced with the operational amplifier OP.

Figure 3E:
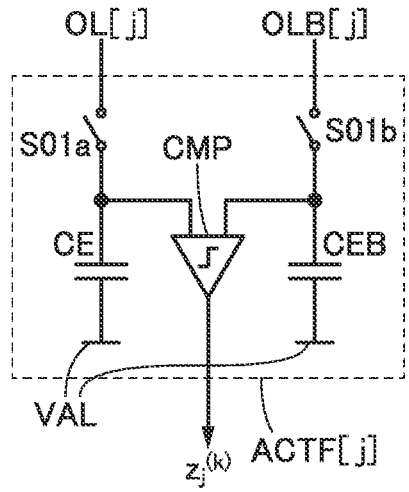

A switch S01a and a switch S01b may be provided for the circuit ACTF[j] in FIG. 3B. Thus, the circuit ACTF[j] can hold in the capacitor CE and the capacitor CEB potentials corresponding to currents input from the wiring OL[j] and the wiring OLB[j]. As a specific circuit example, a configuration may be employed in which the wiring OL[j] is electrically connected to a first terminal of the switch S01a, the first terminal of the capacitor CE and the first input terminal of the comparator CMP are electrically connected to a second terminal of the switch S01a, the wiring OLB[j] is electrically connected to a first terminal of the switch S01b, and a first terminal of the capacitor CEB and the second input terminal of the comparator CMP are electrically connected to a second terminal of the switch S01b, as illustrated in FIG. 3E. In the circuit ACTF[j] in FIG. 3E, the potentials of the wiring OL[j] and the wiring OLB[j] can be respectively input to the first input terminal and the second input terminal of the comparator CMP by bringing the switch S01a and the switch S01b into an on state. Then, the switch S01a and the switch S01b are brought into an off state, whereby the potentials input to the first input terminal and the second input terminal of the comparator CMP can be held in the capacitor CE and the capacitor CEB. As each of the switch S01a and the switch S01b, an electrical switch such as an analog switch or a transistor can be used, for example. As another example, a mechanical switch may be used as each of the switch S01a and the switch S01b. In the case of using a transistor as each of the switch S01a and the switch S01b, the transistor can be an OS transistor or a transistor containing silicon in a channel formation region (hereinafter, referred to as a Si transistor). Moreover, the on-state periods of the switch S01a and the switch S01b are controlled, so that the voltage values of the capacitor CE and the capacitor CEB can be controlled. For example, in the case where the values of currents flowing through the capacitor CE and the capacitor CEB are large, the on-state periods of the switch S01a and the switch S01b are set short, whereby the capacitor CE and the capacitor CEB can be prevented from having too large a voltage value.

Figure 3F:
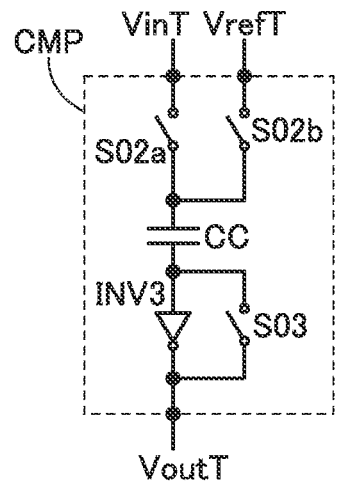

The comparator CMP included in each of the circuits ACTF[j] in FIG. 3A to FIG. 3C and FIG. 3E can be a chopper comparator, for example. The comparator CMP illustrated in FIG. 3F shows a chopper comparator, and the comparator CMP includes a switch S02a, a switch S02b, a switch S03, a capacitor CC, and an invertor circuit INV3. Like the above-described switch S01a and switch S01b, each of the switch S02a, the switch S02b, and the switch S03 can be a mechanical switch or a transistor such as an OS transistor or a Si transistor.

A first terminal of the switch S02a is electrically connected to a terminal VinT, a first terminal of the switch S02b is electrically connected to a terminal VrefT, and a second terminal of the switch S02a is electrically connected to a second terminal of the switch S02b and a first terminal of the capacitor CC. A second terminal of the capacitor CC is electrically connected to an input terminal of the inverter circuit INV3 and a first terminal of the switch S03. A terminal VoutT is electrically connected to an output terminal of the inverter circuit INV3 and a second terminal of the switch S03.

The terminal VinT functions as a terminal for inputting an input potential to the comparator CMP, the terminal VrefT functions as a terminal for inputting a reference potential to the comparator CMP, and the terminal VoutT functions as a terminal for outputting an output potential from the comparator CMP. The terminal VinT can correspond to one of the first terminal and the second terminal of each of the comparators CMP in FIG. 3A to FIG. 3C and FIG. 3E, and the terminal VrefT can correspond to the other of the first terminal and the second terminal of each of the comparators CMP in FIG. 3A to FIG. 3C and FIG. 3E.

Although the circuits ACTF[j] in FIG. 3A to FIG. 3E are each a circuit that performs arithmetic operation of an activation function and outputs the output signal $z_j^{(k)}$ expressed by a binary value, the circuit ACTF[j] may output the output signal $z_j^{(k)}$ as a ternary or higher-level signal or an analog value.

FIG. 4A to FIG. 4F show examples of a circuit that generates the signal $z_j^{(k)}$ in accordance with currents input from the wiring OL[j] and the wiring OLB[j] and is a circuit that performs arithmetic operation of an activation function and outputs the output signal $z_j^{(k)}$ expressed by a ternary value.

Figure 4A:
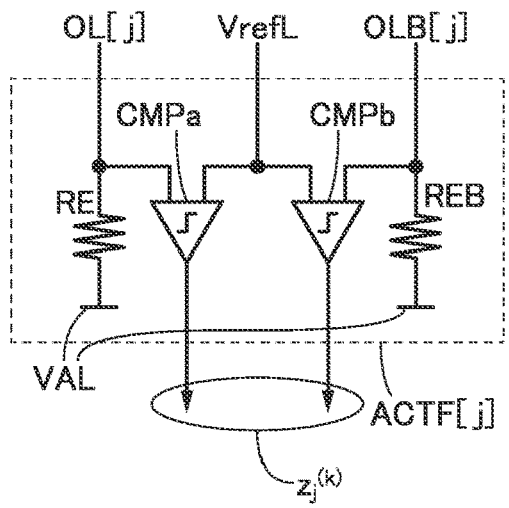
FIG. 4A, FIG. 4B, FIG. 4C, FIG. 4D, FIG. 4E, and FIG. 4F are circuit diagrams showing configuration examples of a circuit included in a semiconductor device.

The circuit ACTF[j] illustrated in FIG. 4A includes the resistor RE, the resistor REB, a comparator CMPa, and a comparator CMPb. The wiring OL[j] is electrically connected to the first terminal of the resistor RE and a first input terminal of the comparator CMPa, and the wiring OLB[j] is electrically connected to the first terminal of the resistor REB and a first input terminal of the comparator CMPb. A second input terminal of the comparator CMPa and a second input terminal of the comparator CMPb are electrically connected to a wiring VrefL. Furthermore, the second terminal of the resistor RE is electrically connected to the wiring VAL, and the second terminal of the resistor REB is electrically connected to the wiring VAL.

The wiring VrefL functions as a wiring for supplying a constant voltage $V_{ref}$ and, for example, $V_{ref}$ is preferably higher than or equal to GND and lower than or equal to VDD. According to circumstances, $V_{ref}$ may be a potential lower than GND or a potential higher than VDD. Note that $V_{ref}$ is used as a reference potential (potential for comparison) in the comparator CMPa and the comparator CMPb.

A voltage between the first terminal and the second terminal of the resistor RE is determined in accordance with a current flowing from the wiring OL[j]. Thus, a voltage corresponding to the resistance of the resistor RE and the current is input to the first input terminal of the comparator CMPa. Similarly, a voltage between the first terminal and the second terminal of the resistor REB is determined in accordance with a current flowing from the wiring OLB[j]. Thus, a voltage corresponding to the resistance of the resistor REB and the current is input to the first input terminal of the comparator CMPb.

The comparator CMPa compares voltages input to the first input terminal and the second input terminal and outputs a signal from an output terminal of the comparator CMPa depending on the comparison result. For example, the comparator CMPa can output a high-level potential from the output terminal of the comparator CMPa in the case where the voltage ($V_{ref}$) input to the second input terminal is higher than the voltage input to the first input terminal, and can output a low-level potential from the output terminal of the comparator CMPa in the case where the voltage ($V_{ref}$) input to the first input terminal is higher than the voltage input to the second input terminal.

Like the comparator CMPa, the comparator CMPb compares voltages input to the first input terminal and the second input terminal and outputs a signal from an output terminal of the comparator CMPb depending on the comparison result. For example, the comparator CMPb can output a high-level potential from the output terminal of the comparator CMPb in the case where the voltage ($V_{ref}$) input to the second input terminal is higher than the voltage input to the first input terminal, and can output a low-level potential from the output terminal of the comparator CMPb in the case where the voltage ($V_{ref}$) input to the first input terminal is higher than the voltage input to the second input terminal.

At this time, the ternary output signal $z_j^{(k)}$ can be expressed in accordance with potentials output from the output terminals of the comparator CMPa and the comparator CMPb. For example, the output signal $z_j^{(k)}$ can be "+1" in the case where a high-level potential is output from the output terminal of the comparator CMPa and a low-level potential is output from the output terminal of the comparator CMPb; the output signal $z_j^{(k)}$ can be "−1" in the case where a low-level potential is output from the output terminal of the comparator CMPa and a high-level potential is output from the output terminal of the comparator CMPb; and the output signal $z_j^{(k)}$ can be "+0" in the case where a low-level potential is output from the output terminal of the comparator CMPa and a low-level potential is output from the output terminal of the comparator CMPb.

Figure 4B:
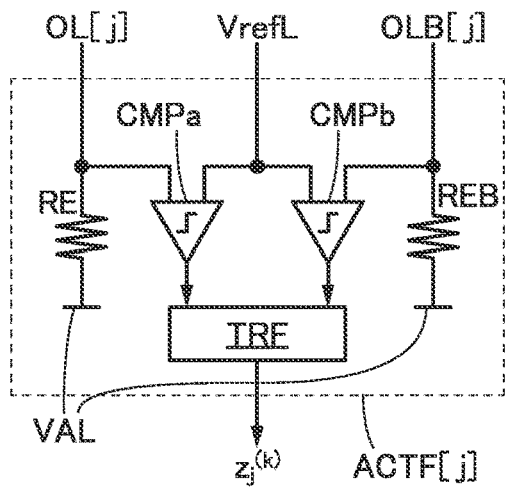

The circuit configuration of the circuit ACTF[j] is not limited to that illustrated in FIG. 4A and can be changed according to circumstances. For example, in the case where two output results of the comparator CMPa and the comparator CMPb need to be combined into one signal in the circuit ACTF[j] in FIG. 4A, a converter circuit TRF may be provided for the circuit ACTF[j]. The circuit ACTF[j] in FIG. 4B is a configuration example in which the converter circuit TRF is provided for the circuit ACTF[j] in FIG. 4A, and the output terminals of the comparators CMPa and CMPb are electrically connected to input terminals of the converter circuit TRF. A specific example of the converter circuit TRF can be a digital-analog converter circuit (in this case, the signal $z_j^{(k)}$ is an analog value) or the like.

In FIG. 4A, for example, the wiring VrefL electrically connected to the second input terminals of the comparator CMPa and the comparator CMPb may be replaced with separate wirings Vref1L and Vref2L. In the circuit ACTF[j] in FIG. 4C, a second terminal of the comparator CMPa included in the circuit ACTF[j] in FIG. 4A is electrically connected to not the wiring VrefL but the wiring Vref1L, and a second terminal of the comparator CMPb is electrically connected to not the wiring VrefL but the wiring Vref2L. When potentials input to the wirings Vref1L and Vref2L have different values, reference potentials in the comparator CMPa and the comparator CMPb can be set independently.

Figure 4C:
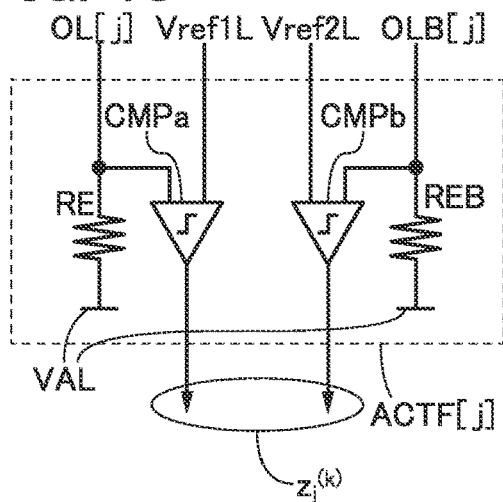

Alternatively, as a component different from the circuits ACTF[j] in FIG. 4A to FIG. 4C, an amplifier circuit, an impedance converter circuit, or the like may be used, for example. For example, the circuit ACTF[j] illustrated in FIG. 4D can be used for the circuit AFP of the arithmetic circuit 110 in FIG. 2. The circuit ACTF[j] in FIG. 4D includes the resistor RE, the resistor REB, an operational amplifier OPa, and an operational amplifier OPb, and functions as an amplifier circuit.

The wiring OL[j] is electrically connected to the first terminal of the resistor RE and a non-inverting input terminal of the operational amplifier OPa, and the wiring OLB[j] is electrically connected to the first terminal of the resistor REB and a non-inverting input terminal of the operational amplifier OPb. An inverting input terminal of the operational amplifier OPa is electrically connected to an output terminal of the operational amplifier OPa, and an inverting input terminal of the operational amplifier OPb is electrically connected to an output terminal of the operational amplifier OPb. Furthermore, the second terminal of the resistor RE is electrically connected to the wiring VAL, and the second terminal of the resistor REB is electrically connected to the wiring VAL.

Figure 4D:
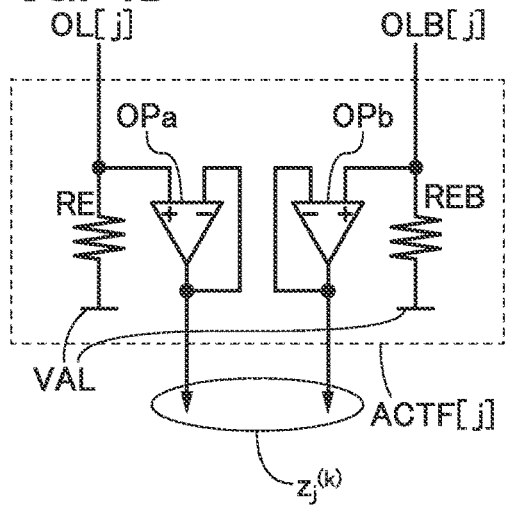

That is, the operational amplifier OPa and the operational amplifier OPb included in the circuit ACTF[j] in FIG. 4D have a connection structure of a voltage follower. Accordingly, a potential output from the output terminal of the operational amplifier OPa is substantially equal to a potential input to the non-inverting input terminal of the operational amplifier OPa, and a potential output from the output terminal of the operational amplifier OPb is substantially equal to a potential input to the non-inverting input terminal of the operational amplifier OPb. In this case, the output signal $z_j^{(k)}$ is output from the circuit ACTF[j] as two analog values. Note that the output terminal of the operational amplifier OPa and the output terminal of the operational amplifier OPb may be connected to the input terminals of the comparator CMP. Then, output from the comparator CMP may be the output signal $z_j^{(k)}$.

Alternatively, as a component different from the circuits ACTF[j] in FIG. 4A to FIG. 4D, an integrator circuit, a current-voltage converter circuit, or the like may be used, for example. Furthermore, an integrator circuit or a current-voltage converter circuit may be formed using an operational amplifier. For example, the circuit ACTF[j] illustrated in FIG. 4E can be used for the circuit AFP of the arithmetic circuit 110 in FIG. 2. The circuit ACTF[j] in FIG. 4E includes the operational amplifier OPa, the operational amplifier OPb, a load element LEa, and a load element LEb.

The wiring OL[j] is electrically connected to a first input terminal (e.g., the inverting input terminal) of the operational amplifier OPa and a first terminal of the load element LEa, and the wiring OLB[j] is electrically connected to a first input terminal (e.g., the inverting input terminal) of the operational amplifier OPb and a first terminal of the load element LEb. Moreover, a second input terminal (e.g., the non-inverting input terminal) of the operational amplifier OPa is electrically connected to the wiring Vref1L, and a second input terminal (e.g., the non-inverting input terminal) of the operational amplifier OPb is electrically connected to the wiring Vref2L. A second terminal of the load element LEa is electrically connected to the output terminal of the operational amplifier OPa, and the second terminal of the load element LEa is electrically connected to the output terminal of the operational amplifier OPb.

Note that the wiring Vref1L and the wiring Vref2L function as wirings that supply voltages equal to each other or different voltages. Thus, the wiring Vref1L and the wiring Vref2L can be combined into one wiring.

Figure 4E:
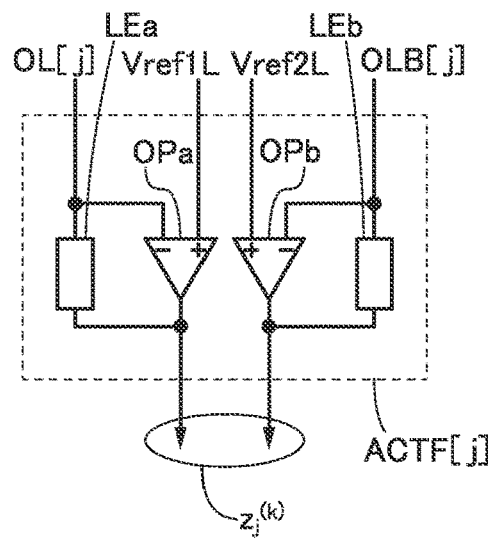

The load element LEa and the load element LEb of the circuit ACTF[j] in FIG. 4E can each be a resistor or a capacitor, for example. In particular, when a capacitor is used as each of the load element LEa and the load element LEb, a combination of the operational amplifier OPa and the load element LEa and a combination of the operational amplifier OPb and the load element LEb each function as an integrator circuit. In other words, charge is stored in each of the capacitors (the load elements LEa and LEb) in accordance with the amount of current flowing through the wiring OL[j] or the wiring OLB[j]. That is, the amount of current flowing from the wiring OL[j] and the wiring OLB[j] is integrated by the integrator circuit, the integrated amount of current is converted into a voltage, and the voltage is output as the signal $z_j^{(k)}$. Note that the output terminal of the operational amplifier OPa and the output terminal of the operational amplifier OPb may be connected to the input terminals of the comparator CMP. Then, output from the comparator CMP may be the output signal $z_j^{(k)}$. A circuit for initializing charge accumulated in the load element LEa and the load element LEb may be provided. For example, a switch may be provided in parallel to the load element LEa (a capacitor). In other words, a second terminal of the switch may be connected to an output terminal of the operational amplifier OPa, and a first terminal of the switch may be connected to the wiring OL[j] and the first input terminal (e.g., the inverting input terminal) of the operational amplifier OPa.

In the circuit ACTF[j] in FIG. 4E, in the case where currents flowing from the wiring OL[j] and the wiring OLB[j] need to be converted into a voltage to be output, a resistor can be used instead of a capacitor as each of the load element LEa and the load element LEb.

Figure 4F:
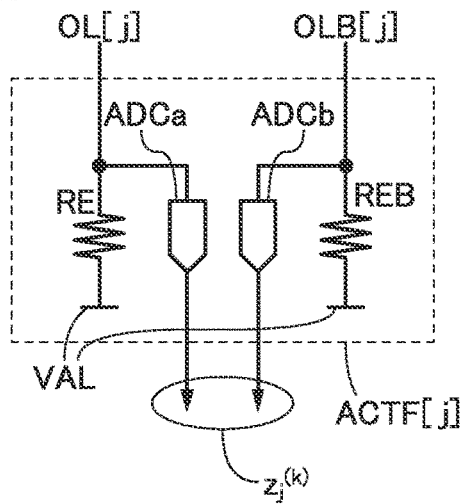

Moreover, for example, the circuit ACTF[j] illustrated in FIG. 4F can be used for the circuit AFP of the arithmetic circuit 110 in FIG. 2 as a component different from the circuits ACTF[j] in FIG. 4A to FIG. 4E. The circuit ACTF[j] in FIG. 4F includes the resistor RE, the resistor REB, an analog-digital converter circuit ADCa, and an analog-digital converter circuit ADCb.

The wiring OL[j] is electrically connected to an input terminal of the analog-digital converter circuit ADCa and the first terminal of the resistor RE, and the wiring OLB[j] is electrically connected to an input terminal of the analog-digital converter circuit ADCb and the first terminal of the resistor REB. The second terminal of the resistor RE is electrically connected to the wiring VAL, and the second terminal of the resistor REB is electrically connected to the wiring VAL.

In the circuit ACTF[j] in FIG. 4F, the potentials of the first terminals of the resistor RE and the resistor REB are determined in accordance with currents flowing from the wiring OL[j] and the wiring OLB[j]. The circuit ACTF[j] has a function of converting the potential which is an analog value into a binary, ternary, or higher-level (e.g. 256-level)

digital value by the analog-digital converter circuits ADCa and ADCb and outputting the digital value as the signal $z_j^{(k)}$.

Note that as in FIG. 3B and FIG. 3C, the resistor RE and the resistor REB illustrated in FIG. 4A to FIG. 4F can be replaced with the capacitor CE and the capacitor CEB or the diode element DE and the diode element DEB. Specifically, in the case where the resistor RE and the resistor REB illustrated in FIG. 4A to FIG. 4F are replaced with the capacitor CE and the capacitor CEB, further providing the switch S01a and the switch S01b as in FIG. 3E allows potentials input from the wiring OL[j] and the wiring OLB[j] to be held.

Note that in the arithmetic circuit 110 in FIG. 2, the number of wirings electrically connected to the circuit MP[i,j] can be changed in accordance with the circuit configuration of the circuit MP[i,j]. For example, the wiring WLS[i] electrically connected to the circuit MP[i,j] in the arithmetic circuit 110 in FIG. 2 can be one wiring or a plurality of wirings. Furthermore, for example, the wiring XLS[i] electrically connected to the circuit MP[i,j] can be one wiring or a plurality of wirings.

<<Circuit MP>>

Next, a configuration example of the circuit MP[i,j] included in the arithmetic circuit 110 is described.

Figure 5A:
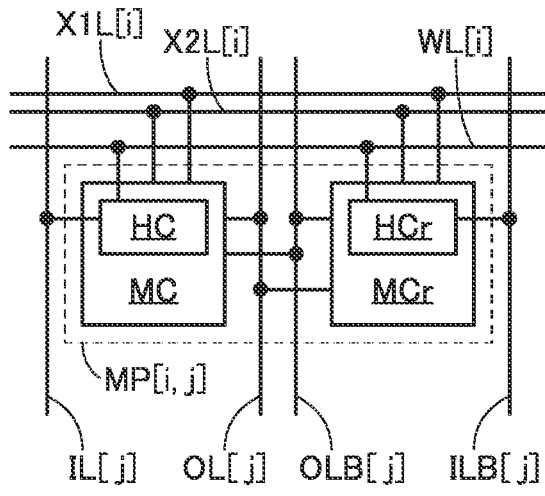
FIG. 5A, FIG. 5B, FIG. 5C, FIG. 5D, FIG. 5E, and FIG. 5F are circuit diagrams showing configuration examples of a circuit included in a semiconductor device.

FIG. 5A shows a configuration example of the circuit MP[i,j] that can be used for the arithmetic circuit 110, and the circuit MP[i,j] includes a circuit MC and a circuit MCr, for example. The circuit MC and the circuit MCr are circuits that calculate the product of a weight coefficient and an input signal from a neuron (an arithmetic value) in the circuit MP. The circuit MC can have a configuration similar to that of the circuit MCr or a configuration different from that of the circuit MCr. Thus, the reference numeral of the circuit MCr includes "r" so that the circuit MCr is distinguished from the circuit MC. In addition, the reference numeral of a circuit element which is included in the circuit MCr and described below also includes "r".

The circuit MC includes a holding portion HC and the circuit MCr includes a holding portion HCr, for example. The holding portion HC and the holding portion HCr have a function of holding information (e.g., a potential, a resistance, and a current value). The first data $w_i^{(k-1)(k)}_j$ set to the circuit MP[i,j] is determined in accordance with information (e.g., a potential, a resistance, and a current value) held in the holding portion HC and the holding portion HCr. Therefore, the holding portion HC and the holding portion HCr are respectively electrically connected to the wiring IL[j] and the wiring ILB[j] that supply information (e.g., a potential, a resistance, and a current value) corresponding to the first data $w_i^{(k-1)(k)}_j$.

A wiring WL[i] illustrated in FIG. 5A corresponds to the wiring WLS[i] in FIG. 2. The wiring WL[i] is electrically connected to the holding portion HC and the holding portion HCr. To write information (e.g., a potential, a resistance, or a current value) corresponding to the first data $w_i^{(k-1)(k)}_j$ to the holding portion HC and the holding portion HCr included in the circuit MP[i,j], a predetermined potential is supplied to the wiring WL[i], so that electrical continuity is established between the wiring IL[j] and the holding portion HC and electrical continuity is established between the wiring ILB[j] and the holding portion HCr. Then, the potential or the like corresponding the first data $w_i^{(k-1)(k)}_j$ is supplied to the wirings IL[j] and ILB[j], whereby the potential or the like can be input to the holding portion HC and the holding portion HCr. After that, a predetermined potential is supplied to the wiring WL[i], so that electrical continuity is broken between the wiring IL[j] and the holding portion HC and electrical continuity is broken between the wiring ILB[j] and the holding portion HCr. Then, the potential or the like corresponding the first data $w_i^{(k-1)(k)}_j$ is held in the holding portion HC and the holding portion HCr.

The case where the first data $w_i^{(k-1)(k)}_j$ has any one of three levels "−1", "0", and "1" is considered, for example. In the case where the first data $w_i^{(k-1)(k)}_j$ is "1", the holding portion HC holds a high-level potential and the holding portion HCr holds a low-level potential, for example. In the case where the first data $w_i^{(k-1)(k)}_j$ is "−1", the holding portion HC holds a low-level potential and the holding portion HCr holds a high-level potential, for example. In the case where the first data $w_i^{(k-1)(k)}_j$ is "0", the holding portion HC holds a low-level potential and the holding portion HCr holds a low-level potential, for example. As another example, the case where the first data $w_i^{(k-1)(k)}_j$ has an analog value, specifically, a "negative analog value", "0", or a "positive analog value" is considered. In the case where the first data $w_i^{(k-1)(k)}_j$ is a "positive analog value", the holding portion HC holds a high-level analog potential and the holding portion HCr holds a low-level potential, for example. In the case where the first data $w_i^{(k-1)(k)}_j$ is a "negative analog value", the holding portion HC holds a low-level potential and the holding portion HCr holds a high-level analog potential, for example. In the case where the first data $w_i^{(k-1)(k)}_j$ is "0", the holding portion HC holds a low-level potential and the holding portion HCr holds a low-level analog potential, for example. Note that the analog value may be a multi-bit (multilevel) digital value. That is, in the case where the first data $w_i^{(k-1)(k)}_j$ is "1", "2", and "3", the holding portion HC holds a high-level potential corresponding to "1", "2", and "3" and the holding portion HCr holds a low-level potential, for example. In the case where the first data $w_i^{(k-1)(k)}_j$ is "−1", "−2", and "−3", the holding portion HC holds a low-level potential and the holding portion HCr holds a high-level potential corresponding to "1", "2", and "3", which are absolute values of "−1", "−2", and "−3", for example. In the case where the first data $w_i^{(k-1)(k)}_j$ is "0", the holding portion HC holds a low-level potential and the holding portion HCr holds a low-level potential, for example.

For example, the circuit MC has a function of outputting a current, a voltage, or the like corresponding to information (e.g., a potential, a resistance, or a current value) held in the holding portion HC to one of the wiring OL[j] and the wiring OLB[j], and the circuit MCr has a function of outputting a current, a voltage, or the like corresponding to information (e.g., a potential, a resistance, or a current value) held in the holding portion HCr to the other of the wiring OL[j] and the wiring OLB[j]. In the case where a high-level potential is held in the holding portion HC, the circuit MC outputs a current having a first current value, and in the case where a low-level potential is held in the holding portion HC, the circuit MC outputs a current having a second current value, for example. Similarly, in the case where a high-level potential is held in the holding portion HCr, the circuit MCr outputs a current having the first current value, and in the case where a low-level potential is held in the holding portion HCr, the circuit MCr outputs a current having the second current value. Note that the magnitudes of the first current value and the second current value are determined in accordance with the configurations of the circuit MC, the circuit MCr, the holding portion HC, the holding portion HCr, and the like and the value of the first data $w_i^{(k-1)(k)}_j$. For example, the first current value may be larger than or smaller than the second current value. In addition, one of the first current value and the second current value may be a zero current; that is, the current value may be 0. Alternatively, the direction in which a current flows may be different between a current having the first current value and a current having the second current value. In particular, in the case where the first data $w_i^{(k-1)}{}_j^{(k)}$ has any one of three levels "−1", "0", and "1", the circuit MC and the circuit MCr are preferably configured so that one of the first current value and the second current value is 0. Note that in the case where the first data $w_i^{(k-1)}{}_j^{(k)}$ has an analog value, e.g., a "negative analog value", "0", or a "positive analog value", the first current value or the second current value can be an analog value, for example.

Note that in this specification and the like, a current, a voltage, or the like corresponding to information (e.g., a potential, a resistance, or a current value) held in the holding portion HC and the holding portion HCr may be a positive current, voltage, or the like or a negative current, voltage, or the like, or a positive current, voltage, or the like and a negative current, voltage, or the like may be mixed. That is, for example, the above description "has a function of outputting a current, a voltage, or the like corresponding to information (e.g., a potential, a resistance, or a current value) held in the holding portion HC to one of the wiring OL[j] and the wiring OLB[j], and the circuit MCr has a function of outputting a current, a voltage, or the like corresponding to information (e.g., a potential, a resistance, or a current value) held in the holding portion HCr to the other of the wiring OL[j] and the wiring OLB[j]" can be rephrased as a description "has a function of releasing a current, a voltage, or the like corresponding to information (e.g., a potential, a resistance, or a current value) held in the holding portion HC from one of the wiring OL[j] and the wiring OLB[j], and the circuit MCr has a function of releasing a current corresponding to a potential held in the holding portion HCr from the other of the wiring OL[j] and the wiring OLB[j]".

A wiring X1L[i] and a wiring X2L[i] illustrated in FIG. 5A correspond to the wiring XLS[i] in FIG. 2. Note that, for example, the second data $z_i^{(k-1)}$ input to the circuit MP[i,j] is determined in accordance with the potentials, currents, or the like of the wiring X1L[i] and the wiring X2L[i]. Thus, potentials corresponding to the second data $z_i^{(k-1)}$ are input to the circuit MC and the circuit MCr through the wiring X1L[i] and the wiring X2L[i], for example.

The circuit MC is electrically connected to the wiring OL[j] and the wiring OLB[j], and the circuit MCr is electrically connected to the wiring OL[j] and the wiring OLB[j]. The circuit MC and the circuit MCr output to the wiring OL[j] and the wiring OLB[j] currents, potentials, or the like corresponding to the product of the first data $w_i^{(k-1)}{}_j^{(k)}$ and the second data $z_i^{(k-1)}$ in accordance with the potentials input to the wiring X1L[i] and the wiring X2L[i], for example. As a specific example, the destinations of the currents output from the circuits MC and MCr are determined in accordance with the potentials of the wiring X1L[i] and the wiring X2L[i]. For example, the circuit MC and the circuit MCr each have a circuit configuration in which a current output from the circuit MC flows to one of the wiring OL[j] and the wiring OLB[j], and a current output from the circuit MCr flows to the other of the wiring OL[j] and the wiring OLB[j]. That is, the currents output from the circuit MC and the circuit MCr flow to not the same wiring but different wirings. Note that for example, the currents from the circuit MC and the circuit MCr flow to neither the wiring OL[j] nor the wiring OLB[j] in some cases.

The case where the second data $z_i^{(k-1)}$ has any one of three levels "−1", "0", and "1" is considered, for example. In the case where the second data $z_i^{(k-1)}$ is "1", for example, the circuit MP establishes electrical continuity between the circuit MC and the wiring OL[j] and establishes electrical continuity between the circuit MCr and the wiring OLB[j]. In the case where the second data $z_i^{(k-1)}$ is "−1", for example, the circuit MP establishes electrical continuity between the circuit MC and the wiring OLB[j] and establishes electrical continuity between the circuit MCr and the wiring OL[j]. In the case where the second data $z_i^{(k-1)}$ is "0", for example, the circuit MP breaks electrical continuity between the circuit MC and the wiring OL[j] and between the circuit MC and the wiring OLB[j] and breaks electrical continuity between the circuit MCr and the wiring OL[j] and between the circuit MCr and the wiring OLB[j] so that currents output from the circuits MC and MCr flow to neither the wiring OL[j] nor the wiring OLB[j].

An example in which the above-described operations are combined is shown. In the case where the first data $w_i^{(k-1)}{}_j^{(k)}$ is "1", a current is output from the circuit MC, and in the case where the first data $w_i^{(k-1)}{}_j^{(k)}$ is "−1", a current is output from the circuit MCr. In the case where the second data $z_i^{(k-1)}$ is "1", electrical continuity is established between the circuit MC and the wiring OL[j] and between the circuit MCr and the wiring OLB[j]. In the case where the second data $z_i^{(k-1)}$ is "−1", electrical continuity is established between the circuit MC and the wiring OLB[j] and between the circuit MCr and the wiring OL[j]. Accordingly, when the product of the first data $w_i^{(k-1)}{}_j^{(k)}$ and the second data $z_i^{(k-1)}$ is a positive value, a current is output to the wiring OL[j]. When the product of the first data $w_i^{(k-1)}{}_j^{(k)}$ and the second data $z_i^{(k-1)}$ is a negative value, a current is output to the wiring OLB[j]. When the product of the first data $w_i^{(k-1)}{}_j^{(k)}$ and the second data $z_i^{(k-1)}$ is a value of zero, a current is output to neither of the wirings.

The above-described example is described as a specific example as follows: in the case where the first data $w_i^{(k-1)}{}_j^{(k)}$ is "1" and the second data $z_i^{(k-1)}$ is "1", a current I1[i,j] having the first current value flows from the circuit MC to the wiring OL[j] and a current I2[i,j] having the second current value flows from the circuit MCr to the wiring OLB[j], for example. Here, the second current value is zero, for example. In other words, strictly, a current does not flow from the circuit MCr to the wiring OLB[j]. In the case where the first data $w_i^{(k-1)}{}_j^{(k)}$ is "−1" and the second data $z_i^{(k-1)}$ is "1", the current I1[i,j] having the second current value flows from the circuit MC to the wiring OL[j] and the current I2[i,j] having the first current value flows from the circuit MCr to the wiring OLB[j], for example. Here, the second current value is zero, for example. In other words, strictly, a current does not flow from the circuit MC to the wiring OL[j]. In the case where the first data $w_i^{(k-1)}{}_j^{(k)}$ is "0" and the second data $z_i^{(k-1)}$ is "1", the current I1[i,j] having the second current value flows from the circuit MC to the wiring OL[j] and the current I2[i,j] having the second current value flows from the circuit MCr to the wiring OLB[j]. Here, the second current value is zero, for example. In other words, strictly, a current does not flow from the circuit MC to the wiring OL[j] and a current does not flow from the circuit MCr to the wiring OLB[j].

In the case where the first data $w_i^{(k-1)}{}_j^{(k)}$ is "1" and the second data $z_i^{(k-1)}$ is "−1", the current I1[i,j] having the first current value flows from the circuit MC to the wiring OLB[j] and the current I2[i,j] having the second current value flows from the circuit MCr to the wiring OL[j]. Here, the second current value is zero, for example. In other words, strictly, a current does not flow from the circuit MCr to the wiring OL[j]. In the case where the first data $w_i^{(k-1)}{}_j^{(k)}$ is "−1" and the second data $z_i^{(k-1)}$ is "−1", the current I1[i,j] having the second current value flows from the circuit MC to the wiring OLB[j] and the current I2[i,j] having the first current value flows from the circuit MCr to the wiring OL[j]. Here, the second current value is zero, for example. In other words, strictly, a current does not flow from the circuit MC to the wiring OLB[j]. In the case where the first data $w_i^{(k-1)}{}_j^{(k)}$ is "0" and the second data $z_i^{(k-1)}$ is "−1", the current I1[i,j] having the second current value flows from the circuit MC to the wiring OLB[j] and the current I2[i,j] having the second current value flows from the circuit MCr to the wiring OL[j]. Here, the second current value is zero, for example. In other words, strictly, a current does not flow from the circuit MC to the wiring OLB[j] and a current does not flow from the circuit MCr to the wiring OL[j].

In the case where the second data $z_i^{(k-1)}$ is "0", electrical continuity is broken between the circuit MC and the wiring OL[j] and between the circuit MC and the wiring OLB[j], for example. Similarly, electrical continuity is broken between the circuit MCr and the wiring OL[j] and between the circuit MCr and the wiring OLB[j]. Therefore, whatever level the first data $w_i^{(k-1)}{}_j^{(k)}$ has, currents are not output from the circuit MC and the circuit MCr to the wiring OL[j] and the wiring OLB[j].

As described above, in the case where the product of the first data $w_i^{(k-1)}{}_j^{(k)}$ and the second data $z_i^{(k-1)}$ is a positive value, for example, a current flows from the circuit MC or the circuit MCr to the wiring OL[j]. Here, in the case where the first data $w_i^{(k-1)}{}_j^{(k)}$ is a positive value, a current flows from the circuit MC to the wiring OL[j], and in the case where the first data $w_i^{(k-1)}{}_j^{(k)}$ is a negative value, a current flows from the circuit MCr to the wiring OL[j]. On the contrary, in the case where the product of the first data $w_i^{(k-1)}{}_j^{(k)}$ and the second data $z_i^{(k-1)}$ is a negative value, a current flows from the circuit MC or the circuit MCr to the wiring OLB[j]. Here, in the case where the first data $w_i^{(k-1)}{}_j^{(k)}$ is a positive value, a current flows from the circuit MC to the wiring OLB[j], and in the case where the first data $w_i^{(k-1)}{}_j^{(k)}$ is a negative value, a current flows from the circuit MCr to the wiring OLB[j]. Accordingly, the sum total of the currents output from a plurality of circuits MC or a plurality of circuits MCr connected to the wiring OL[j] flows to the wiring OL[j]. That is, a current having a value which is the sum of positive values flows through the wiring OL[j]. In contrast, the sum total of the currents output from a plurality of circuits MC or a plurality of circuits MCr connected to the wiring OLB[j] flows to the wiring OLB[j]. That is, a current having a value which is the sum of negative values flows through the wiring OLB[j]. As a result of the above-described operation, the total value of the currents flowing through the wiring OL[j], that is, the sum total of positive values and the total value of the currents flowing through the wiring OLB[j], that is, the sum total of negative values are utilized, so that product-sum operation processing can be performed. For example, in the case where the total value of the currents flowing through the wiring OL[j] is larger than the total value of the currents flowing through the wiring OLB[j], it can be determined that the product-sum operation result has a positive value. In the case where the total value of the currents flowing through the wiring OL[j] is smaller than the total value of the currents flowing through the wiring OLB[j], it can be determined that the product-sum operation result has a negative value. In the case where the total value of the currents flowing through the wiring OL[j] is substantially the same as the total value of the currents flowing through the wiring OLB[j], it can be determined that the product-sum operation result has a value of zero.

Note that even in the case where the second data $z_i^{(k-1)}$ has any two levels among "−1", "0", and "1", for example, two levels "−1" and "1" or two levels "0" and "1", operation can be performed in a similar manner. Similarly, even in the case where the first data $w_i^{(k-1)}{}_j^{(k)}$ has any two levels among "−1", "0", and "1", for example, two levels "−1" and "1" or two levels "0" and "1", operation can be performed in a similar manner.

Note that the first data $w_i^{(k-1)}{}_j^{(k)}$ may have an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Next, a modification example of the circuit MP[i,j] in FIG. 5A will be described. Note that in the modification example of the circuit MP[i,j], differences from the circuit MP[i,j] in FIG. 5A are mainly described and the description of portions common to the circuit MP[i,j] in FIG. 5A is sometimes omitted.

Figure 5B:
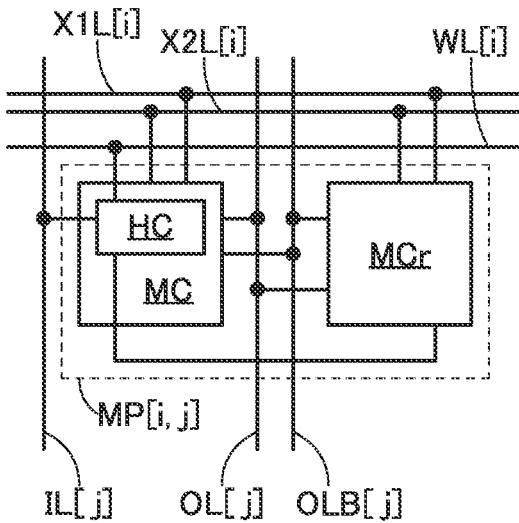

The circuit MP[i,j] illustrated in FIG. 5B is a modification example of the circuit MP[i,j] in FIG. 5A. The circuit MP[i,j] in FIG. 5B includes the circuit MC and the circuit MCr like the circuit MP[i,j] in FIG. 5A. Note that the circuit MP[i,j] in FIG. 5B is different from the circuit MP[i,j] in FIG. 5A in that the holding portion HCr is not included in the circuit MCr.

The circuit MCr does not include the holding portion HCr; thus, an arithmetic circuit using the circuit MP[i,j] in FIG. 5B does not necessarily include the wiring ILB[j] for supplying a potential to be held in the holding portion HCr. In addition, the circuit MCr is not necessarily electrically connected to the wiring WL[i].

In the circuit MP[i,j] in FIG. 5B, the holding portion HC included in the circuit MC is electrically connected to the circuit MCr. That is, the circuit MP[i,j] in FIG. 5B is configured so that the circuit MCr and the circuit MC share the holding portion HC. An inverted signal of the signal held in the holding portion HC can be supplied to the circuit MCr from the holding portion HC, for example. Accordingly, the circuit MC and the circuit MCr can perform different operations. Alternatively, it is also possible that the circuit MC and the circuit MCr have different inside circuit configurations so that the circuit MC and the circuit MCr output currents having different levels in accordance with the same signal held in the holding portion HC. Here, when a potential corresponding to the first data $w_i^{(k-1)}{}_j^{(k)}$ is held in the holding portion HC and a potential corresponding to the second data $z_i^{(k-1)}$ is supplied to the wiring X1L[i] and the wiring X2L[i], the circuit MP[i,j] can output to the wiring OL[j] and the wiring OLB[j] a current corresponding to the product of the first data $w_i^{(k-1)}{}_j^{(k)}$ and the second data $z_i^{(k-1)}$.

Figure 6:
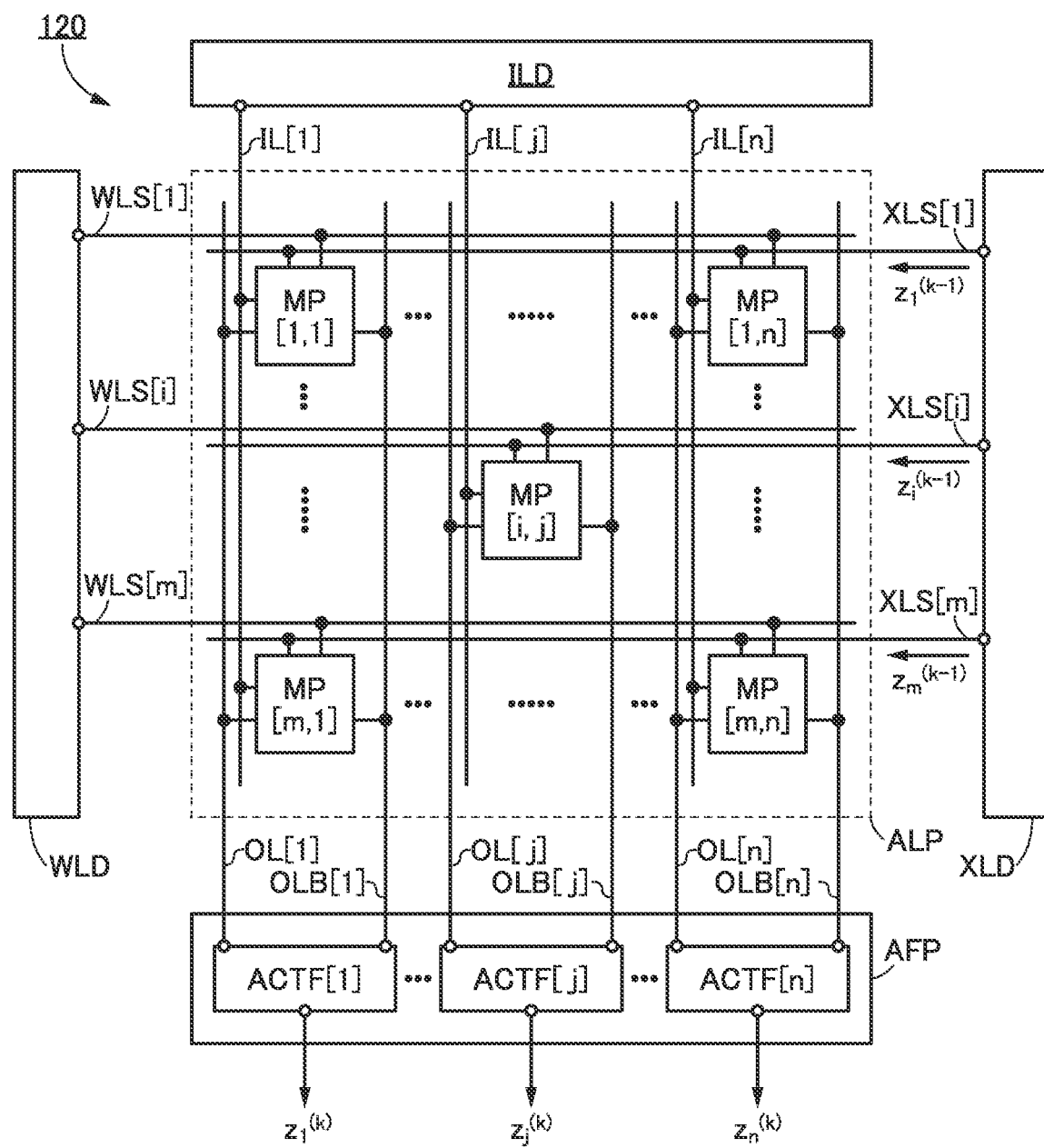
FIG. 6 is a circuit diagram showing a configuration example of a semiconductor device.

Note that the arithmetic circuit 110 using the circuit MP in FIG. 5B can have a circuit configuration of an arithmetic circuit 120 illustrated in FIG. 6. The arithmetic circuit 120 has a configuration obtained by removing the wiring ILB[1] to a wiring ILB[m] from the arithmetic circuit 110 in FIG. 2.

Figure 5C:
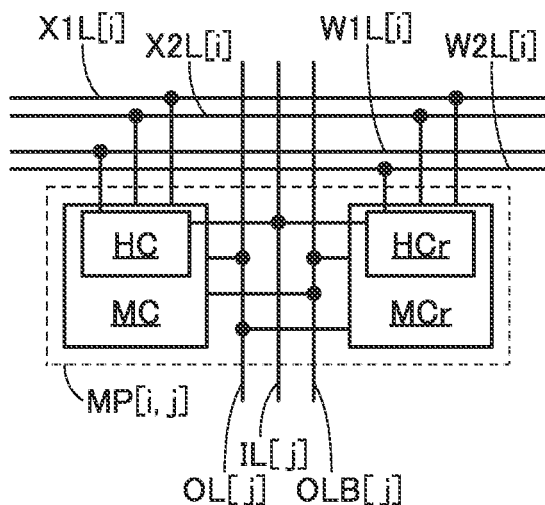

The circuit MP[i,j] illustrated in FIG. 5C is a modification example of the circuit MP[i,j] in FIG. 5A, and is a configuration example of the circuit MP[i,j] that can be used for the arithmetic circuit 120 in FIG. 6, specifically. The circuit MP[i,j] in FIG. 5C includes the circuit MC and the circuit MCr like the circuit MP[i,j] in FIG. 5A. Note that the circuit MP[i,j] in FIG. 5C and the circuit MP[i,j] in FIG. 5A are different from each other in the electrical connection structure of wirings.

A wiring W1L[i] and a wiring W2L[i] illustrated in FIG. 5C correspond to the wiring WLS[i] in FIG. 6. The wiring W1L[i] is electrically connected to the holding portion HC, and the wiring W2L[i] is electrically connected to the holding portion HCr.

The wiring IL[j] is electrically connected to the holding portion HC and the holding portion HCr.

In the case where different potentials are held in the holding portion HC and the holding portion HCr in the circuit MP[i,j] in FIG. 5C, operations for holding the potentials in the holding portion HC and the holding portion HCr are preferably performed not concurrently but sequentially. The case is described where the first data $w_i^{(k-1)}{}_j^{(k)}$ of the circuit MP[i,j] can be expressed when the holding portion HC holds a first potential and the holding portion HCr holds a second potential, for example. First, a predetermined potential is supplied to each of the wiring W1L[i] and the wiring W2L[i] so that electrical continuity is established between the holding portion HC and the wiring IL[j] and electrical continuity is broken between the holding portion HCr and the wiring IL[j]. Then, the first potential is supplied to the wiring IL[j], whereby the first potential can be supplied to the holding portion HC. After that, a predetermined potential is supplied to each of the wiring W1L[i] and the wiring W2L[i] so that electrical continuity is broken between the holding portion HC and the wiring IL[j] and electrical continuity is established between the holding portion HCr and the wiring IL[j]. Then, the second potential is supplied to the wiring IL[j], whereby the second potential can be supplied to the holding portion HCr. Thus, the circuit MP[i,j] can set $w_i^{(k-1)}{}_j^{(k)}$ as the first data.

In the case where the holding portion HC and the holding portion HCr hold substantially the same potential (in the case where the first data $w_i^{(k-1)}{}_j^{(k)}$ of the circuit MP[i,j] is set when the holding portion HC and the holding portion HCr hold substantially the same potential), a predetermined potential is supplied to each of the wiring W1L[i] and the wiring W2L[i] so that electrical continuity is established between the holding portion HC and the wiring IL[j] and electrical continuity is established between the holding portion HCr and the wiring IL[j], and then, the potential is supplied to the wiring IL[j].

When a potential corresponding to the first data $w_i^{(k-1)}{}_j^{(k)}$ is held in the holding portion HC and the holding portion HCr and a potential corresponding to the second data $z_i^{(k-1)}$ is supplied to the wiring X1L[i] and the wiring X2L[i], the circuit MP[i,j] in FIG. 5C can output to the wiring OL[j] and the wiring OLB[j] a current corresponding to the product of the first data $w_i^{(k-1)}{}_j^{(k)}$ and the second data $z_i^{(k-1)}$, like the circuit MP[i,j] in FIG. 5A.

Figure 5D:
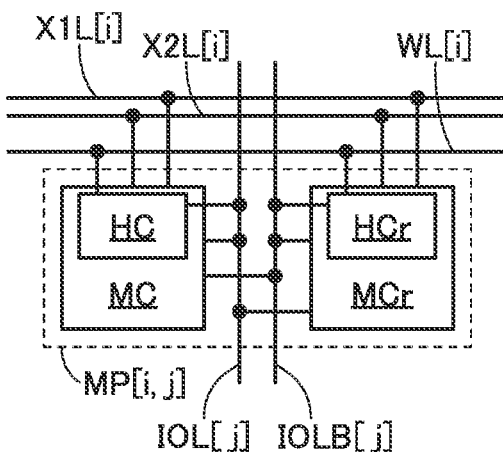

The circuit MP[i,j] illustrated in FIG. 5D is a modification example of the circuit MP[i,j] in FIG. 5A. The circuit MP[i,j] in FIG. 5D includes the circuit MC and the circuit MCr like the circuit MP[i,j] in FIG. 5A. Note that the circuit MP[i,j] in FIG. 5D and the circuit MP[i,j] in FIG. 5A are different from each other in the electrical connection structure of wirings.

A wiring IOL[j] in FIG. 5D functions as a wiring obtained by combining the wiring IL[j] and the wiring OL[j] in FIG. 5A into one wiring, and a wiring IOLB[j] in FIG. 5D functions as a wiring obtained by combining the wiring ILB[j] and the wiring OLB[j] in FIG. 5A into one wiring. Thus, the wiring IOL[j] is electrically connected to the holding portion HC, the circuit MC, and the circuit MCr, and the wiring IOLB[j] is electrically connected to the holding portion HCr, the circuit MC, and the circuit MCr.

In the case where the first data $w_i^{(k-1)}{}_j^{(k)}$ is held in the circuit MP[i,j] in FIG. 5D, first, a predetermined potential is supplied to the wiring X1L[i] and the wiring X2L[i] so that electrical continuity is broken between the circuit MC and the wiring IOL[j] and between the circuit MC and the wiring IOLB[j] and electrical continuity is broken between the circuit MCr and the wiring IOL[j] and between the circuit MCr and the wiring IOLB[j]. After that, a predetermined potential is input to the wiring WL[i] so that electrical continuity is established between the holding portion HC and the wiring IOL[j] and electrical continuity is established between the holding portion HCr and the wiring IOLB[j], and potentials corresponding to the first data $w_i^{(k-1)}{}_j^{(k)}$ are supplied to the wiring IOL[j] and the wiring IOLB[j], whereby the potentials can be input to the holding portion HC and the holding portion HCr. Then, a predetermined potential is input to the wiring WL[i] so that electrical continuity is broken between the holding portion HC and the wiring IOL[j] and electrical continuity is broken between the holding portion HCr and the wiring IOLB[j], whereby the potentials corresponding to the first data $w_i^{(k-1)}{}_j^{(k)}$ can be held in the holding portion HC and the holding portion HCr.

The potentials corresponding to the first data $w_i^{(k-1)}{}_j^{(k)}$ are held in the holding portion HC and the holding portion HCr, and then a potential corresponding to the second data $z_i^{(k-1)}$ is supplied to the wiring X1L[i] and the wiring X2L[i], whereby a current corresponding to the product of the first data $w_i^{(k-1)}{}_j^{(k)}$ and the second data $z_i^{(k-1)}$ can be output to the wiring OL[j] and the wiring OLB[j], like in the circuit MP[i,j] in FIG. 5A.

Figure 7:
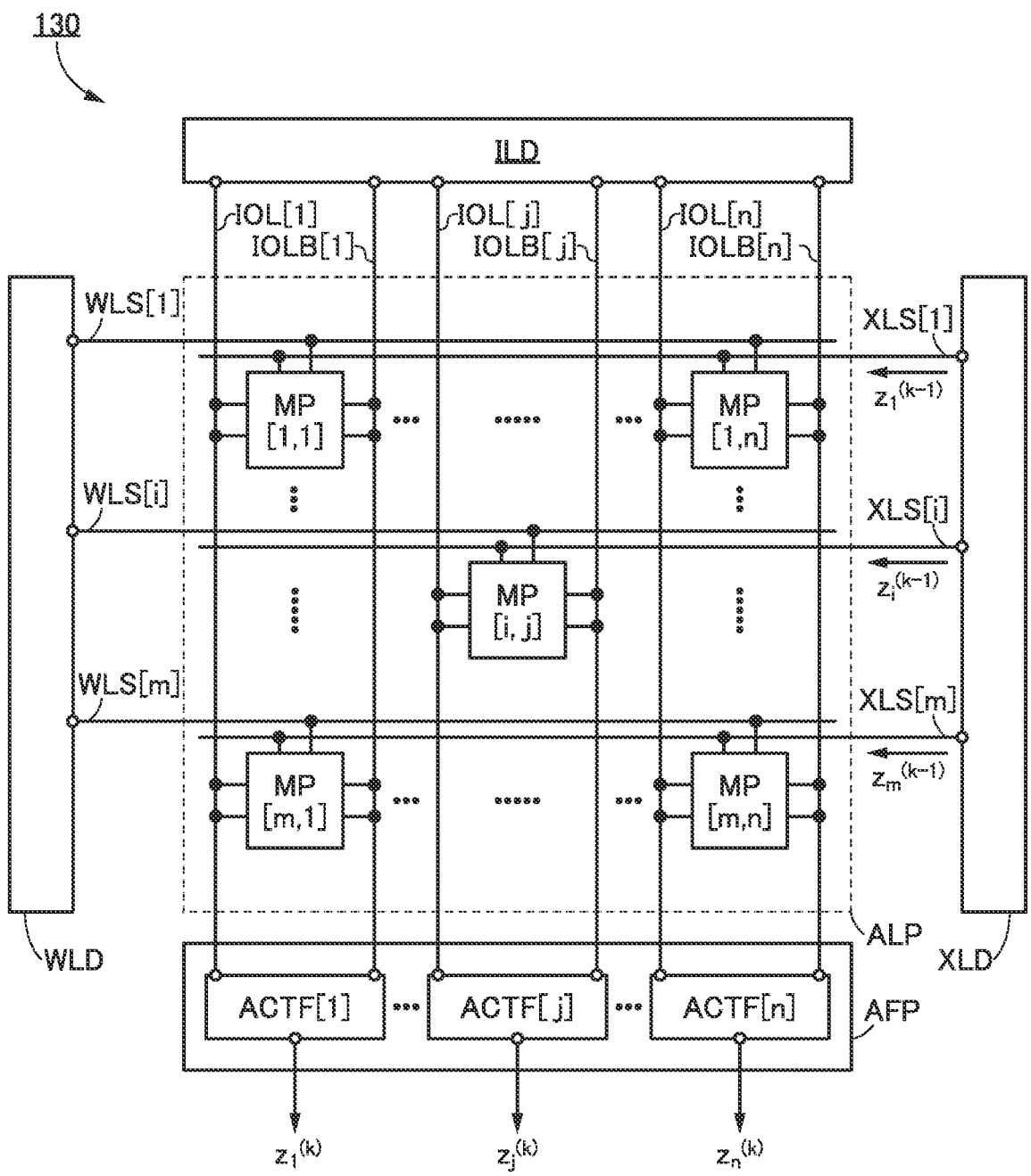
FIG. 7 is a circuit diagram showing a configuration example of a semiconductor device.

Note that the arithmetic circuit 110 using the circuit MP in FIG. 5D can have a circuit configuration of an arithmetic circuit 130 illustrated in FIG. 7. The arithmetic circuit 130 has a configuration in which the wiring IL[1] to the wiring IL[n] and the wiring OL[1] to the wiring OL[n] are combined into a wiring IOL[1] to a wiring IOL[n] and the wiring ILB[1] to the wiring ILB[n] and the wiring OLB[1] to the wiring OLB[n] are combined into a wiring IOLB[1] to a wiring IOLB[n] in the arithmetic circuit 110 in FIG. 2. In the arithmetic circuit 130, the wiring IOL[1] to the wiring IOL[n] and the wiring IOLB[1] to the wiring IOLB[n] are electrically connected to the circuit ILD. That is, the wiring IOL[j] and the wiring IOLB[j] each have a function of a signal line for transmitting the first data $w_i^{(k-1)}{}_j^{(k)}$ to the circuit MP[i,j] and a function of a current line for supplying a current to the circuit ACTF[j]. In this case, when the first data $w_i^{(k-1)}{}_j^{(k)}$ is transmitted to the circuit MP[i,j], the circuit ILD preferably establishes electrical continuity between the circuit ILD and the wiring IOL[j] and between the circuit ILD and the wiring IOLB[U], and the circuit ACTF[j] preferably breaks electrical continuity between the circuit ACTF[j] and the wiring IOL[j] and between the circuit ACTF[i] and the wiring IOLB[j]. When a current is supplied to the circuit ACTF[k,j], the circuit ILD preferably breaks electrical continuity between the circuit ILD and the wiring IOL[j] and between the circuit ILD and the wiring IOLB[j], and the circuit ACTF[j] preferably establishes electrical continuity between the circuit ACTF[j] and the wiring IOL[j] and between the circuit ACTF[j] and the wiring IOLB[j].

Figure 5E:
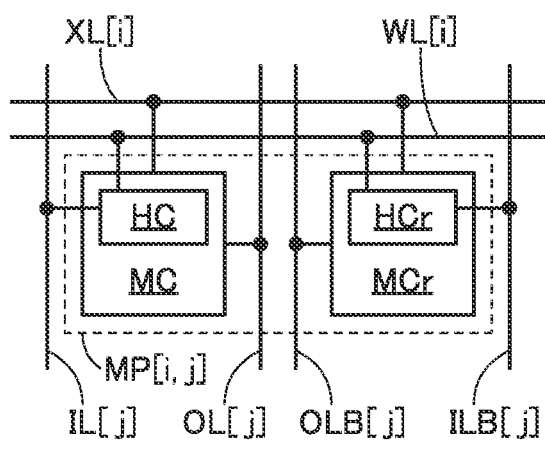

The circuit MP[i,j] illustrated in FIG. 5E is a modification example of the circuit MP[i,j] in FIG. 5A, and is a configuration example of the circuit MP[i,j] that can be used for the arithmetic circuit 110 in FIG. 2, specifically. The circuit MP[i,j] in FIG. 5E includes the circuit MC and the circuit MCr like the circuit MP[i,j] in FIG. 5A. Note that the circuit MP[i,j] in FIG. 5E and the circuit MP[i,j] in FIG. 5A are different from each other in that the circuit MC is not electrically connected to the wiring OLB[j] and the circuit MCr is not electrically connected to the wiring OL[j].

The wiring WL[i] illustrated in FIG. 5E corresponds to the wiring WLS[i] in FIG. 2. The wiring WL[i] is electrically connected to the holding portion HC and the holding portion HCr.

The wiring XL[i] illustrated in FIG. 5E corresponds to the wiring XLS[i] in FIG. 2. The wiring XL[i] is electrically connected to the holding portion MC and the holding portion MCr.

As described above, the circuit MC is not electrically connected to the wiring OLB[j] and the circuit MCr is not electrically connected to the wiring OL[j] in the circuit MP[i,j] in FIG. 5E. That is, unlike in the circuits MP[i,j] in FIG. 5A to FIG. 5D, a current output from the circuit MC does not flow to the wiring OLB[j] and a current output from the circuit MCr does not flow to the wiring OL[j] in the circuit MP[i,j] in FIG. 5E.

Thus, the circuit MP[i,j] in FIG. 5E is preferably used for an arithmetic circuit in the case where the second data $z_i^{(k-1)}$ has any one of two levels "0" and "1". In the case where the second data $z_i^{(k-1)}$ is "1", for example, the circuit MP establishes electrical continuity between the circuit MC and the wiring OL[j] and establishes electrical continuity between the circuit MCr and the wiring OLB[j]. In the case where the second data $z_i^{(k-1)}$ is "0", for example, the circuit MP breaks electrical continuity between the circuit MC and the wiring OLI[j] and breaks electrical continuity between the circuit MCr and the wiring OLB[j] so that currents output from the circuit MC and the circuit MCr do not flow to the wiring OL[j] and the wiring OLB[j].

When used for the arithmetic circuit 110, the circuit MP[i,j] in FIG. 5E can perform, for example, arithmetic operation of the case where the first data $w_i^{(k-1)}{}_j^{(k)}$ has any one of three levels "−1", "0", and "1" and the second data $z_i^{(k-1)}$ has two levels "0" and "1". Note that even in the case where the first data $w_i^{(k-1)}{}_j^{(k)}$ has any two levels among "−1", "0", and "1", for example, two levels "−1" and "1" or two levels "0" and "1", the circuit MP[i,j] in FIG. 5E can perform operation. Note that the first data $w_i^{(k-1)}{}_j^{(k)}$ may have an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Figure 5F:
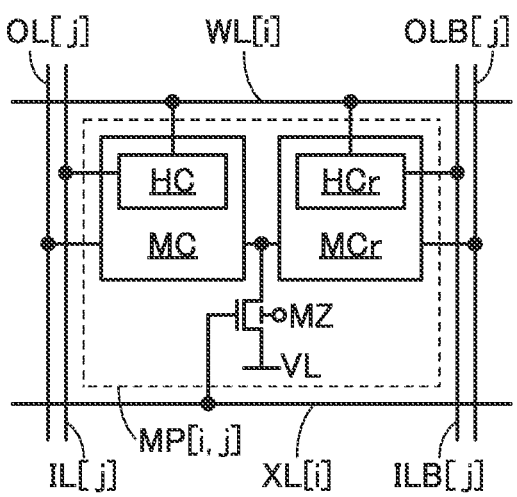

As in FIG. 5A, the circuit MP[i,j] illustrated in FIG. 5F is a circuit that can output a current corresponding to the product of the first data $w_i^{(k-1)}{}_j^{(k)}$ and the second data $z_i^{(k-1)}$ to the wiring OL[j] and the wiring OLB[j]. Note that the circuit MP[i,j] in FIG. 5F can be used for the arithmetic circuit 110 in FIG. 2, for example.

The circuit MP[i,j] in FIG. 5F includes a transistor MZ in addition to the circuit MC and the circuit MCr.

A first terminal of the transistor MZ is electrically connected to a first terminal of the circuit MC and a first terminal of the circuit MCr. A second terminal of the transistor MZ is electrically connected to a wiring VL. A gate of the transistor MZ is electrically connected to the wiring XL[i].

The wiring VL functions as a wiring for supplying a constant voltage, for example. The constant voltage is preferably determined in accordance with the configuration of the circuit MP[i,j], the arithmetic circuit 110, or the like. The constant voltage can be, for example, a high-level potential VDD, a low-level potential VSS, a ground potential, or the like.

The wiring WL[i] illustrated in FIG. 5F corresponds to the wiring WLS[i] in the arithmetic circuit 110 in FIG. 2. The wiring WL[i] is electrically connected to the holding portion HC and the holding portion HCr.

The wiring OL[j] is electrically connected to a second terminal of the circuit MC. The wiring OLB[j] is electrically connected to a second terminal of the circuit MCr.

The wiring IL[j] is electrically connected to the holding portion HC and the wiring ILB[j] is electrically connected to the holding portion HCr.

For the operation in the case where a potential corresponding to the first data is held in each of the holding portion HC and the holding portion HCr in the circuit MP[i,j] in FIG. 5F, the description of the operation for holding a potential corresponding to the first data in the circuit MP[i,j] in FIG. 5A is referred to.

In the circuit MP[i,j] in FIG. 5F, the circuit MC has a function of flowing a current corresponding to the potential held in the holding portion HC to between the first terminal and the second terminal of the circuit MC while the constant voltage is supplied to the first terminal of the circuit MC from the wiring VL. The circuit MCr has a function of flowing a current corresponding to the potential held in the holding portion HCr to between the first terminal and the second terminal of the circuit MCr while the constant voltage is supplied to the first terminal of the circuit MC from the wiring VL. That is, by holding a potential corresponding to the first data $w_i^{(k-1)}{}_j^{(k)}$ in each of the holding portion HC and the holding portion HCr of the circuit MP[i,j], the amount of current flowing between the first terminal and the second terminal of the circuit MC and the amount of current flowing between the first terminal and the second terminal of the circuit MCr can be determined. Note that in the case where the first terminal of the circuit MC (the circuit MCr) is not supplied with the constant voltage supplied from the wiring VL, the circuit MC (the circuit MCr) does not necessarily flow a current between the first terminal and the second terminal of the circuit MC (the circuit MCr), for example.

In the case where a potential corresponding to the first data $w_i^{(k-1)}{}_j^{(k)}$ of "1" is held in each of the holding portion HC and the holding portion HCr, for example, the circuit MC flows a predetermined current between the first terminal and the second terminal of the circuit MC when the constant voltage supplied from the wiring VL is supplied to the circuit MC. Thus, a current flows between the circuit MC and the wiring OL. Note that at this time, the circuit MCr does not flow a current between the first terminal and the second terminal of the circuit MCr. Thus, a current does not flow between the circuit MCr and the wiring OLB. Moreover, in the case where a potential corresponding to the first data $w_i^{(k-1)}{}_j^{(k)}$ of "−1" is held in each of the holding portion HC and the holding portion HCr, for example, the circuit MCr flows a predetermined current between the first terminal and the second terminal of the circuit MCr when the constant voltage supplied from the wiring VL is supplied to the circuit MC. Thus, a current flows between the circuit MCr and the wiring OLB. Note that at this time, the circuit MC does not flow a current between the first terminal and the second terminal of the circuit MC. Thus, a current does not flow between the circuit MC and the wiring OL. In the case where a potential corresponding to the first data $w_i^{(k-1)}{}_j^{(k)}$ of "0" is held in each of the holding portion HC and the holding portion HCr, for example, the circuit MC does not flow a current between the first terminal and the second terminal of the circuit MC and the circuit MCr does not flow a current between the first terminal and the second terminal of the circuit MCr regardless of whether the constant voltage from the wiring VL is supplied to the circuit MC and the circuit MCr. That is, a current does not flow between the circuit MC and the wiring OL and a current does not flow between the circuit MCr and the wiring OLB.

Note that for a specific example of the potential corresponding to the first data $w_i^{(k-1)}{}_j^{(k)}$ that is held in the holding portion HC and the holding portion HCr in the circuit MP[i,j] in FIG. 5F, the description of the circuit MP[i,j] in FIG. 5A is referred to. In the circuit MP[i,j] in FIG. 5F, the holding portion HC and the holding portion HCr may have a function of holding not a potential but information such as a current or a resistance, and the circuit MC and the circuit MCr may have a function of flowing a current corresponding to the information as in the circuit MP[i,j] in FIG. 5A.

The wiring XL[i] illustrated in FIG. 5F corresponds to the wiring XLS[i] in the arithmetic circuit 110 in FIG. 2. Note that, for example, the second data $z_i^{(k-1)}$ input to the circuit MP[i,j] is determined in accordance with the potential, current, or the like of the wiring XL[i]. Thus, the potential corresponding to the second data $z_i^{(k-1)}$ is input to the gate of the transistor MZ through the wiring XL[i], for example.

The case where the second data $z_i^{(k-1)}$ has any one of two levels "0" and "1" is considered, for example. In the case where the second data $z_i^{(k-1)}$ is "1", for example, a high-level potential is supplied to the wiring XL[i]. At this time, the transistor MZ is brought into an on state; thus, the circuit MP establishes electrical continuity between the wiring VL and the first terminal of the circuit MC and establishes electrical continuity between the wiring VL and the first terminal of the circuit MCr. That is, in the case where the second data $z_i^{(k-1)}$ is "1", the constant voltage from the wiring VL is supplied to the circuit MC and the circuit MCr. Moreover, in the case where the second data $z_i^{(k-1)}$ is "0", for example, a low-level potential is supplied to the wiring XL[i]. In this case, the circuit MP breaks electrical continuity between the circuit MC and the wiring OLB[j] and breaks electrical continuity between the circuit MCr and the wiring OL[j]. That is, in the case where the second data $z_i^{(k-1)}$ is "0", the constant voltage from the wiring VL is not supplied to the circuit MC and the circuit MCr.

Here, in the case where the first data $w_i^{(k-1)}{}_j^{(k)}$ is "1" and the second data $z_i^{(k-1)}$ is "1", for example, the result is that a current flows between the circuit MC and the wiring OL and a current does not flow between the circuit MCr and a wiring BLB. In the case where the first data $w_i^{(k-1)}{}_j^{(k)}$ is "−1" and the second data $z_i^{(k-1)}$ is "1", for example, the result is that a current does not flow between the circuit MC and the wiring OL and a current flows between the circuit MCr and the wiring OLB. In the case where the first data $w_i^{(k-1)}{}_j^{(k)}$ is "0" and the second data $z_i^{(k-1)}$ is "1", for example, the result is that a current does not flow between the circuit MC and the wiring OL and between the circuit MCr and the wiring OLB. In the case where the second data $z_i^{(k-1)}$ is "0", for example, the result is that a current does not flow between the circuit MC and the wiring OL and between the circuit MCr and the wiring OLB even when the first data $w_i^{(k-1)}{}_j^{(k)}$ is any one of "−1", "0", and "1".

Like the circuit MP[i,j] in FIG. 5E, the circuit MP[i,j] in FIG. 5F can perform, for example, arithmetic operation in the case where the first data $w_i^{(k-1)}{}_j^{(k)}$ has any one of three levels "−1", "0", and "1" and the second data $z_i^{(k-1)}$ has two levels "0" and "1". In addition, even in the case where the first data $w_i^{(k-1)}{}_j^{(k)}$ has any two levels among "−1", "0", and "1", for example, two levels "−1" and "1" or two levels "0" and "1", the circuit MP[i,j] in FIG. 5F can perform operation like the circuit MP[i,j] in FIG. 5E. Note that the first data $w_i^{(k-1)}{}_j^{(k)}$ may have an analog value or a multi-bit (multi-level) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

<Operation Example of Arithmetic Circuit>

Next, an operation example of the arithmetic circuit 110 in FIG. 2 is described. Note that in the description of this operation example, the arithmetic circuit 110 illustrated in FIG. 8 is used as an example.

Figure 8:
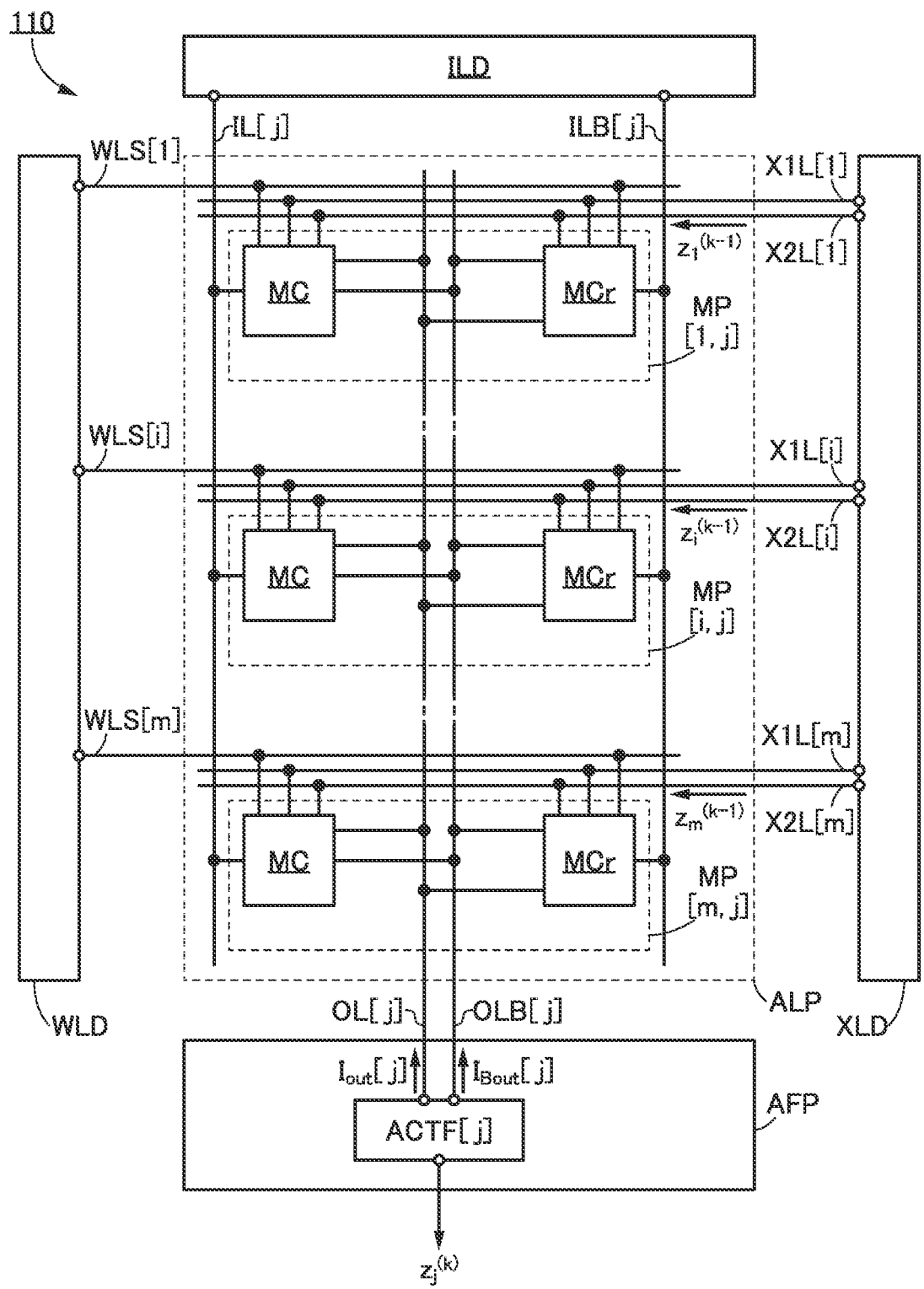
FIG. 8 is a circuit diagram showing a configuration example of a semiconductor device.

The arithmetic circuit 110 in FIG. 8 is illustrated focusing on a circuit positioned in the j-th column of the arithmetic circuit 110 in FIG. 2. That is, the arithmetic circuit 110 in FIG. 8 corresponds to a circuit which performs product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ in the neural network 100 illustrated in FIG. 1A and arithmetic operation of an activation function using the result of the product-sum operation. In addition, the circuit MP in FIG. 5A is used as the circuit MP included in the array portion ALP of the arithmetic circuit 110 in FIG. 8.

First, in the arithmetic circuit 110, the first data $w_1^{(k-1)}{}_j^{(k)}$ to $w_m^{(k-1)}{}_j^{(k)}$ are set to a circuit MP[1,j] to a circuit MP[m,j]. The first data $w_i^{(k-1)}{}_j^{(k)}$ is set by the following method: a predetermined potential is input to the wiring WLS[1] to the wiring WLS[m] sequentially by the circuit WLD to select the circuit MP[1,j] to the circuit MP[m,j] sequentially, and a potential corresponding to the first data is supplied from the circuit ILD through the wiring IL[j] and the wiring ILB[j] to the holding portion HC of the circuit MC and the holding portion HCr of the circuit MCr that are included in each of the selected circuits MP. After the supply of the potential, the circuit WLD makes the circuit MP[1,j] to the circuit MP[m,j] unselected, so that a potential corresponding to the first data $w_1^{(k-1)}{}_j^{(k)}$ to $w_m^{(k-1)}{}_j^{(k)}$ can be held in the holding portion HC of the circuit MC and the holding portion HCr of the circuit MCr included in each of the circuit MP[1,j] to the circuit MP[m,j]. For example, in the case where the first data $w_1^{(k-1)}{}_j^{(k)}$ to $w_m^{(k-1)}{}_j^{(k)}$ each have a positive value, a value corresponding to the positive value is input to the holding portion HC and a value corresponding to zero is input to the holding portion HCr. On the contrary, in the case where the first data $w_1^{(k-1)}{}_j^{(k)}$ to $w_m^{(k-1)}{}_j^{(k)}$ each have a negative value, a value corresponding to zero is input to the holding portion HC and a value corresponding to the absolute value of the negative value is input to the holding portion HCr.

Next, the second data $z_1^{(k-1)}$ to $z_m^{(k-1)}$ are supplied to a wiring X1L[1] to a wiring X1L[m] and a wiring X2L[1] to a wiring X2L[m] by the circuit XLD. As a specific example, the second data $z_1^{(k-1)}$ is supplied to the wiring X1L[i] and the wiring X2L[i]. Note that the wiring X1L[i] and the wiring X2L[i] correspond to the wiring XLS[i] of the arithmetic circuit 110 illustrated in FIG. 2.

The electrical continuity between the circuit MC and the circuit MCr included in the circuit MP[1,j] to the circuit MP[m,j] and the wiring OL[j] and a circuit OLB[j] is determined in accordance with the second data $z_1^{(k-1)}$ to $z_m^{(k-1)}$ respectively input to the circuit MP[I j] to the circuit MP[m,j]. As a specific example, in accordance with the second data $z_1^{(k-1)}$, the circuit MP[i,j] is in any one of a state where "electrical continuity is established between the circuit MC and the wiring OL[j] and electrical continuity is established between the circuit MCr and the wiring OLB[j]", a state where "electrical continuity is established between the circuit MC and the wiring OLB[j] and electrical continuity is established between the circuit MCr and the wiring OL[j]", and a state where "electrical continuity is broken between each of the circuit MC and the circuit MCr and both of the wiring OL[j] and the wiring OLB[j]". For example, in the case where the second data $z_1^{(k-1)}$ has a positive value, a value with which electrical continuity can be established between the circuit MC and the wiring OL[j] and electrical continuity can be established between the circuit MCr and the wiring OLB[j] is input to the wiring X1L[1]. Then, a value with which electrical continuity can be broken between the circuit MC and the wiring OLB[j] and electrical continuity can be broken between the circuit MCr and the wiring OL[j] is input to the wiring X2L[1]. In the case where the second data $z_1^{(k-1)}$ has a negative value, a value with which electrical continuity can be established between the circuit MC and the wiring OLB[j] and electrical continuity can be established between the circuit MCr and the wiring OL[j] is input to the wiring X1L[1]. Then, a value with which electrical continuity can be broken between the circuit MC and the wiring OL[j] and electrical continuity can be broken between the circuit MCr and the wiring OLB[j] is input to the wiring X2L[1]. In the case where the second data $z_1^{(k-1)}$ has a value of zero, a value with which electrical continuity can be broken between the circuit MC and the wiring OLB[j] and electrical continuity can be broken between the circuit MCr and the wiring OL[j] is input to the wiring X1L[1]. Then, a value with which electrical continuity can be broken between the circuit MC and the wiring OL[j] and electrical continuity can be broken between the circuit MCr and the wiring OLB[j] is input to the wiring X2L[1].

Whether electrical continuity is established or not between the circuit MC and the circuit MCr that are included in the circuit MP[i,j] and the wiring OL[j] and the circuit OLB[j] is determined in accordance with the second data $z_i^{(k-1)}$ input to the circuit MP[i,j], whereby currents are input and output between the circuit MC and the circuit MCr and the wiring OL[j] and the wiring OLB[j]. Furthermore, the amount of the current is determined in accordance with the first data $w_i^{(k-1)}{}_j^{(k)}$ and/or the second data $z_i^{(k-1)}$ set to the circuit MP[i,j].

For example, in the circuit MP[i,j], a current flowing from the wiring OL[j] to the circuit MC or the circuit MCr is I[i,j], and a current flowing from the wiring OLB[j] to the circuit MC or the circuit MCr is IB[i,j]. When a current flowing from the wiring ACTF[j] to the wiring OL[j] is $I_{out}[j]$ and a current flowing from the wiring OLB[j] to the wiring ACTF[j] is $IB_{out}[j]$, $I_{out}[j]$ and $IB_{out}[j]$ can be expressed by the following formulae.

[Formulae 4]

$$I_{out}[j] = \sum_{i=1}^{m} I[i, j] \quad (1.4)$$

$$I_{Bout}[j] = \sum_{i=1}^{m} I_B[i, j] \quad (1.5)$$

In the circuit MP[i,j], the circuit MC releases I(+1) and the circuit MCr releases I(−1) in the case where the first data $w_i^{(k-1)}{}_j^{(k)}$ is "+1", the circuit MC releases I(−1) and the circuit MCr releases I(+1) in the case where the first data $w_i^{(k-1)}{}_j^{(k)}$ is "−1", and the circuit MC releases I(−1) and the circuit MCr releases I(−1) in the case where the first data $w_i^{(k-1)}{}_j^{(k)}$ is "0", for example.

Furthermore, the circuit MP[i,j] is in a state where "electrical continuity is established between the circuit MC and the wiring OL[j], electrical continuity is established between the circuit MCr and the wiring OLB[j], electrical continuity is broken between the circuit MC and the wiring OLB[j], and electrical continuity is broken between the circuit MCr and the wiring OL[j]" in the case where the second data $z_i^{(k-1)}$ is "+1"; the circuit MP[i,j] is in a state where "electrical continuity is established between the circuit MC and the wiring OLB[j], electrical continuity is established between the circuit MCr and the wiring OL[j], electrical continuity is broken between the circuit MC and the wiring OL[j], and electrical continuity is broken between the circuit MCr and the wiring OLB[j]" in the case where the second data $z_i^{(k-1)}$ is "−1"; and the circuit MP[i,j] is in a state where "electrical continuity is broken between the circuit MC and the wiring OL[j] and between the circuit MC and the wiring OLB[j], electrical continuity is broken between the circuit MCr and the wiring OL[j] and between the circuit MCr and OLB[j], and electrical continuity is broken between the circuit MCr and the wiring OL[j] and between the circuit MCr and OLB[j]" in the case where the second data $z_i^{(k-1)}$ is "0".

In this case, in the circuit MP[i,j], the current I[i,j] flowing from the wiring OL[j] to the circuit MC or the circuit MCr and the current IB[i,j] flowing from the wiring OLB[j] to the circuit MC or the circuit MCr are as shown in the following table. Note that depending on the case, the circuit MP[i,j] may be configured so that the amount of the current I(−1) is 0. The current I[i,j] may be a current flowing from the circuit MC or the circuit MCr to the wiring OL[j]. Similarly, the current IB[i,j] may be a current flowing from the circuit MC or the circuit MCr to the wiring OLB[j].

TABLE 1

| $W_i^{(k-1)}{}_j^{(k)}$ | $Z_i^{(k-1)}$ | I[i, j] | $I_B$[i, j] |
|---|---|---|---|
| 0 | +1 | I(−1) | I(−1) |
| +1 | +1 | I(+1) | I(−1) |
| −1 | +1 | I(−1) | I(+1) |
| 0 | −1 | I(−1) | I(−1) |
| +1 | −1 | I(−1) | I(+1) |
| −1 | −1 | I(+1) | I(−1) |
| 0 | 0 | 0 | 0 |
| +1 | 0 | 0 | 0 |
| −1 | 0 | 0 | 0 |

Then, $I_{out}[j]$ and $IB_{out}[j]$ flowing from the wiring OL[j] and the wiring OLB[j], respectively, are input to the circuit ACTF[j]; after that, the circuit ACTF[j] performs comparison between $I_{out}[j]$ and $IB_{out}[j]$, for example. Depending on the comparison result, the circuit ACTF[j] outputs the signal $z_j^{(k)}$ to be transmitted from the neuron $N_j^{(k)}$ to a neuron in the (k+1)-th layer, for example.

The arithmetic circuit 110 in FIG. 8 can perform, for example, product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ input from the neuron $N_1^{(k-1)}$ to the neuron $N_m^{(k-1)}$ to the neuron $N_1^{(k)}$ and arithmetic operation of an activation function using the result of the product-sum operation. Furthermore, a circuit comparable to the arithmetic circuit 110 in FIG. 2 can be formed by providing the circuits MP in n columns in the array portion ALP of the arithmetic circuit in FIG. 8. In other words, with the arithmetic circuit 110 in FIG. 2, the product-sum operation and the arithmetic operation of an activation function using the result of the product-sum operation can be performed in the neuron $N_1^{(k)}$ to the neuron $N_n^{(k)}$ concurrently.

<<Modification Example of Circuit or the Like Included in Arithmetic Circuit>>

Some or all of the transistors included in the above-described array portion ALP, circuit ILD, circuit WLD, circuit XLD, circuit AFP, circuit MP, and the like are preferably OS transistors, for example. For example, in the case of a transistor whose off-state current needs to be low, a specific example of a transistor having a function of holding charge accumulated in a capacitor is preferably an OS transistor. Specifically, in the case where an OS transistor is used as the transistor, the OS transistor preferably has a structure described particularly in Embodiment 3. However, one embodiment of the present invention is not limited thereto.

The transistors included in the array portion ALP, the circuit ILD, the circuit WLD, the circuit XLD, the circuit AFP, the circuit MP, and the like may each be a transistor containing silicon in a channel formation region (hereinafter, referred to as a Si transistor) instead of the OS transistor. As silicon, single crystal silicon, hydrogenated amorphous silicon, microcrystalline silicon, or polycrystalline silicon can be used, for example. As transistors other than the OS transistor and the Si transistor, it is possible to use, for example, a transistor containing a semiconductor such as Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability in some cases. For that reason, in the arithmetic circuit 110, the arithmetic circuit 120, and the arithmetic circuit 130, OS transistors may be used as the n-channel transistors included in the array portion ALP, the circuit ILD, the circuit WLD, the circuit XLD, the circuit AFP, the circuit MP, and the like, and Si transistors may be used as the p-channel transistors.

Note that this embodiment can be combined with other embodiments in this specification as appropriate.

Embodiment 2

In this embodiment, a specific configuration example of the circuit MP described in Embodiment 1 will be described.

In Embodiment 1, the reference numeral of the circuit MP is accompanied by [1,1], [i,j], [m,n], or the like which indicates its position in the array portion ALP; however, in this embodiment, the description of [1,1], [i,j], [m,n], or the like for the reference numeral of the circuit MP is omitted unless otherwise specified.

Configuration Example 1

Figure 9A:
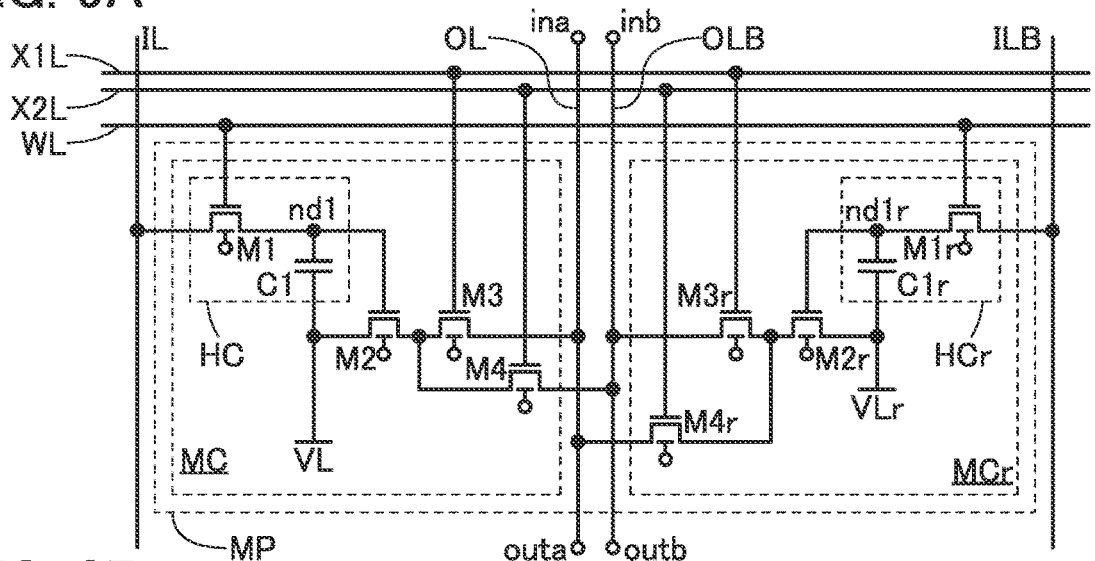
FIG. 9A, FIG. 9B, and FIG. 9C are circuit diagrams showing configuration examples of a circuit included in a semiconductor device.

First, an example of a circuit configuration that can be applied to the circuit MP in FIG. 5A is described. The circuit MP illustrated in FIG. 9A is an example of the configuration of the circuit MP in FIG. 5A, and the circuit MC included in the circuit MP in FIG. 9A includes a transistor M1 to a transistor M4 and a capacitor C1, for example. Note that, for example, the holding portion HC includes the transistor M1 and the capacitor C1.

The transistor M1 to the transistor M4 illustrated in FIG. 9A are each an n-channel transistor having a multi-gate structure including gates over and under a channel, and the transistor M1 to the transistor M4 each include a first gate and a second gate. Note that in this specification and the like, for example, although the first gate is referred to as a gate (referred to as a front gate in some cases) and the second gate is referred to as a back gate for convenience so that they are distinguished from each other, the first gate and the second gate can be interchanged with each other. Therefore, the term "gate" can be replaced with the term "back gate" in this specification and the like. Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The semiconductor device of one embodiment of the present invention does not depend on the connection structure of a back gate of a transistor. In the transistor M1 to the transistor M4 illustrated in FIG. 9A, the back gate is illustrated and the connection structure of the back gate is not illustrated; however, the electrical connection destination of the back gate can be determined at the design stage. For example, in a transistor including a back gate, a gate and the back gate may be electrically connected to each other to increase the on-state current of the transistor. In other words, the gate and the back gate may be electrically connected to each other in each of the transistor M1 to the transistor M4, for example. In addition, for example, in order to change the threshold voltage of a transistor including a back gate or reduce the off-state current of the transistor, a wiring electrically connected to an external circuit or the like may be provided and a potential may be supplied to the back gate of the transistor by the external circuit or the like. Note that this applies to not only a transistor illustrated in FIG. 9A but also a transistor described in other parts of the specification and a transistor illustrated in other drawings.

Figure 9B:
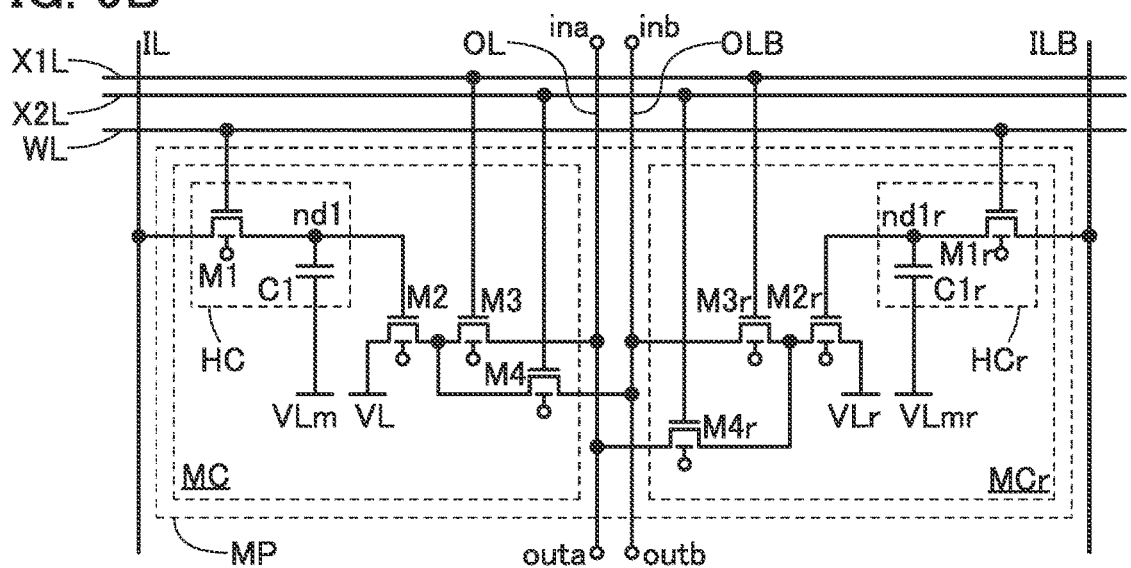
Figure 9C:
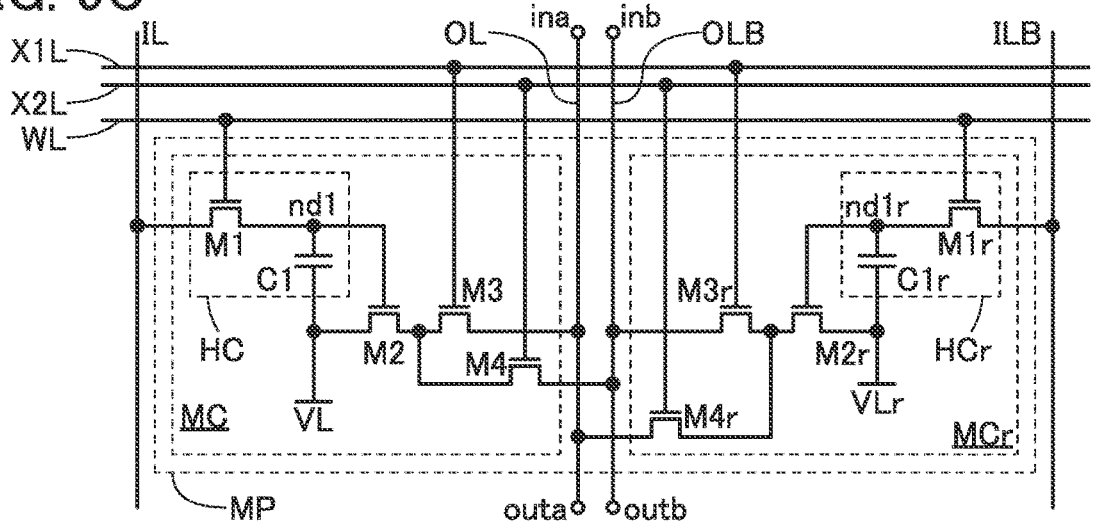

The semiconductor device of one embodiment of the present invention does not depend on the structure of a transistor included in the semiconductor device. For example, the transistor M1 to the transistor M4 and a transistor M1r to a transistor M4r illustrated in FIG. 9A may have a structure not including a back gate, that is, may be single-gate transistors as illustrated in FIG. 9C. It is also possible that some transistors include back gates and other transistors do not include back gates. Note that this applies to not only a circuit diagram shown in FIG. 9A but also a transistor described in other parts of the specification and a transistor illustrated in other drawings.

In this specification and the like, transistors with a variety of structures can be used as a transistor. Thus, there is no limitation on the type of transistors used. Examples of transistors include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a temperature lower than that of the case of using single crystal silicon, manufacturing costs can be reduced or a larger manufacturing apparatus can be used. Since a larger manufacturing apparatus can be used, TFTs can be manufactured over a large substrate. This enables a large number of display devices to be manufactured at a time, resulting in low cost manufacturing. Alternatively, a low manufacturing temperature allows the use of a low heat-resistance substrate. Thus, transistors can be manufactured over a light-transmitting substrate. Transmission of light in a display element can be controlled by using the transistor over a light-transmitting substrate. Alternatively, some of the films included in the transistor can transmit light because the transistor is thin. Accordingly, the aperture ratio can be improved.

For example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used. Alternatively, a thin film transistor including a thin film of such a compound semiconductor or oxide semiconductor can be used. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example of a transistor, a transistor formed by an inkjet method or a printing method can be used. The transistor can be manufactured at room temperature, manufactured at a low vacuum, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted compared to a manufacturing method by which etching is performed after the film is deposited over the entire surface; thus, the cost can be reduced.

As another example of a transistor, a transistor containing an organic semiconductor or a carbon nanotube can be used. Thus, a transistor can be formed over a bendable substrate. A device using a transistor containing an organic semiconductor or a carbon nanotube can be highly resistant to impact.

Note that a transistor with any of a variety of other structures can also be used as a transistor. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

As another example of a transistor, it is possible to use a transistor having a structure in which gate electrodes are positioned above and below an active layer. With the structure in which the gate electrodes are positioned above and below the active layer, a circuit configuration is such that a plurality of transistors are connected in parallel. Thus, a channel formation region is increased, so that the amount of current can be increased. Alternatively, with the structure in which the gate electrodes are positioned above and below the active layer, a depletion layer can be easily formed, so that subthreshold swing can be improved.

As another example of a transistor, it is possible to use a transistor having a structure in which a gate electrode is positioned above an active layer, a structure in which a gate electrode is positioned below an active layer, a staggered structure, an inverted staggered structure, a structure in which a channel region is divided into a plurality of regions, a structure in which active layers are connected in parallel, a structure in which active layers are connected in series, or the like. Alternatively, a transistor can have a variety of structures such as a planar type, a FIN-type, a TRI-GATE type, a top-gate type, a bottom-gate type, and a double-gate type (with gates above and below a channel).

As another example of a transistor, it is possible to use a transistor having a structure in which a source electrode or a drain electrode overlaps with an active layer (or part thereof). Employing the structure in which the source electrode or the drain electrode overlaps with the active layer (or part thereof) can prevent unstable operation due to accumulation of charge in part of the active layer.

As another example of a transistor, it is possible to employ a structure in which an LDD region is provided. By providing the LDD region, it is possible to achieve a reduction in off-state current or an increase in withstand voltage (an improvement in reliability) of the transistor. Alternatively, by providing the LDD region, in the case of operation in a saturation region, the drain current does not change much even if the drain-source voltage changes, and thus the voltage-current characteristics having a flat slope can be obtained.

In this specification and the like, a transistor can be formed using a variety of substrates, for example. The type of the substrate is not limited to a certain type. Examples of the substrate include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate, and the transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance or a flexible substrate. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then the transistor is transferred to another substrate; thus, the transistor may be positioned over another substrate. Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, fabricating a device with high durability, providing high heat resistance, reducing weight, or reducing thickness can be achieved.

Note that all the circuits that are necessary to achieve a predetermined function can be formed using one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible not to form all the circuits that are necessary to achieve a predetermined function on one substrate. That is, it is possible to form part of the circuits necessary to achieve the predetermined function on a given substrate and form the other part of the circuits necessary to achieve the predetermined function on another substrate. For example, part of the circuits necessary to achieve the predetermined function can be formed over a glass substrate, and the other part of the circuits necessary to achieve the predetermined function can be formed using a single crystal substrate (or an SOI substrate). The single crystal substrate where the other part of the circuits necessary to achieve the predetermined function (also referred to as an IC chip) can be connected to the glass substrate by COG (Chip On Glass), and the IC chip can be provided over the glass substrate. Alternatively, the IC chip can be connected to the glass substrate by TAB (Tape Automated Bonding), COF (Chip On Film), SMT (Surface Mount Technology), a printed circuit board, or the like. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed on a substrate (e.g., a single crystal substrate) different from a substrate where a pixel portion is formed, whereby an IC chip is formed. The use of this IC chip can prevent the increase in power consumption.

In the circuit MP in FIG. 9A, a first terminal of the transistor M1 is electrically connected to the wiring IL. A second terminal of the transistor M1 is electrically connected to a first terminal of the capacitor C1 and the gate of the transistor M2. The gate of the transistor M1 is electrically connected to the wiring WL. A first terminal of the transistor M2 is electrically connected to a second terminal of the capacitor C1 and the wiring VL. A second terminal of the transistor M2 is electrically connected to a first terminal of the transistor M3 and a first terminal of the transistor M4. A second terminal of the transistor M3 is electrically connected to the wiring OL. The gate of the transistor M3 is electrically connected to the wiring X1L. A second terminal of the transistor M4 is electrically connected to the wiring OLB. The gate of the transistor M4 is electrically connected to the wiring X2L. Note that as illustrated in FIG. 9B, the second terminal of the capacitor C1 may be electrically connected to another wiring VLm instead of the wiring VL. Similarly, a second terminal of a capacitor Clr may be electrically connected to another wiring VLmr instead of a wiring VLr. Note that the second terminal of the capacitor C1 may be electrically connected to the wiring VLm instead of the wiring VL in not only FIG. 9A but also a circuit diagram in other drawings. Moreover, for example, in FIG. 9B, the wiring VL and the wiring VLr may be combined into one wiring and the wiring VLm and the wiring VLmr may be combined into one wiring (not illustrated).

In the holding portion HC illustrated in FIG. 9A, an electrical connection point of the second terminal of the transistor M1, the first terminal of the capacitor C1, and the gate of the transistor M2 is a node nd1.

As described in Embodiment 1, the holding portion HC has a function of holding a potential corresponding to the first data w, for example. The potential is held in the holding portion HC included in the circuit MC in FIG. 9A in the following manner: when the transistor M1 is brought into an on state, the potential is input from the wiring IL to be written to the capacitor C1, and then the transistor M1 is brought into an off state. Thus, the potential of the node nd1 can be held as the potential corresponding to the first data.

It is preferable that a transistor having a low off-state current be used as the transistor M1, because the transistor M1 holds the potential of the node nd1 for a long time. As the transistor having a low off-state current, for example, an OS transistor can be used. Alternatively, a transistor including a back gate may be used as the transistor M1, and an off-state current may be reduced by applying a low-level potential to the back gate so that the threshold voltage is shifted to the positive side.

The circuit MCr has substantially the same circuit configuration as that of the circuit MC. Thus, the reference numerals of the circuit elements of the circuit MCr include "r" so that the circuit elements of the circuit MCr are distinguished from those of the circuit MC.

In the circuit MCr, the connection structure different from that of the circuit MC is described. A second terminal of the transistor M3r is electrically connected to not the wiring OL but the wiring OLB, and a second terminal of the transistor M4r is electrically connected to not the wiring OLB but the wiring OL. The first terminal of the transistor M2 is electrically connected to the wiring VLr.

In order to simply describe a current input to or output from the circuit MP in an operation example described below, both ends of the wiring OL illustrated in FIG. 9A are referred to as a node ina and a node outa and both ends of the wiring OLB are referred to as a node inb and a node outb.

The wiring VL functions as a wiring for supplying a constant voltage, for example. In the case where the transistor M2 or the transistor M2r is an n-channel transistor, for example, the constant voltage can be a low-level potential VSS, a ground potential, a low-level potential other than those, or the like. The wiring VLr functions as a wiring that supplies a constant voltage like the wiring VL, and the constant voltage can be a low-level potential VSS, a ground potential, or the like. Here, in the case where FIG. 3A to FIG. 3E, FIG. 4A to FIG. 4D, and FIG. 4F are employed for the circuit ACTF[1] to the circuit ACTF[n] of the arithmetic circuit 110, the arithmetic circuit 120, and the arithmetic circuit 130, the constant voltage supplied by the wiring VAL electrically connected to the circuit ACTF[1] to the circuit ACTF[n] is preferably a potential higher than potentials supplied by the wiring VL and the wiring VLr, for example, VDD.

Figure 10A:
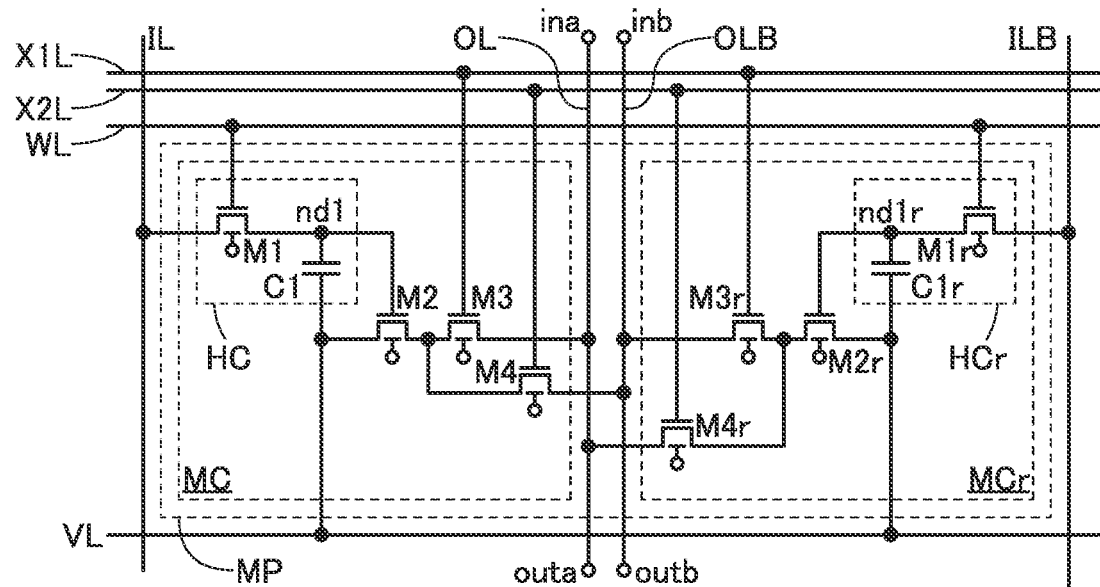
FIG. 10A and FIG. 10B are circuit diagrams showing configuration examples of a circuit included in a semiconductor device.

The constant voltage supplied by the wiring VLr may be the same as or different from the constant voltage supplied by the wiring VL. In the case where the wiring VL and the wiring VLr supply substantially the same constant voltage, for example, the wiring VLr and the wiring VL can be combined into one wiring as in the circuit MP in FIG. 10A.

Figure 10B:
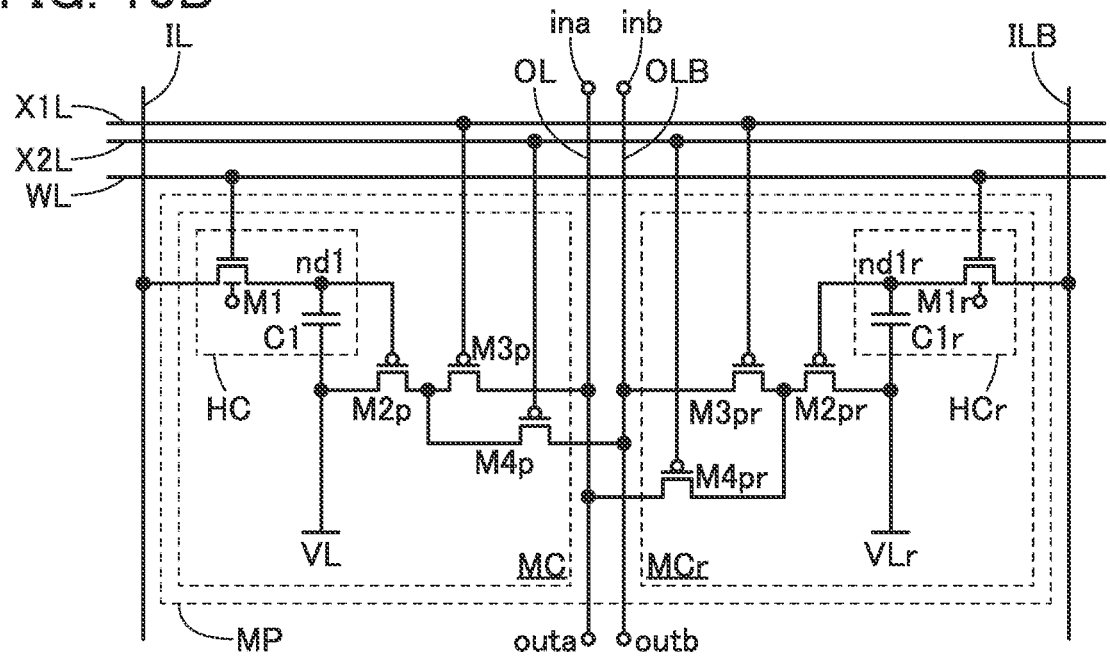

The configuration of the circuit MP in FIG. 9A can be changed according to circumstances. For example, as illustrated in FIG. 10B, the transistor M2, the transistor M2r, the transistor M3, the transistor M3r, the transistor M4, and the transistor M4r of the circuit MP in FIG. 9A are respectively replaced with a transistor M2p, a transistor M2pr, a transistor M3p, a transistor M3pr, a transistor M4p, and a transistor M4pr, which are p-channel transistors. In particular, in the case where the transistor M2 and the transistor M2r are replaced with p-channel transistors, the constant voltage supplied by the wiring VL is preferably a high-level potential VDD. As well as this case, in the case where FIG. 3A to FIG. 3E, FIG. 4A to FIG. 4D, and FIG. 4F are employed for the circuit ACTF[1] to the circuit ACTF[n] of the arithmetic circuit 110, the arithmetic circuit 120, and the arithmetic circuit 130, the constant voltage supplied by the wiring VAL electrically connected to the circuit ACTF[1] to the circuit ACTF[n] is preferably a ground potential or VSS. When the potential of the wiring is changed as described above, the direction in which a current flows is also changed.

Similarly, the transistor M1 may also be replaced with a p-channel transistor. In FIG. 10B, although the transistor M2, the transistor M2r, the transistor M3, the transistor M3r, the transistor M4, and the transistor M4r of the circuit MP in FIG. 9A are respectively replaced with the transistor M2p, the transistor M2pr, the transistor M3p, the transistor M3pr, the transistor M4p, and the transistor M4pr, which are p-channel transistors, one or more transistors selected from the transistor M2, the transistor M2r, the transistor M3, the transistor M3r, the transistor M4, and the transistor M4r of the circuit MP in FIG. 9A may be replaced with p-channel transistors.

Figure 11A:
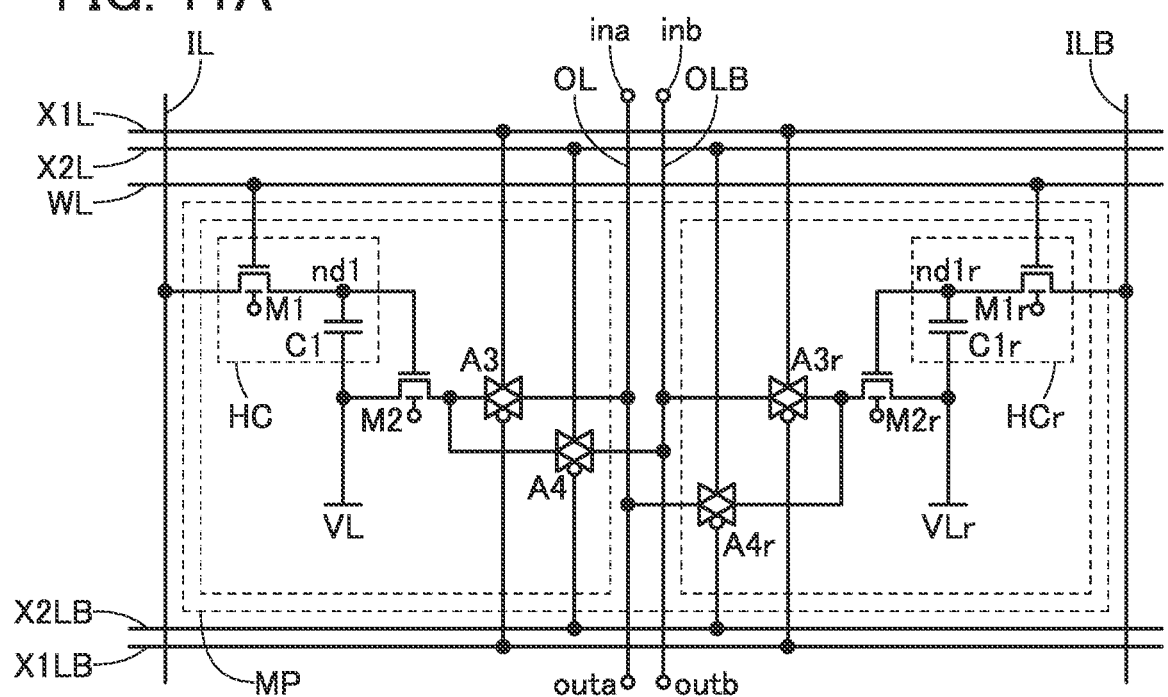
FIG. 11A and FIG. 11B are circuit diagrams showing configuration examples of a circuit included in a semiconductor device.
Figure 11B:
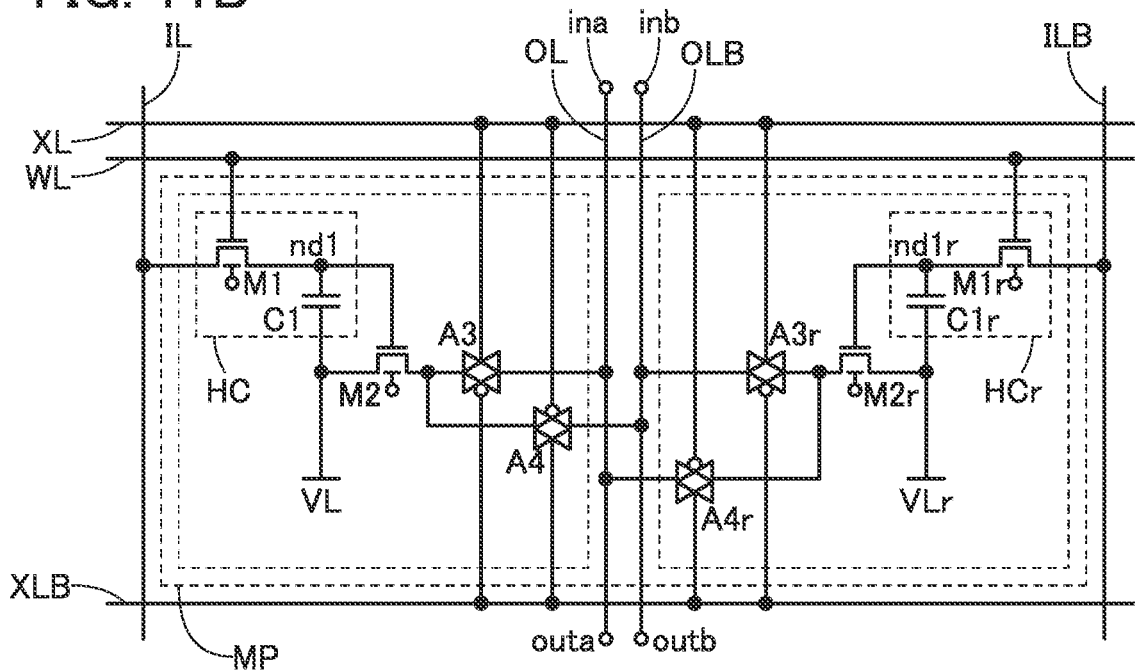

Alternatively, as illustrated in FIG. 11A, the transistors M3 and M3r, the transistor M4, and the transistor M4r of the circuit MP in FIG. 9A may be replaced with an analog switch A3, an analog switch A4, an analog switch A3r, and an analog switch A4r, for example. FIG. 11A also illustrates a wiring X1LB and a wiring X2LB for driving the analog switch A3, the analog switch A4, the analog switch A3r, and the analog switch A4r. The wiring X1LB is electrically connected to the analog switch A3 and the analog switch A3r, and the wiring X2LB is electrically connected to the analog switch A4 and the analog switch A4r. An inverted signal of a signal input to the wiring X1L is input to the wiring X1LB, and an inverted signal of a signal input to the wiring X2L is input to the wiring X2LB. Alternatively, as illustrated in FIG. 11B, the wiring X1L and the wiring X2L may be combined into a wiring XL, and the wiring X1LB and the wiring X2LB may be combined into a wiring XLB. Note that for example, a CMOS structure in which an n-channel transistor and a p-channel transistor are used may be employed for the analog switch A3, the analog switch A4, the analog switch A3r, and the analog switch A4r.

Figure 12A:
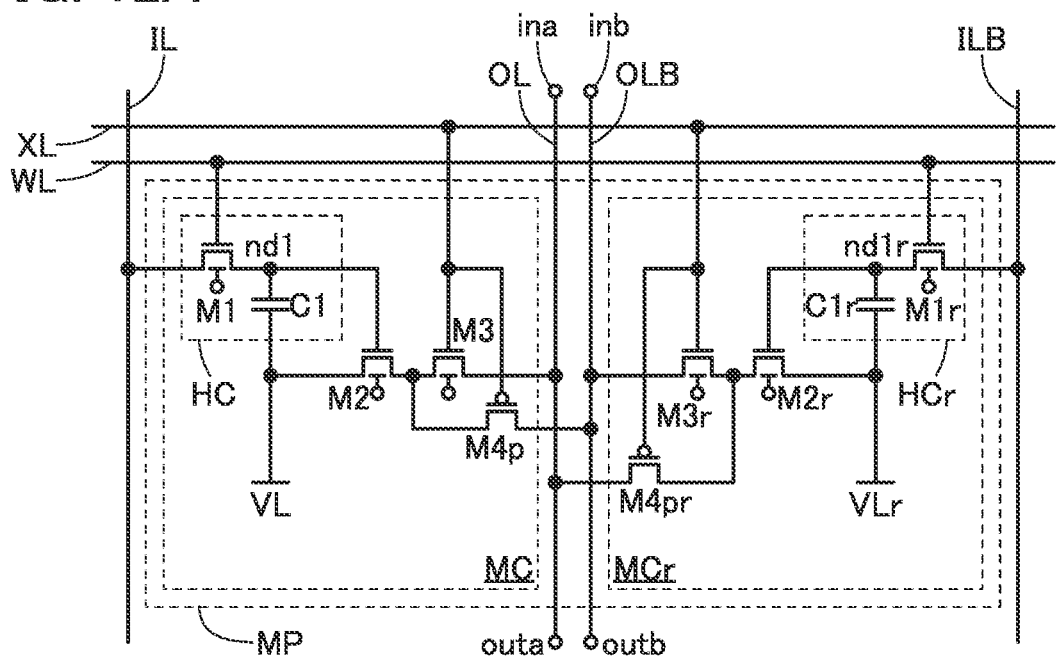
FIG. 12A and FIG. 12B are circuit diagrams showing configuration examples of a circuit included in a semiconductor device.

Alternatively, as illustrated in FIG. 12A, the transistor M4 and the transistor M4r of the circuit MP in FIG. 9A may be replaced with the transistor M4p and the transistor M4pr, which are p-channel transistors, for example. In the circuit MP in FIG. 12A, the gate of the transistor M3 is electrically connected to a gate of the transistor M4p and the wiring XL. The wiring XL corresponds to one wiring obtained by combining the wiring X1L and the wiring X2L in FIG. 9A. The polarities of the transistor M3 and the transistor M4p are different from each other, and the gates of the transistor M3 and the transistor M4p are electrically connected to the wiring XL. Thus, a predetermined potential is supplied to the wiring XL, whereby one of the transistor M3 and the transistor M4p can be brought into an on state and the other of the transistor M3 and the transistor M4p can be brought into an off state.

Figure 12B:
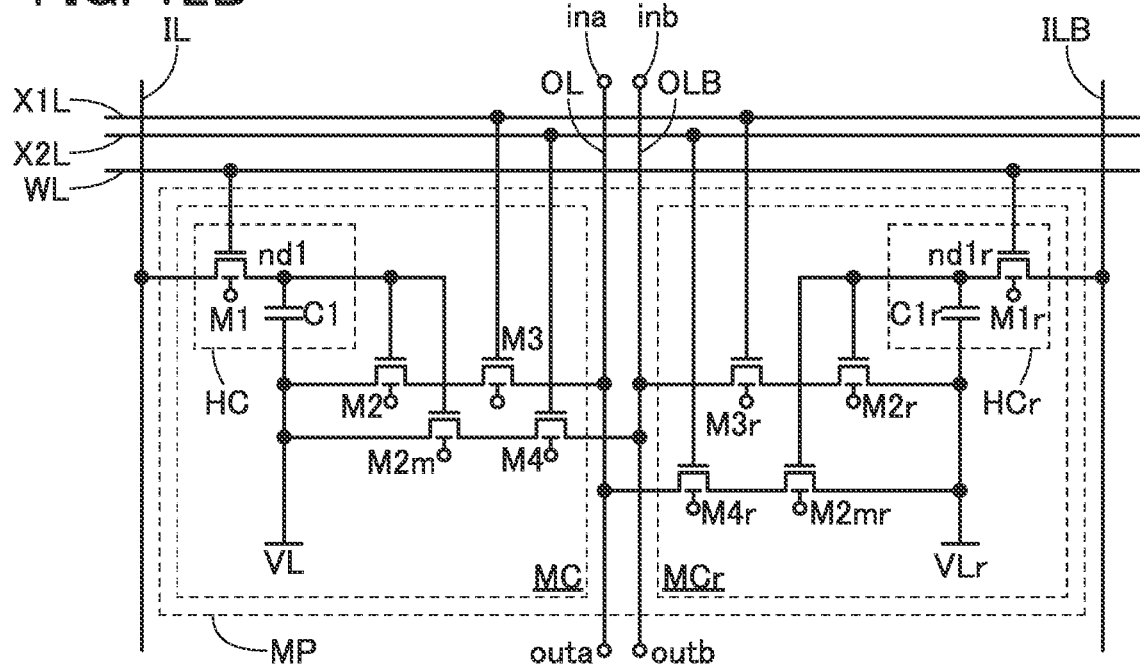

Alternatively, as illustrated in FIG. 12B, a transistor M2m and a transistor M2mr may be added to the circuit MP in FIG. 9A and the electrical connection destination of the first terminal of the transistor M4 and a first terminal of the transistor M4r may be changed, for example. In the circuit MP in FIG. 12B, a first terminal of the transistor M2m is electrically connected to the second terminal of the capacitor C1, the first terminal of the transistor M2, and the wiring VL, and a second terminal of the transistor M2m is electrically connected to the first terminal of the transistor M4. Note that although the second terminal of the transistor M2 is electrically connected to the first terminal of the transistor M4 in the circuit MP in FIG. 9A, the second terminal of the transistor M2 is not electrically connected to the first terminal of the transistor M4 in the circuit MP in FIG. 12B. In the circuit MP illustrated in FIG. 12B, currents flowing through the transistors M3 and M4 are determined in accordance with the potentials of the gate of the transistor M2 and a gate of the transistor M2m. The sizes, e.g., the channel lengths or the channel widths of the transistor M2 and the transistor M2m are preferably equal to each other, for example. With such a circuit configuration, efficient layout may be possible. In addition, currents flowing through the transistor M3 and the transistor M4 can possibly be equal to each other.

<<Operation Example>>

Next, an operation example of the circuit MP illustrated in FIG. 9A is described.

FIG. 13A to FIG. 13C, FIG. 14A to FIG. 14C, and FIG. 15A to FIG. 15C are each a timing chart showing an operation example of the circuit MP, and shows changes in the potentials of the wiring IL, the wiring ILB, the wiring WL, the wiring X1L, the wiring X2L, the node nd1, and the node nd1r. Note that "high" described in FIG. 13A to FIG. 13C, FIG. 14A to FIG. 14C, and FIG. 15A to FIG. 15C indicates a high-level potential, and "low" indicates a low-level potential. The amount of current output from the wiring OL to the node outa (or from the node outa to the wiring OL) is IOL. The amount of current output from the wiring OLB to the node outb (or from the node outb to the wiring OLB) is IOLB. In the timing chart illustrated in FIG. 13A to FIG. 13C, FIG. 14A to FIG. 14C, and FIG. 15A to FIG. 15C, the amount of change in the amounts of current IOL and IOLB are also illustrated.

In this operation example, the constant voltage supplied by each of the wiring VL and the wiring VLr is VSS (a low-level potential). In this case, a current flows from the wiring VAL to the wiring VL through the wiring OL. Similarly, a current flows from the wiring VAL to the wiring VLr through the wiring OLB.

In this specification and the like, terms "low-level potential" and "high-level potential" do not represent specified potentials, and specific potentials may vary depending on wirings. For example, a low-level potential and a high-level potential held at the node nd1 and the node nd1r may be potentials different from a low-level potential and a high-level potential applied to the wiring X1L and the wiring X2L.

Before the description of the operation example, a weight coefficient held in the circuit MP is defined as follows. When a high-level potential is held at the node nd1 of the holding portion HC and a low-level potential is held at the node nd1r of the holding portion HCr, the circuit MP holds "+1" as a weight coefficient. When a low-level potential is held at the node nd1 of the holding portion HC and a high-level potential is held at the node nd1r of the holding portion HCr, the circuit MP holds "−1" as a weight coefficient. When a low-level potential is held at the node nd1 of the holding portion HC and a low-level potential is held at the node nd1r of the holding portion HCr, the circuit MP holds "0" as a weight coefficient. Note that the high-level potential held at the nodes nd1 and nd1r can be, for example, VDD or a potential slightly lower than VDD, and the low-level potential held at the nodes nd1 and nd1r can be, for example, VSS. Note that the weight coefficient can also be an analog value. In this case, for example, when the weight coefficient is a "positive analog value", a high-level analog potential is held at the node nd1 of the holding portion HC and a low-level potential is held at the node nd1r of the holding portion HCr. In the case where the weight coefficient is a "negative analog value", a low-level potential is held at the node nd1 of the holding portion HC and a high-level analog potential is held at the node nd1r of the holding portion HCr, for example. In the case where the weight coefficient is "0", a low-level potential is held at the node nd1 of the holding portion HC and a low-level potential is held at the node nd1r of the holding portion HCr, for example.

A signal of a neuron (an arithmetic value) input to the circuit MP is defined as follows, for example. When a high-level potential is applied to the wiring X1L and a low-level potential is applied to the wiring X2L, "+1" is input to the circuit MP as a signal of a neuron. When a low-level potential is applied to the wiring X1L and a high-level potential is applied to the wiring X2L, "−1" is input to the circuit MP as a signal of a neuron. When a low-level potential is applied to the wiring X1L and a low-level potential is applied to the wiring X2L, "0" is input to the circuit MP as a signal of a neuron.

In this specification and the like, unless otherwise specified, the transistor M2 and the transistor M2r in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. The transistors M2 and M2r may operate in a linear region so that the amplitude value of a voltage to be supplied is decreased. Note that in the case where a weight coefficient is an analog value, for example, the transistors M2 and M2r may operate in a linear region and operate in a saturation region in accordance with the magnitude of the weight coefficient.

In this specification and the like, unless otherwise specified, the transistor M1, the transistor M3, the transistor M4, the transistor M1r, the transistor M3r, and the transistor M4r in an on state may operate in a linear region in the end. In other words, the gate voltage, the source voltage, and the drain voltage of each of the above transistors may be appropriately biased to voltages in the range where the transistor operates in the linear region.

Hereinafter, operation examples of the circuit MP for combinations of values that a weight coefficient and a signal of a neuron may have are described.

[Condition 1]

First, for example, the case where the weight coefficient w is "0" and a signal of a neuron (an arithmetic value) input to the circuit MP is "+1" is considered. FIG. 13A is a timing chart of the circuit MP in this case.

From Time T1 to Time T2, an initialization potential $V_{ini}$ for initializing the potential of the node nd1 of the holding portion HC and the potential of the node nd1r of the holding portion HCr is input to each of the wiring IL and the wiring ILB. Although $V_{ini}$ is illustrated as a potential higher than a low-level potential and lower than a high-level potential in FIG. 13A, $V_{ini}$ may be set to a potential lower than the low-level potential or a potential higher than the high-level potential. Alternatively, $V_{ini}$ may be set to a potential equal to the low-level potential or a potential equal to the high-level potential. The initialization potentials $V_{ini}$ supplied to the wiring IL and the wiring ILB may be potentials different from each other. Note that the initialization potential $V_{ini}$ is not necessarily input to each of the wiring IL and the wiring ILB. That is, the period between Time T1 and Time T2 is not necessarily provided.

From Time T1 to Time T2, a low-level potential is input to the wiring WL. Thus, the transistor M1 and the transistor M1r are in an off state.

From Time T1 to Time T2, the potentials of the node nd1 and the node nd1r are not particularly determined. In FIG. 13A, the potentials of the node nd1 and the node nd1r are potentials higher than a low-level potential and lower than $V_{ini}$.

A low-level potential is input to each of the wiring X1L and the wiring X2L. Thus, the transistor M3, the transistor M4, the transistor M3r, and the transistor M4r are in an off state.

Next, from Time T2 to Time T3, a high-level potential is input to the wiring WL. Accordingly, the transistor M1 and the transistor M1r are brought into an on state, electrical continuity is established between the wiring IL and the node nd1, and electrical continuity is established between the wiring ILB and the node nd1r. Thus, the potentials of the node nd1 and the node nd1r each become $V_{ini}$. Note that each of the potentials of the node nd1 and the node nd1r is not necessarily the initial potential $V_{ini}$. That is, the period between Time T2 and Time T3 is not necessarily provided.

From Time T3 to Time T4, a low-level potential is applied to each of the wiring IL and the wiring ILB and "0" is input as the weight coefficient w. Since a high-level potential is continuously input to the wiring WL before Time T3 and "0" is input as the weight coefficient w, the transistor M1 and the transistor M1r are in an on state. Thus, the potentials of the node nd1 and the node nd1r each become a low-level potential.

From Time T4 to Time T5, a low-level potential is input to the wiring WL. Accordingly, the transistor M1 and the transistor Mir are brought into an off state, and the potentials of the node nd1 and the node nd1r are held by the capacitor C1 and the capacitor C1r, respectively.

By the operation from Time T1 to Time T5, "0" is set to the weight coefficient of the circuit MP.

By the above operations, the potentials of the gate of the transistor M2 and a gate of the transistor M2r each become a low-level potential and the potentials of the first terminal of the transistor M2 and a first terminal of the transistor M2r are VSS, so that the transistor M2 and the transistor M2r are brought into an off state.

From Time T5 to Time T6, for example, the initialization potential $V_{ini}$ is input to the wiring IL and the wiring ILB. Note that since this operation is not particularly necessary operation, the initialization potential $V_{ini}$ is not necessarily input to the wiring IL and the wiring ILB. That is, the period between Time T5 and Time T6 is not necessarily provided. In addition, different potentials may be input to the wiring IL and the wiring ILB.

After Time T6, as a signal "+1" of a neuron input to the circuit MP, a high-level potential and a low-level potential are input to the wiring X1L and the wiring X2L, respectively. Accordingly, the transistor M3 and the transistor M3r are brought into an on state and the transistor M4 and the transistor M4r are brought into an off state. That is, by this operation, electrical continuity is established between the circuit MC and the wiring OL and electrical continuity is established between the circuit MCr and the wiring OLB.

At this time, in the circuit MC, the transistor M2 is in an off state; thus, a current does not flow between the wiring OL and the wiring VL. In other words, the current IOL output from the node outa of the wiring OL does not change before and after Time T6. Similarly, in the circuit MCr, the transistor M2r is in an off state; thus, a current does not flow between the wiring OLB and the wiring VLr. In other words, the current IOLB output from the node outb of the wiring OLB also does not change before and after Time T6.

Since the weight coefficient is "0" and the signal of a neuron input to the circuit MP is "+1" in this condition, the product of the weight coefficient and the signal of a neuron is "0" with the use of Formula (1.1). The result that the product of the weight coefficient and the signal of a neuron is "0" corresponds to the case where the current $I_{OL}$ and the current $I_{OLB}$ do not change after Time T6 in the operation of the circuit MP.

Note that a plurality of product-sum operations may be performed by the following manner: the weight coefficient w is input once, its value is not updated, and only an arithmetic value is changed. In this case, since the update of the weight coefficient w is unnecessary, power consumption can be reduced. In order to reduce the frequency of the update of the weight coefficient w, the weight coefficient w needs to be held for a long period. In this case, when an OS transistor is used, for example, the weight coefficient w can be held for a long period by utilizing a low off-state current.

[Condition 2]

Next, for example, the case where the weight coefficient w is "+1" and a signal of a neuron (an arithmetic value) input to the circuit MP is "+1" is considered. FIG. 13B is a timing chart of the circuit MP in this case.

Since operation from Time T1 to Time T3 is similar to the operation from Time T1 to Time T3 in Condition 1, the description of the operation from Time T1 to Time T3 in Condition 1 is referred to.

From Time T3 to Time T4, a high-level potential is applied to the wiring IL, a low-level potential is applied to the wiring ILB, and "1" is input as the weight coefficient w. Since a high-level potential is continuously input to the wiring WL before Time T3 and "1" is input as the weight coefficient w, the transistor M1 and the transistor Mir are in an on state. Thus, the potential of the node nd1 becomes a high-level potential and the potential of the node nd1r becomes a low-level potential.

From Time T4 to Time T5, a low-level potential is input to the wiring WL. Accordingly, the transistor M1 and the transistor Mir are brought into an off state, and the potentials of the node nd1 and the node nd1r are held by the capacitor C1 and the capacitor C1r, respectively.

By the operation from Time T1 to Time T5, "+1" is set to the weight coefficient of the circuit MP.

By the above operations, the potentials of the gate of the transistor M2 becomes a high-level potential and the gate of the transistor M2r becomes a low-level potential, and the potentials of the first terminals of the transistor M2 and the transistor M2r are VSS, so that the transistor M2 is brought into an on state and the transistor M2r is brought into an off state.

Since operation from Time T5 to Time T6 is similar to the operation from Time T5 to Time T6 in Condition 1, the description of the operation from Time T5 to Time T6 in Condition 1 is referred to.

After Time T6, as a signal "+1" of a neuron input to the circuit MP, a high-level potential and a low-level potential are input to the wiring X1L and the wiring X2L, respectively. Accordingly, the transistor M3 and the transistor M3r are brought into an on state and the transistor M4 and the transistor M4r are brought into an off state. That is, by this operation, electrical continuity is established between the circuit MC and the wiring OL and electrical continuity is established between the circuit MCr and the wiring OLB.

At this time, in the circuit MC, the transistor M2 is in an on state; thus, a current flows between the wiring OL and the wiring VL. In other words, the current $I_{OL}$ output from the node outa of the wiring OL increases after Time T6 (the amount of the increase in the current $I_{OL}$ is denoted as ΔI in FIG. 13B). In contrast, in the circuit MCr, the transistor M2r is in an off state; thus, a current does not flow between the wiring OLB and the wiring VLr. In other words, the current $I_{OLB}$ output from the node outb of the wiring OLB does not change before and after Time T6.

Since the weight coefficient w is "+1" and the signal of a neuron (an arithmetic value) input to the circuit MP is "+1" in this condition, the product of the weight coefficient and the signal of a neuron is "+1" with the use of Formula (1.1). The result that the product of the weight coefficient and the signal of a neuron is "1" corresponds to the case where the current $I_{OL}$ changes and the current $I_{OLB}$ does not change after Time T6 in the operation of the circuit MP.

[Condition 3]

Next, for example, the case where the weight coefficient w is "−1" and a signal of a neuron (an arithmetic value) input to the circuit MP is "+1" is considered. FIG. 13C is a timing chart of the circuit MP in this case.

Since operation from Time T1 to Time T3 is similar to the operation from Time T1 to Time T3 in Condition 1, the description of the operation from Time T1 to Time T3 in Condition 1 is referred to.

From Time T3 to Time T4, a low-level potential is applied to the wiring IL, a high-level potential is applied to the wiring ILB, and "−1" is input as the weight coefficient w. Since a high-level potential is continuously input to the wiring WL before Time T3, the transistor M1 and the transistor M1r are in an on state. Thus, "−1" is input as the weight coefficient w, so that the potential of the node nd1 becomes a low-level potential and the potential of the node nd1r becomes a high-level potential.

From Time T4 to Time T5, a low-level potential is input to the wiring WL. Accordingly, the transistor M1 and the transistor M1r are brought into an off state, and the potentials of the node nd1 and the node nd1r are held by the capacitor C1 and the capacitor C1r, respectively.

By the operation from Time T1 to Time T5, "−1" is set to the weight coefficient of the circuit MP.

By the above operations, the potentials of the gate of the transistor M2 becomes a low-level potential and the gate of the transistor M2r becomes a high-level potential, and the potentials of the first terminals of the transistors M2 and M2r are VSS, so that the transistor M2 is brought into an off state and the transistor M2r is brought into an on state.

Since operation from Time T5 to Time T6 is similar to the operation from Time T5 to Time T6 in Condition 1, the description of the operation from Time T5 to Time T6 in Condition 1 is referred to.

After Time T6, as a signal "+1" of a neuron input to the circuit MP, a high-level potential and a low-level potential are input to the wiring X1L and the wiring X2L, respectively. Accordingly, the transistor M3 and the transistor M3r are brought into an on state and the transistor M4 and the transistor M4r are brought into an off state. That is, by this operation, electrical continuity is established between the circuit MC and the wiring OL and electrical continuity is established between the circuit MCr and the wiring OLB.

At this time, in the circuit MC, the transistor M2 is in an off state; thus, a current does not flow between the wiring OL and the wiring VL. In other words, the current $I_{OL}$ output from the node outa of the wiring OL does not change before and after Time T6. In contrast, in the circuit MCr, the transistor M2r is in an on state; thus, a current flows between the wiring OLB and the wiring VLr. In other words, the current $I_{OLB}$ output from the node outb of the wiring OLB increases after Time T6 (the amount of the increase in the current $I_{OLB}$ is denoted as ΔI in FIG. 13C).

Since the weight coefficient w is "−1" and the signal of a neuron (an arithmetic value) input to the circuit MP is "+1" in this condition, the product of the weight coefficient and the signal of a neuron is "−1" with the use of Formula (1.1). The result that the product of the weight coefficient and the signal of a neuron is "−1" corresponds to the case where the current $I_{OL}$ does not change and the current $I_{OLB}$ changes after Time T6 in the operation of the circuit MP.

[Condition 4]

In this condition, for example, the operation of the circuit MP in the case where the weight coefficient w is "0" and a signal of a neuron (an arithmetic value) input to the circuit MP is "−1" is considered. FIG. 14A is a timing chart of the circuit MP in this case.

Since operation from Time T1 to Time T6 is similar to the operation from Time T1 to Time T6 in Condition 1, the description of the operation from Time T1 to Time T6 in Condition 1 is referred to.

After Time T6, as a signal "−1" of a neuron (an arithmetic value) input to the circuit MP, a low-level potential and a high-level potential are input to the wiring X1L and the wiring X2L, respectively. Accordingly, the transistor M3 and the transistor M3r are brought into an off state and the transistor M4 and the transistor M4r are brought into an on state. That is, by this operation, electrical continuity is established between the circuit MC and the wiring OLB and electrical continuity is established between the circuit MCr and the wiring OL.

At this time, in the circuit MC, the transistor M2 is in an off state; thus, a current does not flow between the wiring OLB and the wiring VL. In other words, the current $I_{OLB}$ output from the node outb of the wiring OLB does not change before and after Time T6. Similarly, in the circuit MCr, the transistor M2r is in an off state; thus, a current does not flow between the wiring OL and the wiring VLr. In other words, the current $I_{OL}$ output from the node outa of the wiring OL also does not change before and after Time T6.

Since the weight coefficient w is "0" and the signal of a neuron (an arithmetic value) input to the circuit MP is "−1" in this condition, the product of the weight coefficient and the signal of a neuron is "0" with the use of Formula (1.1). The result that the product of the weight coefficient and the signal of a neuron is "0" corresponds to the case where the current $I_{OL}$ and the current $I_{OLB}$ do not change after Time T6 in the operation of the circuit MP, which agrees with the result of the circuit operation in Condition 1.

[Condition 5]

In this condition, for example, the operation of the circuit MP in the case where the weight coefficient w is "+1" and a signal of a neuron (an arithmetic value) input to the circuit MP is "−1" is considered. FIG. 14B is a timing chart of the circuit MP in this case.

Since operation from Time T1 to Time T6 is similar to the operation from Time T1 to Time T6 in Condition 2, the description of the operation from Time T1 to Time T6 in Condition 2 is referred to.

After Time T6, as a signal "−1" of a neuron (an arithmetic value) input to the circuit MP, a low-level potential and a high-level potential are input to the wiring X1L and the wiring X2L, respectively. Accordingly, the transistor M3 and the transistor M3r are brought into an off state and the transistor M4 and the transistor M4r are brought into an on state. That is, by this operation, electrical continuity is established between the circuit MC and the wiring OLB and electrical continuity is established between the circuit MCr and the wiring OL.

At this time, in the circuit MC, the transistor M2 is in an on state; thus, a current flows between the wiring OLB and the wiring VL. In other words, the current $I_{OLB}$ output from the node outb of the wiring OLB increases after Time T6 (the amount of the increase in the current $I_{OLB}$ is denoted as ΔI in FIG. 14B). In contrast, in the circuit MCr, the transistor M2r is in an off state; thus, a current does not flow between the wiring OL and the wiring VLr. In other words, the current $I_{OL}$ output from the node outa of the wiring OL does not change before and after Time T6.

Since the weight coefficient w is "+1" and the signal of a neuron (an arithmetic value) input to the circuit MP is "−1" in this condition, the product of the weight coefficient and the signal of a neuron is "−1" with the use of Formula (1.1). The result that the product of the weight coefficient and the signal of a neuron is "−1" corresponds to the case where the current $I_{OL}$ does not change and the current $I_{OLB}$ changes after Time T6 in the operation of the circuit MP, which agrees with the result of the circuit operation in Condition 3.

[Condition 6]

In this condition, for example, the operation of the circuit MP in the case where the weight coefficient w is "−1" and a signal of a neuron (an arithmetic value) input to the circuit MP is "−1" is considered. FIG. 14C is a timing chart of the circuit MP in this case.

Since operation from Time T1 to Time T6 is similar to the operation from Time T1 to Time T6 in Condition 3, the description of the operation from Time T1 to Time T6 in Condition 3 is referred to.

After Time T6, as a signal "−1" of a neuron (an arithmetic value) input to the circuit MP, a low-level potential and a high-level potential are input to the wiring X1L and the wiring X2L, respectively. Accordingly, the transistor M3 and the transistor M3r are brought into an off state and the transistor M4 and the transistor M4r are brought into an on state. That is, by this operation, electrical continuity is established between the circuit MC and the wiring OLB and electrical continuity is established between the circuit MCr and the wiring OL.

At this time, in the circuit MC, the transistor M2 is in an off state; thus, a current does not flow between the wiring OLB and the wiring VL. In other words, the current $I_{OLB}$ output from the node outb of the wiring OLB does not change before and after Time T6. In contrast, in the circuit MCr, the transistor M2r is in an on state; thus, a current flows between the wiring OL and the wiring VLr. In other words, the current $I_{OL}$ output from the node outa of the wiring OL increases after Time T6 (the amount of the increase in the current $I_{OL}$ is denoted as ΔI in FIG. 14C).

Since the weight coefficient w is "−1" and the signal of a neuron (an arithmetic value) input to the circuit MP is "−1" in this condition, the product of the weight coefficient and the signal of a neuron is "+1" with the use of Formula (1.1). The result that the product of the weight coefficient and the signal of a neuron is "+1" corresponds to the case where the current $I_{OL}$ changes and the current $I_{OLB}$ does not change after Time T6 in the operation of the circuit MP, which agrees with the result of the circuit operation in Condition 2.

[Condition 7]

Figure 15A:
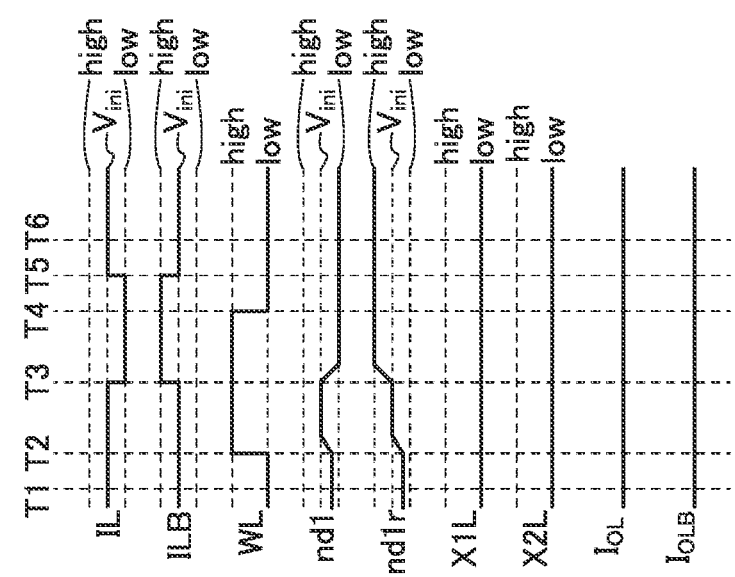
FIG. 15A, FIG. 15B, and FIG. 15C are timing charts showing operation examples of a circuit included in a semiconductor device.

In this condition, for example, the operation of the circuit MP is considered while the case where the weight coefficient w is "0" and a signal of a neuron (an arithmetic value) input to the circuit MP is "0" is regarded as Condition 7. FIG. 15A is a timing chart of the circuit MP in this case.

Since operation from Time T1 to Time T6 is similar to the operation from Time T1 to Time T6 in Condition 1, the description of the operation from Time T1 to Time T6 in Condition 1 is referred to.

After Time T6, as a signal "0" of a neuron (an arithmetic value) input to the circuit MP, a low-level potential and a low-level potential are input to the wiring X1L and the wiring X2L, respectively. Accordingly, the transistor M3, the transistor M3r, the transistor M4, and the transistor M4r are brought into an off state. That is, by this operation, electrical continuity is broken between each of the circuit MC and the circuit MCr and both of the wiring OL and the wiring OLB.

Thus, in the circuit MC, a current does not flow between the wiring OL and one of the wiring VL and the wiring VLr. In other words, the current $I_{OLB}$ output from the node outb of the wiring OLB does not change before and after Time T6. Similarly, in the circuit MCr, a current does not flow between the wiring OLB and the other of the wiring VL and the wiring VLr. In other words, the current $I_{OL}$ output from the node outa of the wiring OL also does not change before and after Time T6.

Since the weight coefficient w is "0" and the signal of a neuron (an arithmetic value) input to the circuit MP is "0" in this condition, the product of the weight coefficient and the signal of a neuron is "0" with the use of Formula (1.1). The result that the product of the weight coefficient and the signal of a neuron is "0" corresponds to the case where the current $I_{OL}$ and the current $I_{OLB}$ do not change after Time T6 in the operation of the circuit MP, which agrees with the results of the circuit operations in Condition 1 and Condition 4.

[Condition 8]

Figure 15B:
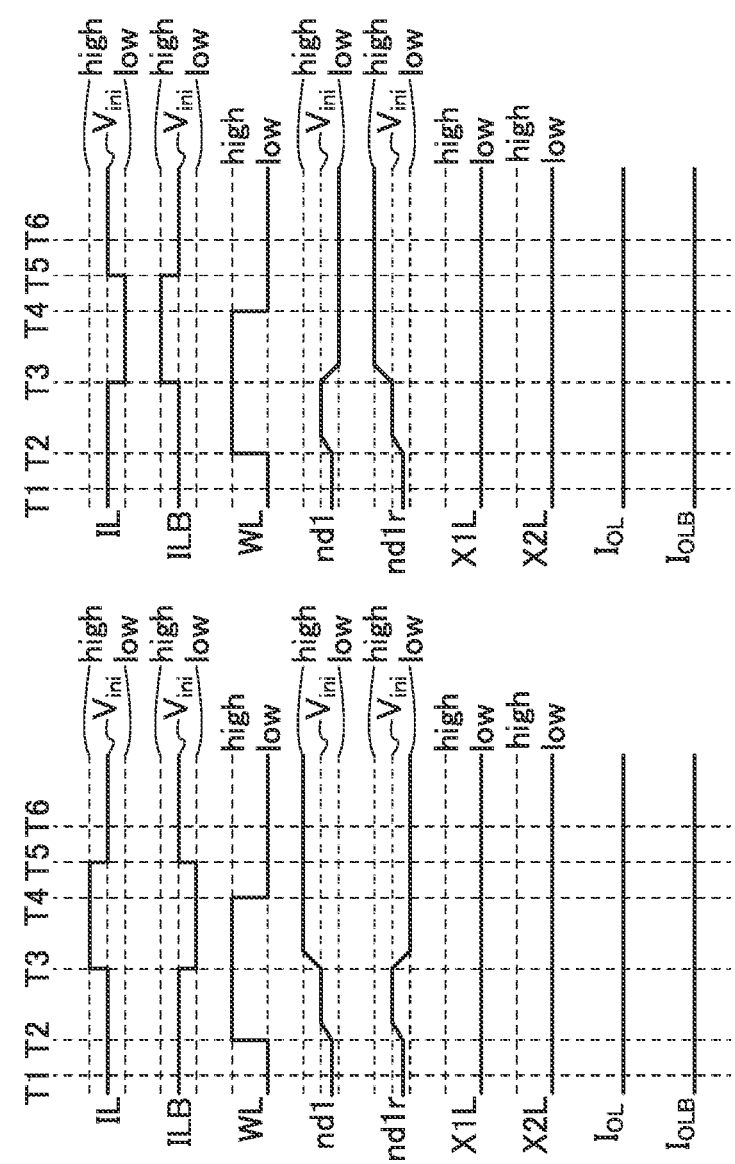

In this condition, for example, the operation of the circuit MP is considered while the case where the weight coefficient w is "+1" and a signal of a neuron (an arithmetic value) input to the circuit MP is "0" is regarded as Condition 8. FIG. 15B is a timing chart of the circuit MP in this case.

Since operation from Time T1 to Time T6 is similar to the operation from Time T1 to Time T6 in Condition 2, the description of the operation from Time T1 to Time T6 in Condition 2 is referred to.

After Time T6, as a signal "0" of a neuron (an arithmetic value) input to the circuit MP, a low-level potential and a low-level potential are input to the wiring X1L and the wiring X2L, respectively. That is, the operation is similar to the operation after Time T6 in Condition 7; thus, by this operation, electrical continuity is broken between the circuit MC and both of the wirings OL and OLB and electrical continuity is broken between the circuit MCr and both of the wiring OL and the wiring OLB. Thus, since a current does not flow between the wiring OL or the wiring OLB and one of the wiring VL and the wiring VLr, the current $I_{OL}$ output from the node outa of the wiring OL and the current $I_{OLB}$ output from the node outb of the wiring OLB do not change before and after Time T6.

Since the weight coefficient w is "+1" and the signal of a neuron (an arithmetic value) input to the circuit MP is "0" in this condition, the product of the weight coefficient and the signal of a neuron is "0" with the use of Formula (1.1). The result that the product of the weight coefficient and the signal of a neuron is "0" corresponds to the case where the current $I_{OL}$ and the current $I_{OLB}$ do not change after Time T6 in the operation of the circuit MP, which agrees with the results of the circuit operations in Condition 1, Condition 4, and Condition 7.

[Condition 9]

Figure 15C:
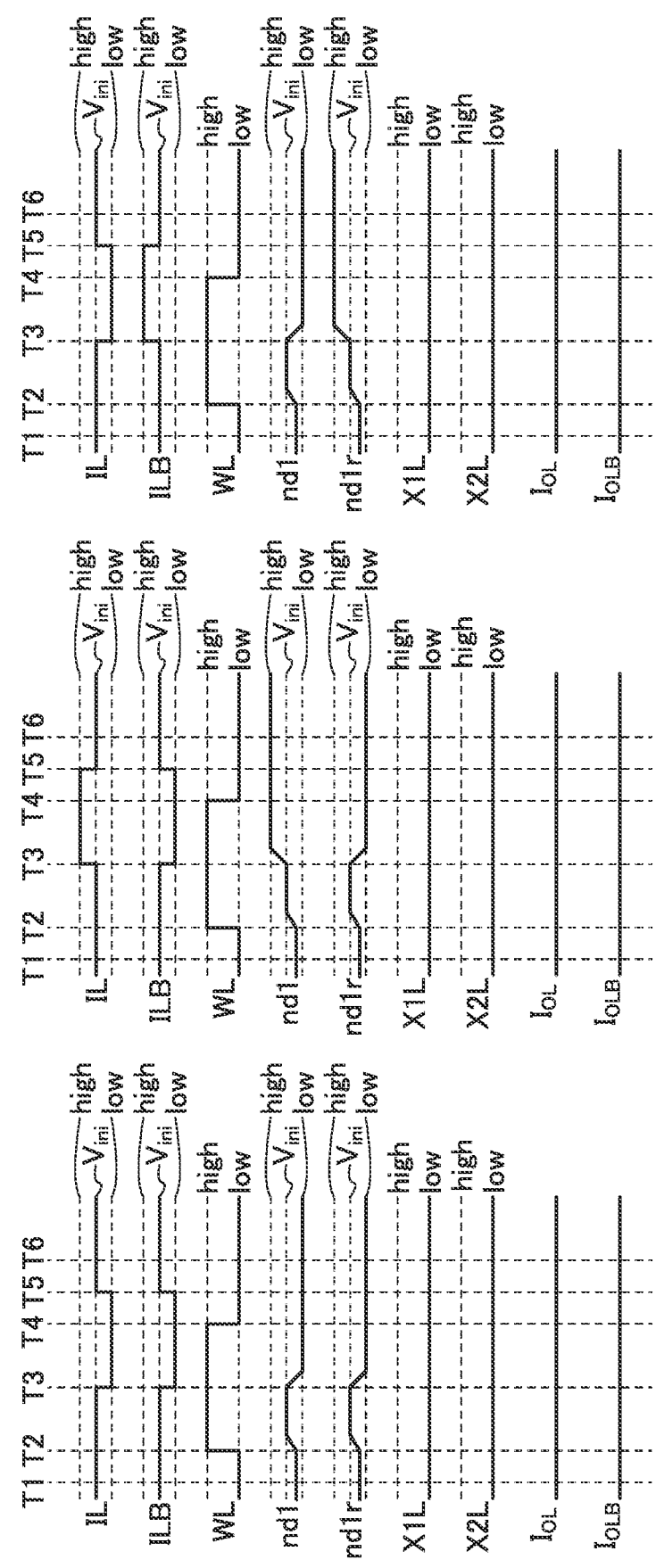

In this condition, for example, the operation of the circuit MP is considered while the case where the weight coefficient w is "−1" and a signal of a neuron (an arithmetic value) input to the circuit MP is "0" is regarded as Condition 9. FIG. 15C is a timing chart of the circuit MP in this case.

Since operation from Time T1 to Time T6 is similar to the operation from Time T1 to Time T6 in Condition 3, the description of the operation from Time T1 to Time T6 in Condition 3 is referred to.

After Time T6, as a signal "0" of a neuron (an arithmetic value) input to the circuit MP, a low-level potential and a low-level potential are input to the wiring X1L and the wiring X2L, respectively. That is, the operation is similar to the operation after Time T6 in Condition 7; thus, by this operation, electrical continuity is broken between the circuit MC and both of the wiring OL and the wiring OLB and electrical continuity is broken between the circuit MCr and both of the wiring OL and the wiring OLB. Thus, since a current does not flow between the wiring OL or the wiring OLB and one of the wiring VL and the wiring VLr, the current $I_{OL}$ output from the node outa of the wiring OL and the current $I_{OLB}$ output from the node outb of the wiring OLB do not change before and after Time T6.

Since the weight coefficient w is "−1" and the signal of a neuron (an arithmetic value) input to the circuit MP is "0" in this condition, the product of the weight coefficient and the signal of a neuron is "0" with the use of Formula (1.1). The result that the product of the weight coefficient and the signal of a neuron is "0" corresponds to the case where the current $I_{OL}$ and the current $I_{OLB}$ do not change after Time T6 in the operation of the circuit MP, which agrees with the results of the circuit operations in Condition 1, Condition 4, Condition 7, and Condition 8.

The results of the operation examples in Condition 1 to Condition 9 described above are listed in the following table. Note that in the following table, a high-level potential is denoted by "high", and a low-level potential is denoted by "low".

TABLE 2

| Condition | Weight coefficient | nd1 | nd1r | Signal | X1L | X2L | Weight coefficient × signal | Change in $I_{OL}$ | Change in $I_{OLB}$ |
|---|---|---|---|---|---|---|---|---|---|
| Condition 1 | 0 | low | low | +1 | high | low | 0 | Not change | Not change |
| Condition 2 | +1 | high | low | +1 | high | low | +1 | Changes | Not change |
| Condition 3 | −1 | low | high | +1 | high | low | −1 | Not change | Changes |
| Condition 4 | 0 | low | low | −1 | low | high | 0 | Not change | Not change |
| Condition 5 | +1 | high | low | −1 | low | high | −1 | Not change | Changes |
| Condition 6 | −1 | low | high | −1 | low | high | +1 | Changes | Not change |
| Condition 7 | 0 | low | low | 0 | low | low | 0 | Not change | Not change |
| Condition 8 | +1 | high | low | 0 | low | low | 0 | Not change | Not change |
| Condition 9 | −1 | low | high | 0 | low | low | 0 | Not change | Not change |

Here, the case where one circuit MC and one circuit MCr are connected to the wiring OL and the wiring OLB is illustrated as an example. In the case where a plurality of circuits MC and a plurality of circuits MCr are connected to the wiring OL and the wiring OLB as illustrated in FIG. 2, FIG. 6, FIG. 7, FIG. 8, and the like, currents output from the circuits MC and the circuits MCr are added according to the Kirchhoff's current law. Consequently, sum operation is performed. In other words, the product operation is performed in the circuit MC and the circuit MCr and the sum operation is performed by adding the currents from the plurality of circuits MC and the plurality of circuits MCr. As a result of the above, product-sum operation processing is performed.

In the operation of the circuit MP, when calculation using a weight coefficient having only two levels "+1" and "−1" and a signal of a neuron having only two levels "+1" and "−1" is performed, the circuit MP can perform operation similar to that of an exclusive NOR circuit (coincidence circuit).

In the operation of the circuit MP, when calculation using a weight coefficient having only two levels "+1" and "0" and a signal of a neuron having only two levels "+1" and "0" is performed, the circuit MP can perform operation similar to that of a logical product circuit.

Although the potentials held in the holding portion HC and the holding portion HCr included in the circuits MC and MCr of the circuit MP are each a high-level potential or a low-level potential in this operation example, a potential showing an analog value may be held in the holding portion HC and the holding portion HCr. For example, in the case where the weight coefficient is a "positive analog value", a high-level analog potential is held at the node nd1 of the holding portion HC and a low-level potential is held at the node nd1r of the holding portion HCr. In the case where the weight coefficient is a "negative analog value", a low-level potential is held at the node nd1 of the holding portion HC and a high-level analog potential is held at the node nd1r of the holding portion HCr, for example. Then, the amount of the current $I_{OL}$ and the current $I_{OLB}$ becomes an amount corresponding to the analog potential. Holding a potential showing an analog value in the holding portions HC and HCr is not limited to the operation example of the circuit MP in FIG. 9A and may be performed in other circuits MP described in this specification and the like.

Configuration Example 2

Next, an example of a circuit configuration that can be applied to the circuits MP illustrated in FIG. 5C and FIG. 5D is described.

Figure 16A:
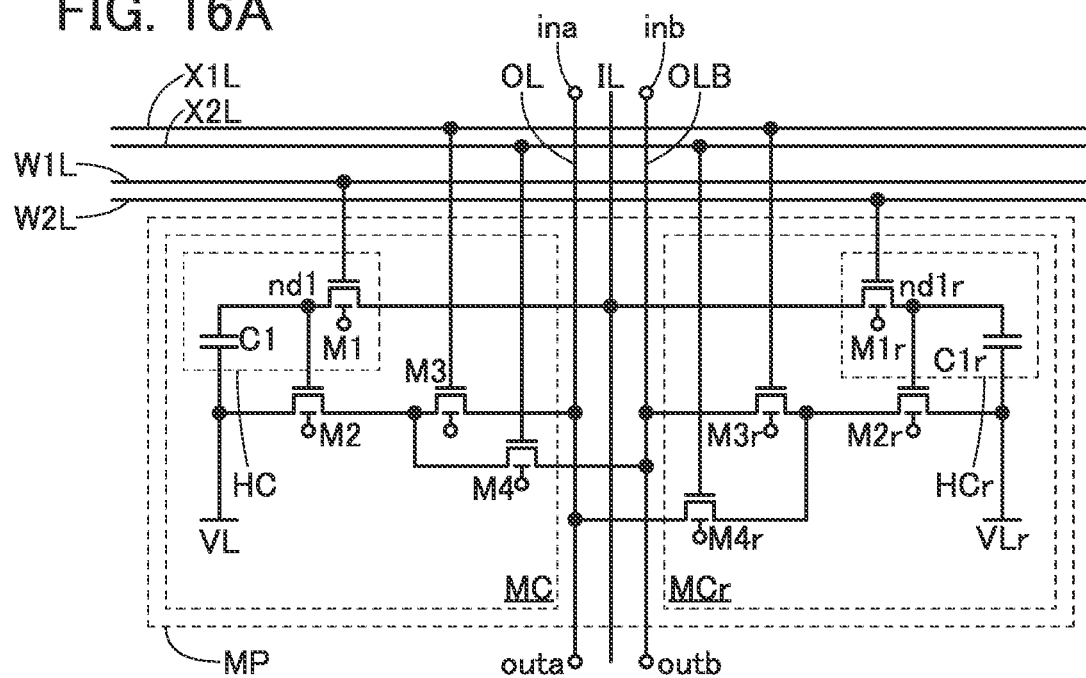
FIG. 16A and FIG. 16B are circuit diagrams showing configuration examples of a circuit included in a semiconductor device.

The circuit MP illustrated in FIG. 16A shows a configuration example of the circuit MP in FIG. 5C and is different from the circuit MP in FIG. 9A in that the wiring IL and the wiring ILB are combined into one wiring and the wiring W1L and the wiring W2L are included as the wiring WL in FIG. 9A.

In the circuit MP in FIG. 16A, the first terminal of the transistor M1 and a first terminal of the transistor M1r are electrically connected to the wiring IL. In addition, the gate of the transistor M1 is electrically connected to the wiring W1L, and a gate of the transistor M1r is electrically connected to the wiring W2L. Note that the description of a portion of the circuit MP in FIG. 16A having a connection structure similar to that of the circuit MP in FIG. 9A is omitted.

When a weight coefficient is set to the circuit MP in FIG. 16A, first, potentials supplied to the wiring W1L and the wiring W2L are changed to bring the transistor M1 into an on state and bring the transistor M1r into an off state, and then a potential to be held in the holding portion HC is supplied from the wiring IL to bring the transistor M1 into an off state. After that, potentials supplied to the wiring W1L and the wiring W2L are changed to bring the transistor M1 into an off state and bring the transistor M1r into an on state, and then a potential to be held in the holding portion HCr is supplied from the wiring IL to bring the transistor M1r into an off state. As described above, in the circuit MP in FIG. 16A, potentials are supplied from the wiring IL to the holding portion HC and the holding portion HCr sequentially, whereby potentials corresponding to the weight coefficient can be held in the holding portion HC and the holding portion HCr.

Figure 16B:
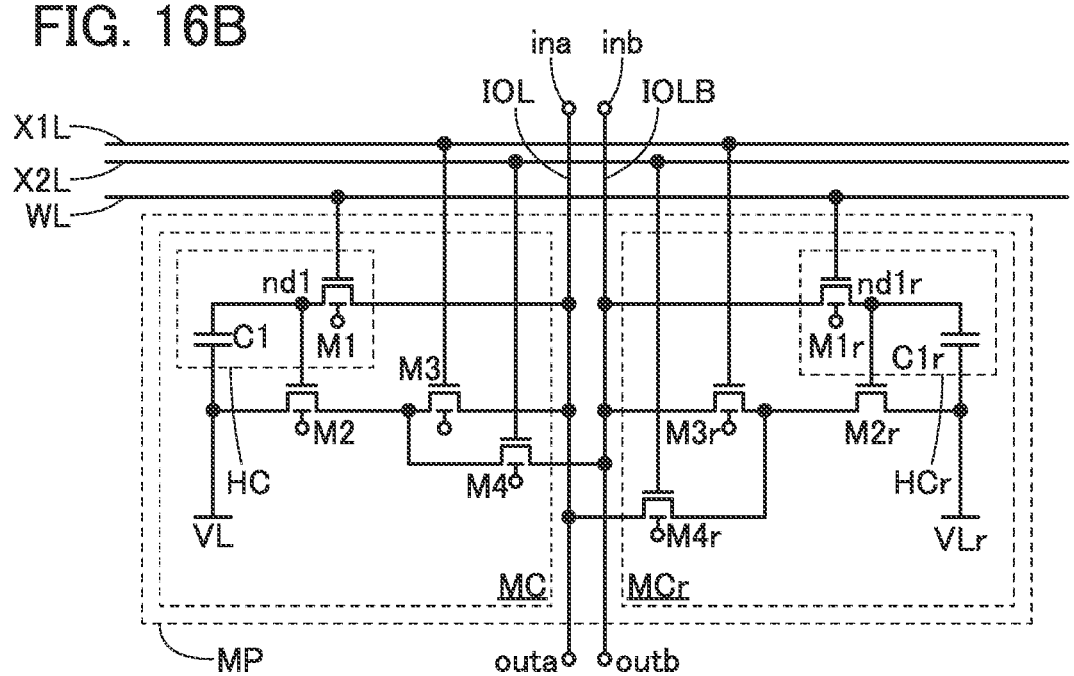

The circuit MP illustrated in FIG. 16B shows a configuration example of the circuit MP in FIG. 5D and is different from the circuit MP in FIG. 9A in that the wiring IL and the wiring OL are combined into the wiring IOL and the wiring ILB and the wiring OLB are combined into the wiring IOLB.

In the circuit MP in FIG. 16B, the first terminal of the transistor M1 is electrically connected to the wiring IOL and the first terminal of the transistor M1r is electrically connected to the wiring IOLB. In addition, the second terminal of the transistor M3 is electrically connected to the wiring IOL, the second terminal of the transistor M4 is electrically connected to the wiring IOLB, the second terminal of the transistor M3r is electrically connected to the wiring IOLB, and the second terminal of the transistor M4r is electrically connected to the wiring IOL. Note that the description of a portion of the circuit MP in FIG. 16B having a connection structure similar to that of the circuit MP in FIG. 9A is omitted.

In the circuit MP in FIG. 16B, the wiring IOL is electrically connected to the holding portion HC, the wiring IOLB is electrically connected to the holding portion HCr, and the gates of the transistor M1 and the transistor M1r are electrically connected to the wiring WL, so that potentials corresponding to the weight coefficient can be written to the holding portion HC and the holding portion HCr concurrently as in the circuit MP in FIG. 9A.

Configuration Example 3

Figure 17:
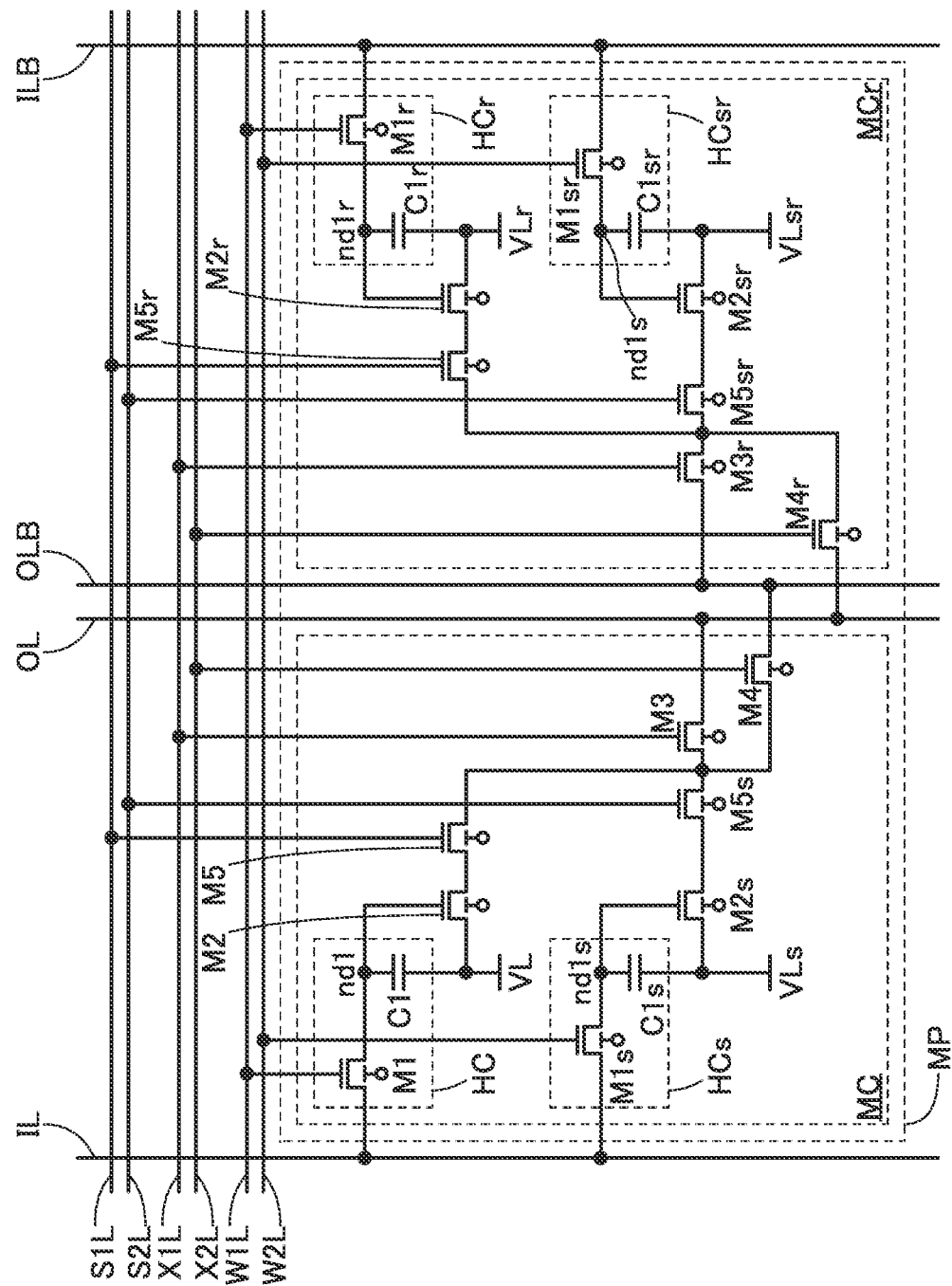
FIG. 17 is a circuit diagram showing a configuration example of a semiconductor device.

Unlike the circuit MP in FIG. 9A, the circuit MP illustrated in FIG. 17 is a circuit including not only the holding portion HC and the holding portion HCr but also a holding portion HCs and a holding portion HCsr.

The circuit MC included in the circuit MP in FIG. 17 includes a transistor M1s, a transistor M2s, a transistor M5, a transistor M5s, and a capacitor C1s in addition to the circuit elements of the circuit MP in FIG. 9A. The circuit MCr included in the circuit MP in FIG. 17 includes circuit elements similar to those of the circuit MC and thus includes a transistor M1sr, a transistor M2sr, a transistor M5r, a transistor M5sr, and a capacitor C1sr corresponding to the transistor M1s, the transistor M2s, the transistor M5, the transistor M5s, and the capacitor C1s of the circuit MC, respectively.

In this specification and the like, unless otherwise specified, the transistor M5, the transistor M5s, the transistor M5r, and the transistor M5sr in an on state may operate in a linear region in the end. In other words, the gate voltage, the source voltage, and the drain voltage of each of the above transistors may be appropriately biased to voltages in the range where the transistor operates in the linear region.

Next, the configuration of the circuit MP in FIG. 17 is described. Note that the description of a portion of the circuit MP in FIG. 17 having a configuration similar to that of the circuit MP in FIG. 9A is omitted.

The gate of the transistor M1 is electrically connected to the wiring W1L. A first terminal of the transistor M5 is electrically connected to the second terminal of the transistor M2, a second terminal of the transistor M5 is electrically connected to the first terminal of the transistor M3 and the first terminal of the transistor M4, and a gate of the transistor M5 is electrically connected to a wiring S1L.

A first terminal of the transistor M1s is electrically connected to the wiring IL, a second terminal of the transistor M1s is electrically connected to a first terminal of the capacitor C1s and a gate of the transistor M2s, and a gate of the transistor M1s is electrically connected to the wiring W2L. A first terminal of the transistor M2s is electrically connected to a second terminal of the capacitor C1s and a wiring VLs and a second terminal of the transistor M2s is electrically connected to a first terminal of the transistor M5s. A second terminal of the transistor M5s is electrically connected to the first terminal of the transistor M3 and the first terminal of the transistor M4 and a gate of the transistor M5s is electrically connected to a wiring S2L.

In the circuit MP in FIG. 17, the circuit MCr has substantially the same circuit configuration as that of the circuit MC. Thus, the reference numerals of the circuit elements of the circuit MCr include "r" so that the circuit elements of the circuit MCr are distinguished from those of the circuit MC.

The wiring VLs functions as a wiring that supplies a constant voltage, and the constant voltage can be a low-level potential VSS, a low potential other than VSS, a ground potential, or the like. The constant voltage may be a high-level potential VDD. The constant voltage supplied by the wiring VLs may be the same as or different from the constant voltage supplied by the wiring VL. In the case where the wiring VL and the wiring VLs supply substantially the same constant voltage, the wiring VLs and the wiring VL can be combined into one wiring.

A wiring VLsr functions as a wiring that supplies a constant voltage, and the constant voltage can be a low-level potential VSS, a low potential other than VSS, a ground potential, or the like. The constant voltage may be a high-level potential VDD. The constant voltage supplied by the wiring VLsr may be the same as or different from the constant voltage supplied by the wiring VLr. In the case where the wiring VLr and the wiring VLsr supply substantially the same constant voltage, the wiring VLsr and the wiring VLr can be combined into one wiring.

Constant voltages supplied by the wiring VL, the wiring VLs, the wiring VLr, and the wiring VLsr may be different voltages or the same voltage. Two or three wirings selected from the wiring VL, the wiring VLs, the wiring VLr, and the wiring VLsr may supply the same constant voltage.

The wiring S1L functions as a wiring for supplying a potential for bringing the transistor M5 and the transistor M5r into an on state or an off state, and the wiring S2L functions as a wiring for supplying a potential for bringing the transistor M5s and the transistor M5sr into an on state or an off state.

The circuits MP illustrated in FIG. 5C and FIG. 5D can hold two weight coefficients by using the configuration shown in the circuit MP in FIG. 17. Specifically, the circuit MP in FIG. 17 can hold a potential corresponding to the first weight coefficient in the holding portion HC of the circuit MC and the holding portion HCr of the circuit MCr and hold a potential corresponding to the second weight coefficient in the holding portion HCs of the circuit MC and the holding portion HCsr of the circuit MC. In addition, the circuit MP in FIG. 17 can switch weight coefficients used for arithmetic operation by potentials supplied from the wiring S1L and the wiring S2L. For example, potentials corresponding to the weight coefficients $w_1^{(k-1)(k)}_j$ to $w_m^{(k-1)(k)}_j$ are held in the holding portions HC and the holding portions HCr included in the circuit MP[1,j] to the circuit MP[m,j] of the arithmetic circuit 110, potentials corresponding to the weight coefficients $w_1^{(k-1)(k)}_j$ to $w_m^{(k-1)(k)}_j$ (here, h is an integer which is greater than or equal to 1 and not j) are held in the holding portions HCs and HCsr included in the circuit MP[1,j] to the circuit MP[m,j] of the arithmetic circuit 110, and potentials corresponding to the signals $z_1^{(k-1)}$ to $z_m^{(k-1)}$ are input to the wiring XLS[1] to the wiring XLS[m] (the wirings X1L and X2L in the circuit MP in FIG. 17). At this time, a high-level potential is applied to the wiring S1L to bring the transistor M5 and the transistor M5r into an on state and a low-level potential is applied to the wiring S2L to bring the transistor M5s and the transistor M5sr into an off state, whereby the circuit MP[1,j] to the circuit MP[m,j] of the arithmetic circuit 110 can perform arithmetic operation of the sum of products of the weight coefficients $w_1^{(k-1)(k)}_H$ to $w_m^{(k-1)(k)}_j$ and the signals $z_1^{(k-1)}$ to $z_m^{(k-1)}$ and an activation function. Moreover, a low-level potential is applied to the wiring S1L to bring the transistor M5 and the transistor M5r into an off state and a high-level potential is applied to the wiring S2L to bring the transistor M5s and the transistor M5sr into an on state, whereby the circuit MP[1,j] to the circuit MP[m,j] of the arithmetic circuit 110 can perform arithmetic operation of the sum of products of the weight coefficients $w_1^{(k-1)}{}_H^{(k)}$ to $w_m^{(k-1)}{}_H^{(k)}$ and the signals $z_1^{(k-1)}$ to $z_m^{(k-1)}$ and an activation function.

As described above, the arithmetic circuit 110 to which the circuit MP in FIG. 17 is applied can hold two weight coefficients and perform arithmetic operation of the sum of products and an activation function by switching the weight coefficients. The arithmetic circuit 110 including the circuit MP in FIG. 17 is effective in, for example, the case where the number of neurons in the k-th layer is greater than n, the case where arithmetic operation is performed in an intermediate layer different from the k-th layer, or the like. In addition, although the circuit MC and the circuit MCr each include two holding portions in the circuit MP in FIG. 17, the circuit MC and the circuit MCr may each include three or more holding portions according to circumstances.

Configuration Example 4

Figure 18A:
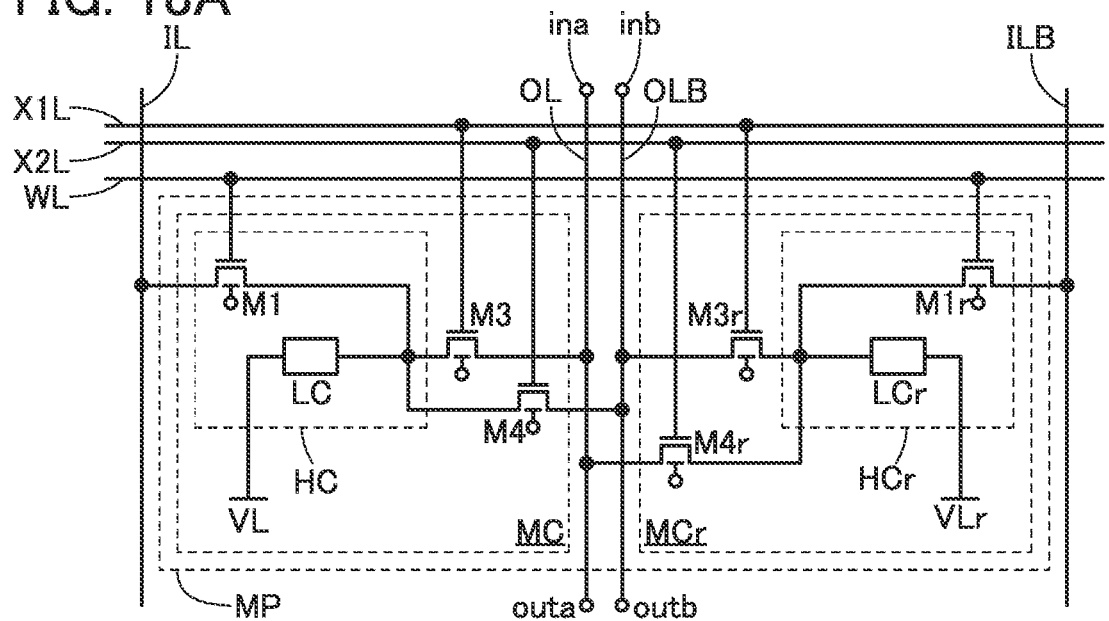
FIG. 18A, FIG. 18B, FIG. 18C, and FIG. 18D are circuit diagrams showing configuration examples of a circuit included in a semiconductor device.

The circuit MP illustrated in FIG. 18A is a circuit that can be used as the circuit MP in FIG. 5A and is different from the circuit MP in FIG. 9A in that the holding portion HC and the holding portion HCr respectively include a load circuit LC and a load circuit LCr instead of the capacitor C1 and the capacitor C1r.

In the circuit MC of the circuit MP in FIG. 18A, a first terminal of the load circuit LC is electrically connected to the second terminal of the transistor M1, the first terminal of the transistor M3, and the first terminal of the transistor M4, and a second terminal of the load circuit LC is electrically connected to the wiring VL.

The circuit MCr of the circuit MP in FIG. 18A has substantially the same circuit configuration as that of the circuit MC. Thus, the reference numerals of the circuit elements of the circuit MCr include "r" so that the circuit elements of the circuit MCr are distinguished from those of the circuit MC.

Here, the wiring VL and the wiring VLr each function as a wiring for supplying a constant voltage VCNS. As VCNS, for example, a ground potential (GND) or a low potential in a range where the load circuit LC and the load circuit LCr normally operate.

The load circuit LC and the load circuit LCr are each a circuit capable of changing a resistance between a first terminal and a second terminal, for example. By changing the resistance between the first terminal and the second terminal of each of the load circuit LC and the load circuit LCr, the amount of current flowing between the first terminal and the second terminal of each of the load circuit LC and the load circuit LCr can be changed.

Here, a method for changing the resistance between the first terminal and the second terminal of each of the load circuit LC and the load circuit LCr in the circuit MP in FIG. 18A is described. First, a low-level potential is input to each of the wiring X1L and the wiring X2L to bring the transistor M3, the transistor M3r, the transistor M4, and the transistor M4r into an off state. Next, a high-level potential is input to the wiring WL to bring the transistors M1 and M1r into an on state and the potential of the wiring IL (the wiring ILB) is changed, so that the resistance between the first terminal and the second terminal of the load circuit LC (the load circuit LCr) is set. For example, there is a method for inputting to the wiring IL (the wiring ILB) a potential for resetting the resistance between the first terminal and the second terminal of the load circuit LC (the load circuit LCr), and then inputting to the wiring IL (the wiring ILB) a potential at which the resistance between the first terminal and the second terminal of the load circuit LC (the load circuit LCr) is set to a desired value. After the resistance between the first terminal and the second terminal of the load circuit LC (the load circuit LCr) is set to a desired value, a low-level potential is input to the wiring WL to bring the transistor M1 and the transistor M1r into an off state.

Figure 18B:
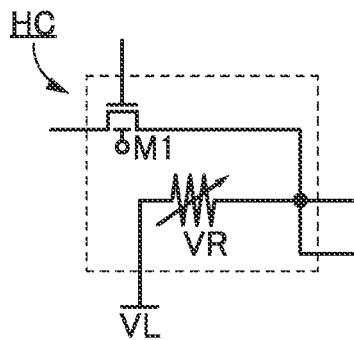
Figure 18C:
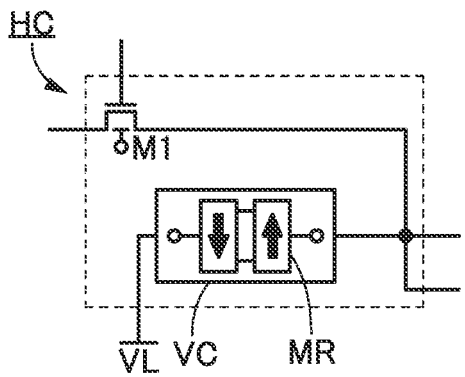
Figure 18D:
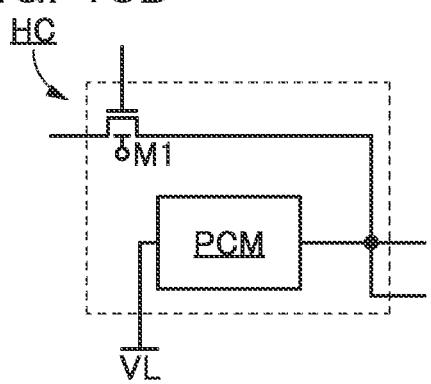

As each of the load circuit LC and the load circuit LCr, for example, a variable resistor VR can be used as illustrated in FIG. 18B. The load circuit LC and the load circuit LCr can each be, for example, a circuit VC including an MTJ element MR as illustrated in FIG. 18C. As each of the load circuit LC and the load circuit LCr, for example, a resistor containing a phase-change material that is used for a phase-change memory (PCM) or the like (referred to as a phase-change memory PCM in this specification and the like for convenience) as illustrated in FIG. 18D.

Figure 19:
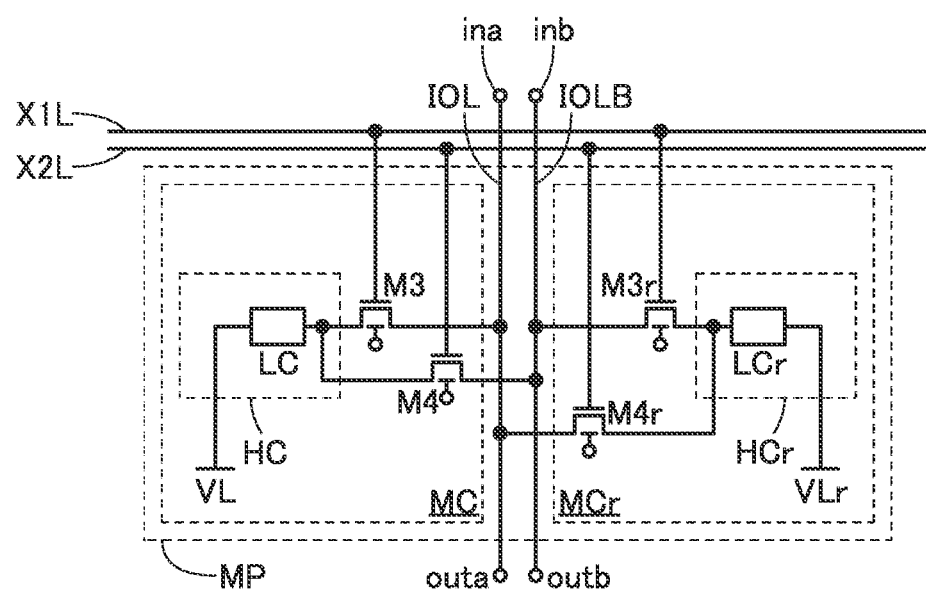
FIG. 19 is a circuit diagram showing a configuration example of a semiconductor device.

The circuit MP including the load circuit LC and the load circuit LCr is not limited to the configuration illustrated in FIG. 18A, and the configuration of the circuit MP in FIG. 18A can be changed according to circumstances. As a modification example of the circuit MP in FIG. 18A, a circuit configuration in which the wiring IL, the wiring ILB, the transistor M1, and the transistor M1r are not provided in the circuit MP in FIG. 18A can be employed. FIG. 19 is a circuit diagram showing the circuit configuration and is a configuration example of the circuit MP in FIG. 5D.

In the circuit MP in FIG. 19, the resistance between the first terminal and the second terminal of the load circuit LC can be set by inputting a high-level potential to the wiring XTL and inputting a low-level potential to the wiring X2L to bring the transistor M3 into an on state and bring the transistor M4 into an off state, and supplying a potential from the wiring IOL to the first terminal of the load circuit LC through the transistor M3. At this time, a potential can be supplied from the wiring IOLB to a first terminal of the load circuit LCr through the transistor M3r, so that the resistance between the first terminal and the second terminal of the load circuit LCr can be set at the same time as the load circuit LC.

In addition, the resistance between the first terminal and the second terminal of the load circuit LC can also be set by inputting a low-level potential to the wiring XTL and inputting a high-level potential to the wiring X2L to bring the transistor M3 into an off state and bring the transistor M4 into an on state, and supplying a potential from the wiring IOLB to the first terminal of the load circuit LC through the transistor M4. At this time, a potential can be supplied from the wiring IOL to the first terminal of the load circuit LCr through the transistor M4r, so that the resistance between the first terminal and the second terminal of the load circuit LCr can be set at the same time as the load circuit LC.

Note that the resistance between the first terminal and the second terminal of each of the load circuit LC and the load circuit LCr illustrated in FIG. 18A and FIG. 19 may be a binary, ternary, or higher-level value or an analog value.

Configuration Example 5

Figure 20A:
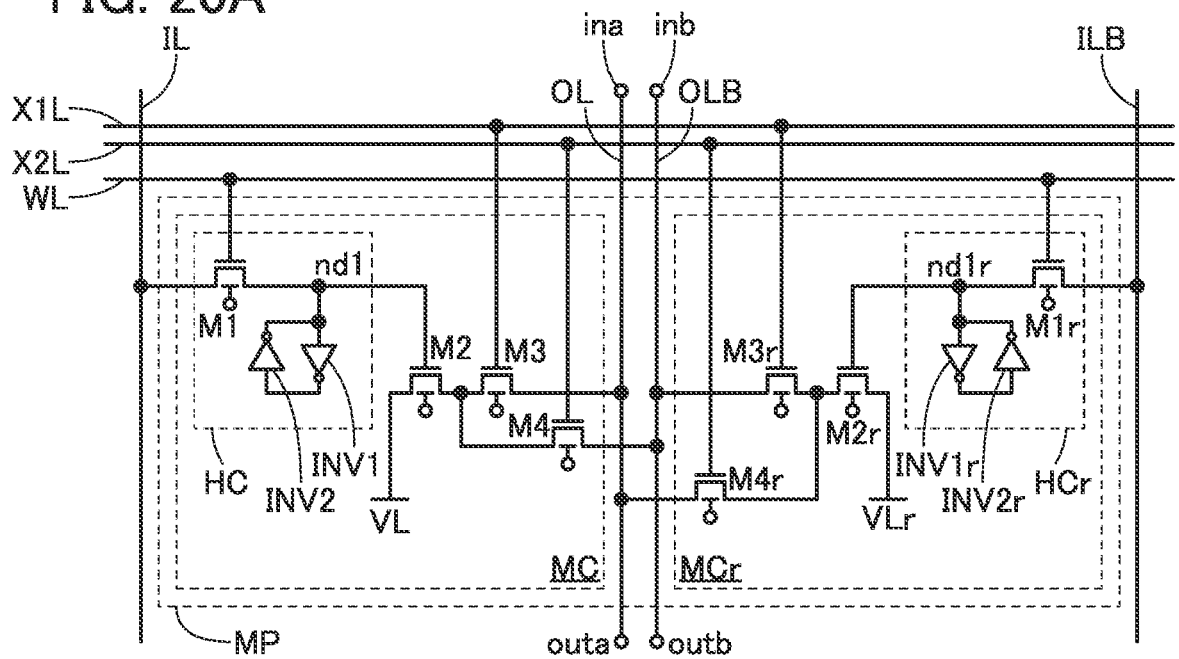
FIG. 20A and FIG. 20B are circuit diagrams showing configuration examples of a circuit included in a semiconductor device.

The circuit MP illustrated in FIG. 20A is a circuit that can be used as the circuit MP in FIG. 5A and is different from the circuit MP in FIG. 9A in that the holding portion HC and the holding portion HCr have an inverter loop circuit configuration instead of the capacitor C1 and the capacitor C1r, respectively.

In the circuit MC of the circuit MP in FIG. 20A, the holding portion HC includes an inverter circuit INV1 and an inverter circuit INV2. An input terminal of the inverter circuit INV1 is electrically connected to an output terminal of the inverter circuit INV2, the second terminal of the transistor M1, and the gate of the transistor M2. As in the description of FIG. 9A, an electrical connection point of the second terminal of the transistor M1, the gate of the transistor M2, the input terminal of the inverter circuit INV1, and the output terminal of the inverter circuit INV2 is referred to as the node nd1. The node nd1 may be connected to not the input terminal of the inverter circuit INV1 but an output terminal of the inverter circuit INV1.

The circuit MCr of the circuit MP in FIG. 20A has substantially the same circuit configuration as that of the circuit MC. Thus, the reference numerals of the circuit elements of the circuit MCr include "r" so that the circuit elements of the circuit MCr are distinguished from those of the circuit MC.

An inverter loop is formed by the inverter circuit INV1 and the inverter circuit INV2 in the holding portion HC included in the circuit MC and an inverter loop is formed by an inverter circuit INV1r and an inverter circuit INV2r in the holding portion HCr included in the circuit MCr. That is, the circuit MP in FIG. 20A can hold a potential corresponding to a weight coefficient by the inverter loops in the holding portion HC and the holding portion HCr.

Note that although the inverter circuit INV1, the inverter circuit INV1r, the inverter circuit INV2, and the inverter circuit INV2r are illustrated in the circuit MP in FIG. 20A, at least one of the inverter circuit INV1, the inverter circuit INV1r, the inverter circuit INV2, and the inverter circuit INV2r may be replaced with a logic circuit which outputs an inverted signal of an input signal when the input signal is input thereto. The logic circuit can be a NAND circuit, a NOR circuit, an XOR circuit, or the like, or a circuit in which these are combined, for example. Specifically, in the case where the inverter circuit is replaced with a NAND circuit, a high-level potential is input to one of two input terminals of the NAND circuit as a fixed potential, so that the NAND circuit can function as an inverter circuit. In the case where the inverter circuit is replaced with a NOR circuit, a low-level potential is input to one of two input terminals of the NOR circuit as a fixed potential, so that the NOR circuit can function as an inverter circuit. In the case where the inverter circuit is replaced with an XOR circuit, a high-level potential is input to one of two input terminals of the XOR circuit as a fixed potential, so that the XOR circuit can function as an inverter circuit.

As described above, an inverter circuit described in this specification and the like can be replaced with a logic circuit such as a NAND circuit, a NOR circuit, an XOR circuit, or a circuit in which these are combined. Therefore, in this specification and the like, the term "inverter circuit" can be referred to as a "logic circuit".

Figure 20B:
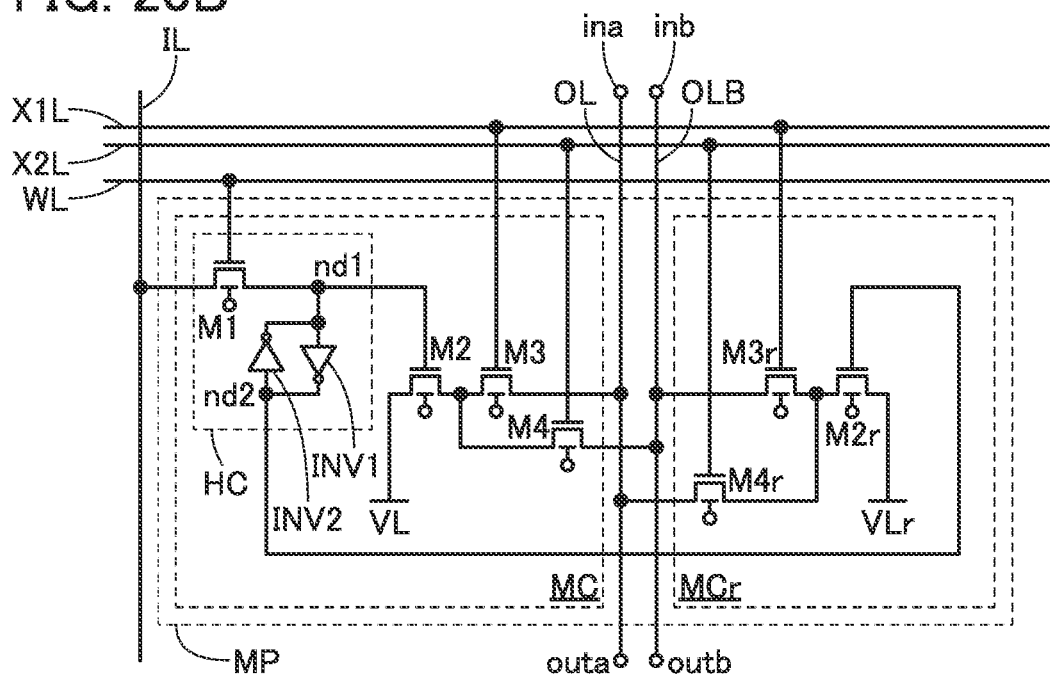

The configuration of the circuit MP in FIG. 20A can be changed according to circumstances. FIG. 20B shows a modification example of the circuit MP in FIG. 20A. The circuit MP in FIG. 20B has a configuration which is obtained by removing the holding portion HCr from the circuit MCr of the circuit MP in FIG. 20A and is a configuration in which the holding portion HC of the circuit MC is electrically connected to the gate of the transistor M2r of the circuit MCr.

In FIG. 20B, an electrical connection point of the output terminal of the inverter circuit INV1 and an input terminal of the inverter circuit INV2 is a node nd2. That is, the potential of the node nd2 is input to the gate of the transistor M2r.

In the circuit MP illustrated in FIG. 20B, the holding portion HCr is not included in the circuit MCr, and a potential supplied to the gate of the transistor M2r is held by the holding portion HC of the circuit MC. The holding portion HC has the inverter loop structure formed by the inverter circuit INV1 and the inverter circuit INV2; thus, one of a high-level potential and a low-level potential is held at the node nd1 and the other of the high-level potential and the low-level potential is held at the node nd2.

Note that due to the inverter loop structure, the holding portion HC cannot hold the same potential at the node nd1 and the node nd2. Therefore, in the circuit MP in FIG. 20B, a weight coefficient expressed by holding the same potential at the node nd1 and the node nd2 cannot be set. Specifically, in the above operation example, a low-level potential cannot be held at the gate of each of the transistor M2 and the transistor M2r; thus, a weight coefficient "0" cannot be set to the circuit MP in FIG. 20B.

Configuration Example 6

Figure 21A:
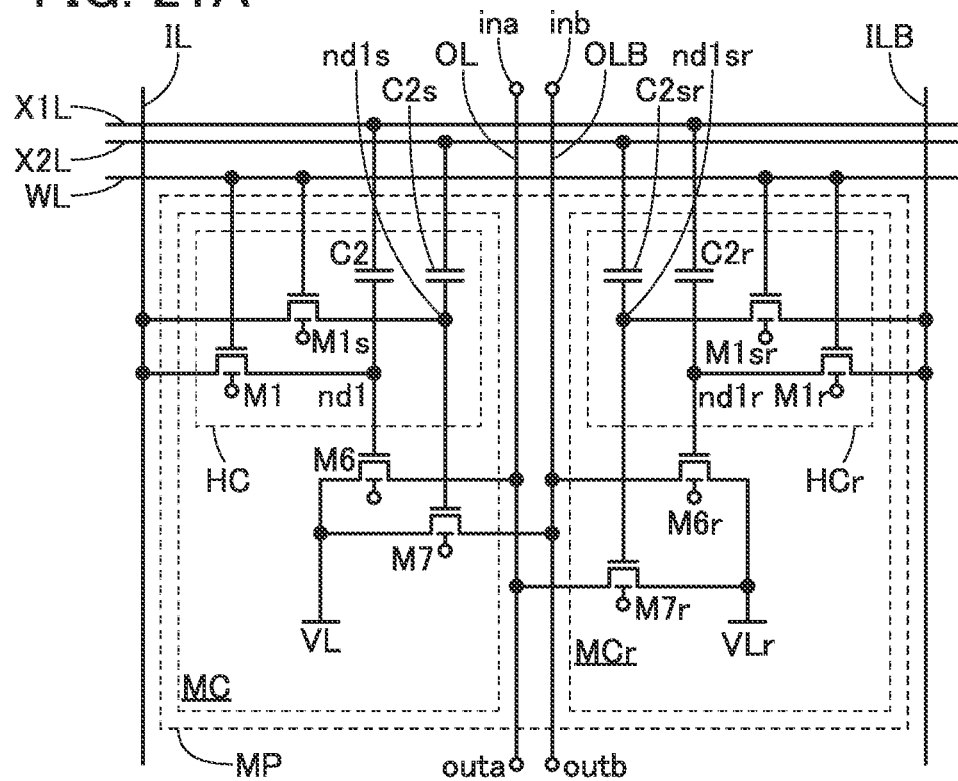
FIG. 21A and FIG. 21B are circuit diagrams showing configuration examples of a circuit included in a semiconductor device.

The circuit MP illustrated in FIG. 21A is a circuit that can be used as the circuit MP in FIG. 5A and is different from the circuit MP in FIG. 9A in that the holding portion HC and the holding portion HCr each include two transistors and two capacitors, for example.

In the circuit MC of the circuit MP illustrated in FIG. 21A, the holding portion HC includes the transistor M1, the transistor M1s, a capacitor C2, and a capacitor C2s. The first terminal of the transistor M1 is electrically connected to the wiring IL, the second terminal of the transistor M1 is electrically connected to a first terminal of the capacitor C2 and a gate of a transistor M6, and the gate of the transistor M1 is electrically connected to the wiring WL. The first terminal of the transistor M1s is electrically connected to the wiring IL, the second terminal of the transistor M1s is electrically connected to a first terminal of the capacitor C2s and a gate of the transistor M7, and the gate of the transistor M1s is electrically connected to the wiring WL. As in the description of FIG. 9A, an electrical connection point of the second terminal of the transistor M1, the gate of the transistor M6, and the first terminal of the capacitor C2 is referred to as nd1, and an electrical connection point of the second terminal of the transistor M1s, the gate of the transistor M7, and the first terminal of the capacitor C2s is referred to as nd1s.

A second terminal of the capacitor C2 is electrically connected to the wiring X1L and a second terminal of the capacitor C2s is electrically connected to the wiring X2L.

A first terminal of the transistor M6 is electrically connected to a first terminal of the transistor M7 and the wiring VL, and a second terminal of the transistor M6 is electrically connected to the wiring OL. A second terminal of the transistor M7 is electrically connected to the wiring OLB.

The circuit MCr of the circuit MP in FIG. 21A has substantially the same circuit configuration as that of the circuit MC. Thus, the reference numerals of the circuit elements of the circuit MCr include "r" so that the circuit elements of the circuit MCr are distinguished from those of the circuit MC.

The holding portion HC included in the circuit MC has a function of holding a potential by the capacitor C2 and the capacitor C2s. Specifically, a high-level potential is input to the wiring WL to bring the transistor M1 and the transistor M1s into an on state and then a predetermined potential is input to the wiring IL, whereby the potential is written to the first terminal of each of the capacitor C2 and the capacitor C2s. Then, a low-level potential is input to the wiring WL to bring the transistor M1 and the transistor M1s into an off state, whereby the potential can be held at each of the node nd1 and the node nd1s of the holding portion HC. When a predetermined potential is written to and held in the holding portion HC, the potentials of the wiring X1L and the wiring X2L are each preferably a constant potential, and particularly preferably a potential higher than the low-level potential and lower than the high-level potential. The constant potential is referred to as a reference potential for convenience.

In the circuit MP in FIG. 21A, the wiring WL is electrically connected to the holding portion HC and the holding portion HCr; thus, in the case where a potential corresponding to a weight coefficient is written to and held in each of the holding portion HC and the holding portion HCr, predetermined potentials are written to the holding portion HC and the holding portion HCr concurrently when the potential of the wiring WL is a high-level potential, and then the potential of the wiring WL is set to a low-level potential to bring the transistor M1, the transistor M1s, the transistor M1r, and the transistor M1sr into an off state concurrently.

Here, a signal of a neuron input to the circuit MP is defined as follows. When a potential higher than a reference potential (hereinafter, referred to as a high-level potential) is applied to the wiring X1L and a potential lower than the reference potential (hereinafter, referred to as a low-level potential) is applied to the wiring X2L, "+1" is input to the circuit MP as a signal of a neuron; when a low-level potential is applied to the wiring X1L and a high-level potential is applied to the wiring X2L, "−1" is input to the circuit MP as a signal of a neuron; and when a low-level potential is applied to each of the wiring X1L and the wiring X2L, "0" is input to the circuit MP as a signal of a neuron.

For example, in the case where "+1" is input to the circuit MP as a signal of a neuron after the potential corresponding to the weight coefficient is held in each of the holding portion HC and the holding portion HCr, a high-level potential is input to the wiring X1L, so that the potentials of the nodes nd1 and nd1r are increased by capacitive coupling by the capacitor C2 and the capacitor C2r. Accordingly, the potentials of the gate of the transistor M6 and a gate of a transistor M6r are increased, so that the transistor M6 and the transistor M6r are brought into an on state. Moreover, a low-level potential is input to the wiring X2L, so that the potentials of the node nd1s and anode nd1sr are decreased by capacitive coupling by the capacitor C2s and the capacitor C2sr. Accordingly, the potentials of the gate of the transistor M7 and a gate of a transistor M7r are decreased, so that the transistor M7 and the transistor M7r are brought into an off state. That is, when "+1" is input to the circuit MP as a signal of a neuron, electrical continuity is established between the circuit MC and the wiring OL and electrical continuity is established between the circuit MCr and the wiring OLB.

For example, in the case where "−1" is input to the circuit MP as a signal of a neuron after the potential corresponding to the weight coefficient is held in the holding portion HC and the holding portion HCr, a low-level potential is input to the wiring X1L, so that the potentials of the node nd1 and the node nd1r are decreased by capacitive coupling by the capacitor C2 and the capacitor C2r. Accordingly, the potentials of the gates of the transistor M6 and the transistor M6r are decreased, so that the transistor M6 and the transistor M6r are brought into an off state. Moreover, a high-level potential is input to the wiring X2L, so that the potentials of the node nd1s and the node nd1sr are increased by capacitive coupling by the capacitor C2s and the capacitor C2sr. Accordingly, the potentials of the gates of the transistor M7 and the transistor M7r are increased, so that the transistor M7 and the transistor M7r are brought into an on state. That is, when "−1" is input to the circuit MP as a signal of a neuron, electrical continuity is established between the circuit MC and the wiring OLB and electrical continuity is established between the circuit MCr and the wiring OL.

For example, in the case where "0" is input to the circuit MP as a signal of a neuron after the potential corresponding to the weight coefficient is held in the holding portion HC and the holding portion HCr, a low-level potential is input to the wiring X1L, so that the potentials of the node nd1 and the node nd1r are decreased by capacitive coupling by the capacitor C2 and the capacitor C2r. Accordingly, the potentials of the gates of the transistor M6 and the transistor M6r are decreased, so that the transistor M6 and the transistor M6r are brought into an off state. Moreover, a low-level potential is input to the wiring X2L, so that the potentials of the node nd1s and the node nd1sr are decreased by capacitive coupling by the capacitor C2s and the capacitor C2sr. Accordingly, the potentials of the gates of the transistor M7 and the transistor M7r are decreased, so that the transistor M7 and the transistor M7r are brought into an off state. That is, when "0" is input to the circuit MP as a signal of a neuron, electrical continuity is established between each of the circuit MC and the circuit MCr, and the wiring OL and the wiring OLB.

Note that the transistor M6, the transistor M6r, the transistor M7, and the transistor M7r in an on state preferably operate in a saturation region, for example. Therefore, it is preferable that the gates, sources, and drains of the transistor M6, the transistor M6r, the transistor M7, and the transistor M7r are preferably biased appropriately so that the transistors in an on state operate in a saturation region. In the case where the transistor M6, the transistor M6r, the transistor M7, and the transistor M7r in an on state operate in a saturation region, a current flowing between the source and the drain of the transistor is increased when a gate-source potential is high. In other words, when the wiring X1L (the wiring X2L) has a high-level potential, a current flowing between the source and the drain of each of the transistor M6 and the transistor M6r (the transistor M7 and the transistor M7r) is determined in accordance with the potentials of the node nd1 and the node nd1r (the node nd1s and the node nd1sr). However, one embodiment of the present invention is not limited thereto.

Figure 21B:
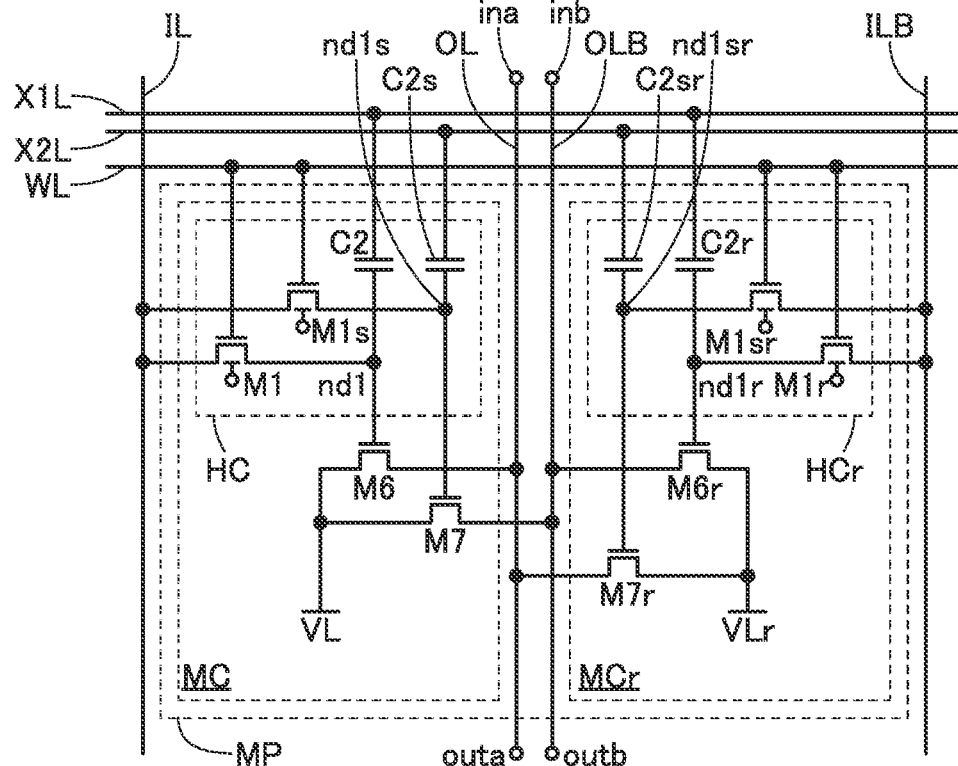

The configuration of the circuit MP in FIG. 21A can be changed according to circumstances. FIG. 21B shows a modification example of the circuit MP in FIG. 21A. The circuit MP in FIG. 21B has a configuration which is obtained by removing back gates from the transistor M6, the transistor M6r, the transistor M7, and the transistor M7r in FIG. 21A. Therefore, the transistor M6, the transistor M6r, the transistor M7, and the transistor M7r included in the circuit MP do not depend on the structures of the transistors and can be determined at the design stage.

For example, the transistor M6, the transistor M6r, the transistor M7, and the transistor M7r in FIG. 21B can each be a Si transistor including single crystal silicon or non-single-crystal silicon in an active layer. Alternatively, the transistor M6, the transistor M6r, the transistor M7, and the transistor M7r in FIG. 21B can each be an OS transistor including an oxide semiconductor in an active layer. Alternatively, the transistor M6, the transistor M6r, the transistor M7, and the transistor M7r can each be a transistor including an organic semiconductor, a compound semiconductor, or the like.

As described above, the arithmetic circuit 110 to which the circuit MP in FIG. 21A or FIG. 21B is applied can perform arithmetic operation of the sum of products and an activation function like the circuit MP in FIG. 9A.

Configuration Example 7

Configuration example 1 to Configuration example 6 each describe the circuit MP that can calculate the product of a weight coefficient that has three levels "+1", "−1", and "0" and is held by the circuit MP and a signal of a neuron that has three levels "+1", "−1", and "0" and corresponds to potentials input from the wiring X1L and the wiring X2L; this configuration example describes, for example, the circuit MP that can calculate the product of a weight coefficient having three levels "+1", "−1", and "0" and a signal of a neuron (an arithmetic value) having two levels "+1" and "0".

Figure 22A:
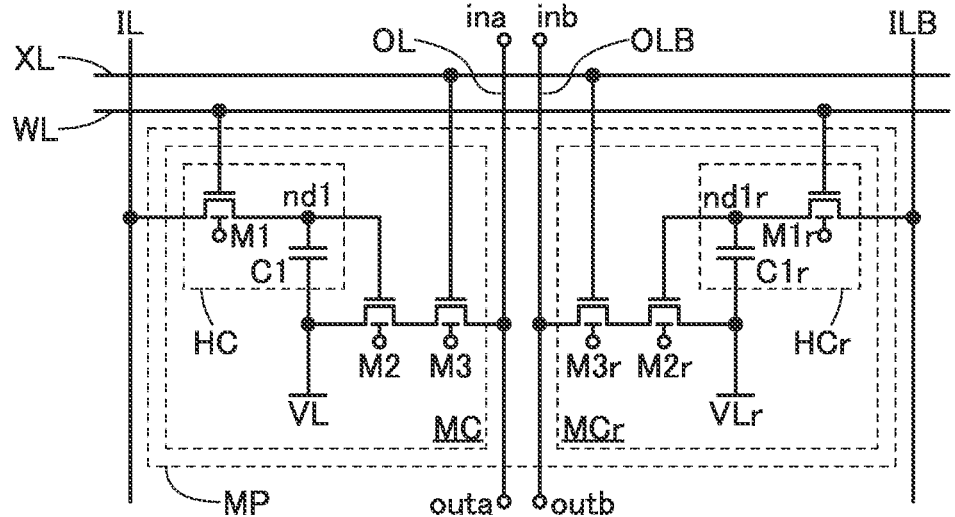
FIG. 22A, FIG. 22B, and FIG. 22C are circuit diagrams showing configuration examples of a circuit included in a semiconductor device.

The circuit MP illustrated in FIG. 22A is a circuit obtained by removing the transistors M4 and M4r from the circuit MP in FIG. 9A. In addition, since the transistor M4 and the transistor M4r are removed, the wiring X2L for inputting a potential to each of the gate of the transistor M4 and agate of the transistor M4r is also removed in FIG. 22A. Furthermore, a wiring corresponding to the wiring X1L is denoted by the wiring XL in FIG. 22A.

A weight coefficient set to the circuit MP in FIG. 22A is "+1" when a high-level potential is held at the node nd1 of the holding portion HC and a low-level potential is held at the node nd1r of the holding portion HCr, "−1" when a low-level potential is held at the node nd1 of the holding portion HC and a high-level potential is held at the node nd1r of the holding portion HCr, and "0" when a low-level potential is held at the node nd1 of the holding portion HC and a low-level potential is held at the node nd1r of the holding portion HCr.

A signal of a neuron input to the circuit MP in FIG. 22A is "+1" when a high-level potential is applied to the wiring XL and "0" when a low-level potential is applied to the wiring XL.

For the operation of the circuit MP in FIG. 22A, the description of the operation example in Configuration example 1 is referred to.

In the case where a weight coefficient and a signal of a neuron to be input are defined as described above in the circuit MP in FIG. 22A, the current $I_{OL}$ output from the node outa of the wiring OL changes or does not change and the current $I_{OLB}$ output from the node outb of the wiring OLB changes or does not change as in the following table when a signal of a neuron is input to the circuit MP. Note that in the following table, a high-level potential is denoted by "high", and a low-level potential is denoted by "low".

TABLE 3

| Weight coefficient | nd1 | nd1r | Signal | XL | Weight coefficient × signal | Change in $I_{OL}$ | Change in $I_{OLB}$ |
|---|---|---|---|---|---|---|---|
| 0 | low | low | +1 | high | 0 | Not change | Not change |
| +1 | high | low | +1 | high | +1 | Changes | Not change |
| −1 | low | high | +1 | high | −1 | Not change | Changes |
| 0 | low | low | 0 | low | 0 | Not change | Not change |
| +1 | high | low | 0 | low | 0 | Not change | Not change |
| −1 | low | high | 0 | low | 0 | Not change | Not change |

As in the above table, the circuit MP in FIG. 22A can calculate the product of a weight coefficient having three levels "+1", "−1", and "0" and a signal of a neuron having two levels "+1" and "0". Note that not a ternary weight coefficient but a binary, ternary, or higher-level weight coefficient may be used. For example, a weight coefficient may have two levels "+1" and "0" or two levels "+1" and "−1". Alternatively, the weight coefficient may be an analog value or a multi-bit (multilevel) digital value.

Although the potentials held in the holding portion HC and the holding portion HCr included in the circuit MC and the circuit MCr of the circuit MP are each a high-level potential or a low-level potential in this operation example, a potential showing an analog value may be held in the holding portion HC and the holding portion HCr. For example, in the case where the weight coefficient is a "positive analog value", a high-level analog potential is held at the node nd1 of the holding portion HC and a low-level potential is held at the node nd1r of the holding portion HCr. In the case where the weight coefficient is a "negative analog value", a low-level potential is held at the node nd1 of the holding portion HC and a high-level analog potential is held at the node nd1r of the holding portion HCr, for example. Then, the amount of the current $I_{OL}$ and the current $I_{OLB}$ becomes an amount corresponding to the analog potential.

Figure 22B:
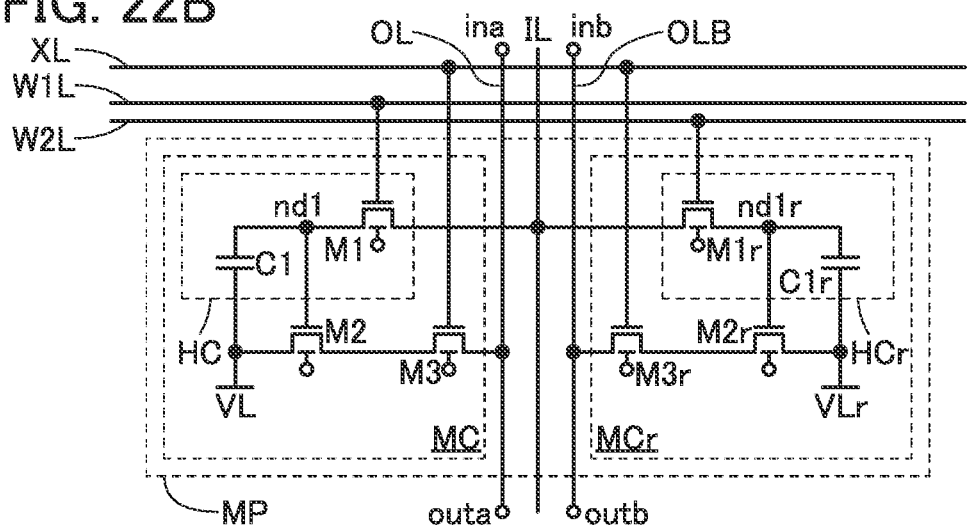

Like the circuit MP in FIG. 16A, the circuit MP in FIG. 22A may have a configuration in which the wiring IL and the wiring ILB are combined into one wiring and the wiring WL is divided into the wirings W1L and W2L. FIG. 22B illustrates such a circuit configuration. The circuit MP in FIG. 22B can be used for the arithmetic circuit 120 in FIG. 6, for example. For the method for operating the circuit MP in FIG. 22B, the description of the method for operating the circuit MP in FIG. 16A is referred to.

Figure 22C:
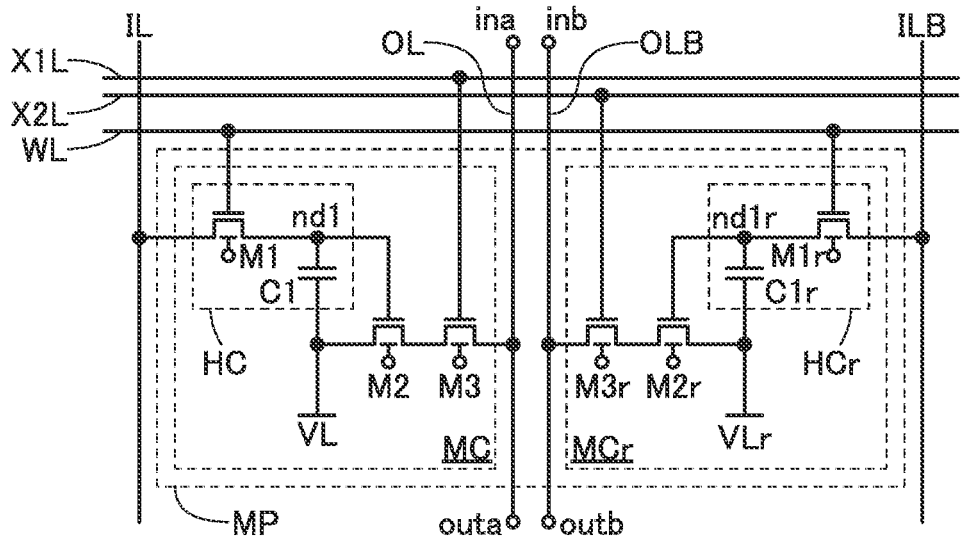

The circuit MP in FIG. 22A may have a configuration in which the wiring XL is divided into the wiring X1L and the wiring X2L. FIG. 22C illustrates such a circuit configuration. When a high-level potential or a low-level potential is supplied to each of the wiring X1L and the wiring X2L, there are four kinds of combinations of the on state and the off state of the transistors M3 and M3r. In addition, when a high-level potential or a low-level potential is held at each of the node nd1 and the node nd1r of the holding portion HC and the holding portion HCr, there are four kinds of combinations of the potentials held at the node nd1 and the node nd1r.

Specifically, when a high-level potential is held at the node nd1 and a high-level potential is applied to the wiring X1L, the wiring OL and the wiring VL are electrically connected to each other, so that the amount of the current $I_{OL}$ flowing through the wiring OL changes. Moreover, when a high-level potential is held at the node nd1r and a high-level potential is applied to the wiring X2L, the wiring OLB and the wiring VLr are electrically connected to each other, so that the amount of the current $I_{OLB}$ flowing through the wiring OLB changes. In the circuit MP in FIG. 22C, depending on the combination of potentials held at the nodes nd1 and nd1r and the combination of potentials supplied by the wirings X1L and X2L, the current $I_{OL}$ output from the node outa of the wiring OL changes or does not change and the current $I_{OLB}$ output from the node outb of the wiring OLB changes or does not change as in the following table. Note that in the following table, a high-level potential is denoted by "high", and a low-level potential is denoted by "low".

TABLE 4

| nd1 | nd1r | X1L | X2L | Change in $I_{OL}$ | Change in $I_{OLB}$ |
|---|---|---|---|---|---|
| low | low | high | low | Not change | Not change |
| high | low | high | low | Changes | Not change |
| low | high | high | low | Not change | Not change |
| high | high | high | low | Changes | Not change |
| low | low | low | high | Not change | Not change |
| high | low | low | high | Not change | Not change |
| low | high | low | high | Not change | Changes |
| high | high | low | high | Not change | Changes |
| low | low | low | low | Not change | Not change |
| high | low | low | low | Not change | Not change |
| low | high | low | low | Not change | Not change |
| high | high | low | low | Not change | Not change |
| low | low | high | high | Not change | Not change |
| high | low | high | high | Changes | Not change |
| low | high | high | high | Not change | Changes |
| high | high | high | high | Changes | Changes |

Next, circuits having configurations different from those of the circuits MP in FIG. 22A to FIG. 22C will be described.

Figure 23A:
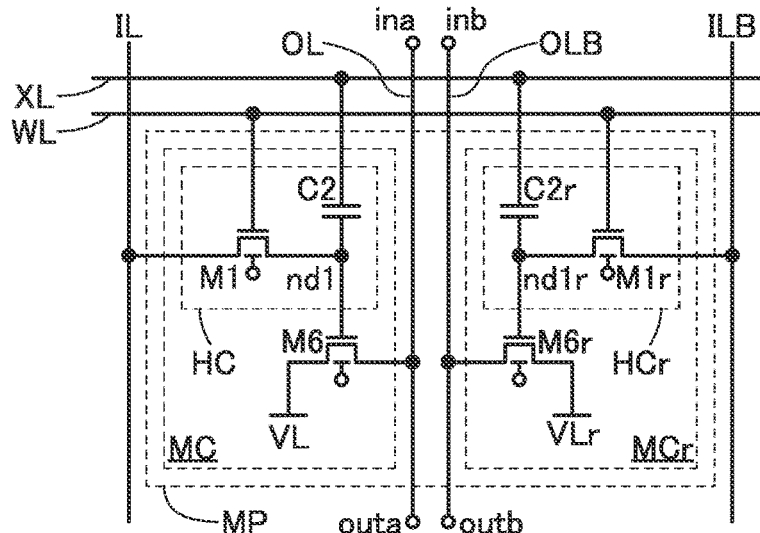
FIG. 23A, FIG. 23B, and FIG. 23C are circuit diagrams showing configuration examples of a circuit included in a semiconductor device.

Like the circuit MP in FIG. 22A, the circuit MP illustrated in FIG. 23A is a circuit that calculates the product of a weight coefficient having three levels "+1", "−1", and "0" and a signal of a neuron having two levels "+1" and "0" and has a circuit configuration in which the transistor M1s, the transistor M1sr, the transistor M7, and the transistor M7r and the capacitor C2s and the capacitor C2sr are not provided for the circuit MP in FIG. 21A. Since the capacitor C2s and the capacitor C2sr are removed, the wiring X2L for inputting a potential to each of the second terminals of the capacitor C2s and the capacitor C2sr is also removed in FIG. 23A. Furthermore, a wiring corresponding to the wiring X1L is denoted by the wiring XL in FIG. 23A.

For the operation of FIG. 23A, the description of Configuration example 6 is referred to.

As in the circuit MP in FIG. 22A, when a weight coefficient and a signal of a neuron are defined for the circuit MP in FIG. 23A, the product of the weight coefficient having three levels "+1", "−1", and "0" and the signal of a neuron having two levels "+1" and "0" can be calculated as in the above table. Note that not a ternary weight coefficient but a binary, ternary, or higher-level weight coefficient may be used. For example, a weight coefficient may have two levels "+1" and "0" or two levels "+1" and "−1". Alternatively, the weight coefficient may be an analog value or a multi-bit (multilevel) digital value. For example, the potentials held in the holding portion HC and the holding portion HCr included in the circuit MC and the circuit MCr of the circuit MP are each a high-level potential or a low-level potential, a potential showing an analog value may be held in the holding portion HC and the holding portion HCr. For example, in the case where the weight coefficient is a "positive analog value", a high-level analog potential is held at the node nd1 of the holding portion HC and a low-level potential is held at the node nd1r of the holding portion HCr. In the case where the weight coefficient is a "negative analog value", a low-level potential is held at the node nd1 of the holding portion HC and a high-level analog potential is held at the node nd1r of the holding portion HCr, for example. Then, the amount of the current $I_{OL}$ and the current $I_{OLB}$ becomes an amount corresponding to the analog potential.

Figure 23B:
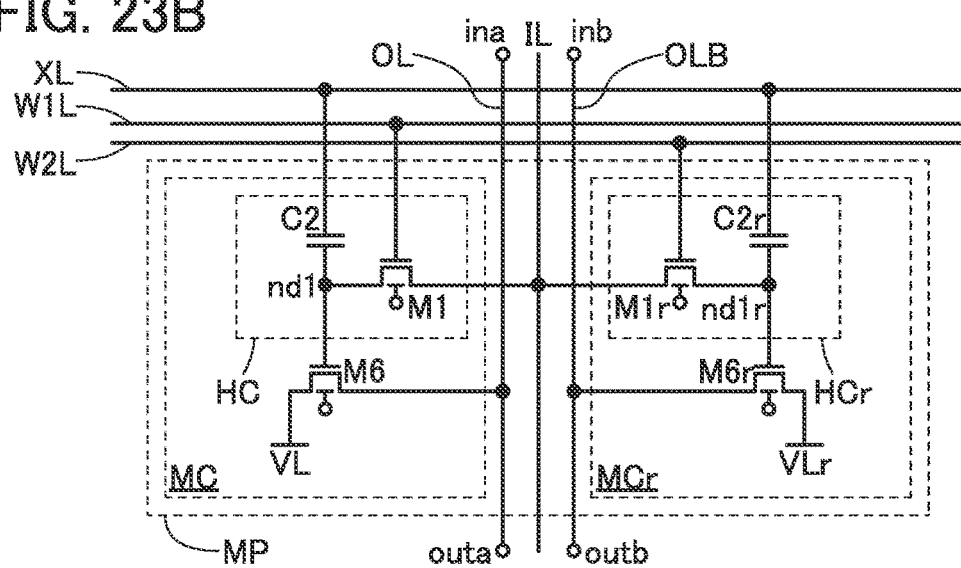

Like the circuit MP in FIG. 16A, the circuit MP in FIG. 23A may have a configuration in which the wiring IL and the wiring ILB are combined into one wiring and the wiring WL is divided into the wiring W1L and the wiring W2L. FIG. 23B illustrates such a circuit configuration. The circuit MP in FIG. 23B can be used for the arithmetic circuit 120 in FIG. 6, for example. For the method for operating the circuit MP in FIG. 23B, the description of the method for operating the circuit MP in FIG. 16A is referred to.

Figure 23C:
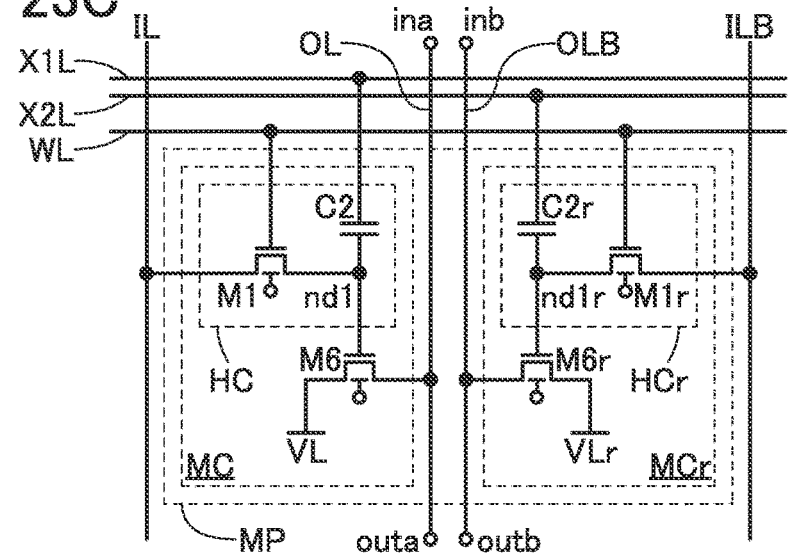

Like the circuit MP in FIG. 22C, the circuit MP in FIG. 23A may have a configuration in which the wiring XL is divided into the wiring X1L and the wiring X2L. FIG. 23C illustrates such a circuit configuration. When a high-level potential or a low-level potential is supplied to each of the wiring X1L and the wiring X2L, there are four kinds of combinations of the on state and the off state of the transistor M6 and the transistor M6r. In addition, when a high-level potential or a low-level potential is held at each of the node nd1 and the node nd1r of the holding portion HC and the holding portion HCr, there are four kinds of combinations of the potentials held at the node nd1 and the node nd1r. For example, the potentials held in the holding portion HC and the holding portion HCr included in the circuit MC and the circuit MCr of the circuit MP are each a high-level potential or a low-level potential, a potential showing an analog value may be held in the holding portion HC and the holding portion HCr. For example, in the case where the weight coefficient is a "positive analog value", a high-level analog potential is held at the node nd1 of the holding portion HC and a low-level potential is held at the node nd1r of the holding portion HCr. In the case where the weight coefficient is a "negative analog value", a low-level potential is held at the node nd1 of the holding portion HC and a high-level analog potential is held at the node nd1r of the holding portion HCr, for example. Then, the amount of the current $I_{OL}$ and the current $I_{OLB}$ becomes an amount corresponding to the analog potential.

Changes in currents flowing through the wiring OL and the wiring OLB in the circuit MP in FIG. 23C can be considered as in the circuit MP in FIG. 22C. Accordingly, in the circuit MP in FIG. 23C, depending on the combination of potentials held at the node nd1 and the node nd1r and the combination of potentials supplied by the wirings X1L and X2L, the current $I_{OL}$ output from the node outa of the wiring OL changes or does not change and the current $I_{OLB}$ output from the node outb of the wiring OLB changes or does not change as in the above table described with reference to the circuit MP in FIG. 22C.

Configuration Example 8

Figure 24A:
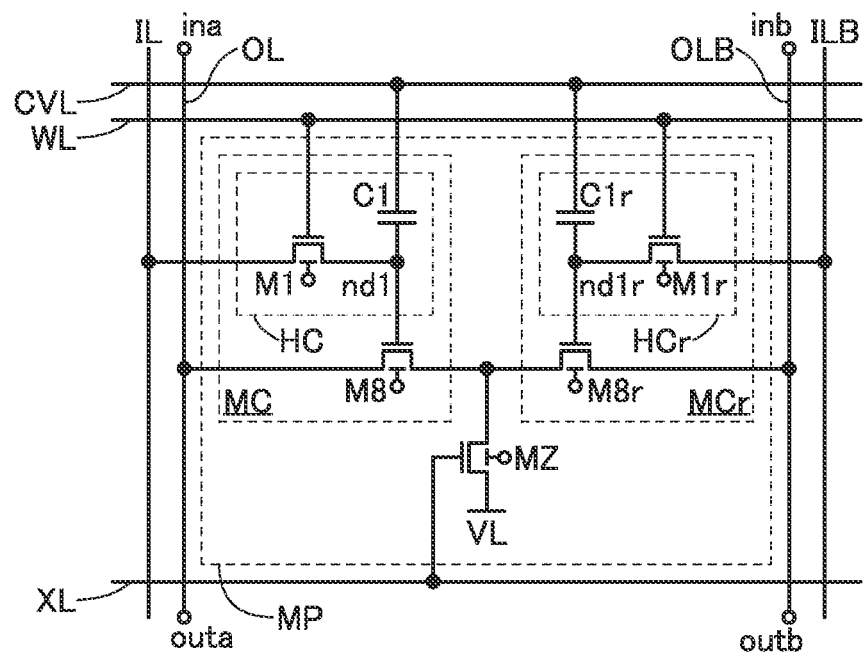
FIG. 24A and FIG. 24B are circuit diagrams showing configuration examples of a circuit included in a semiconductor device.

The circuit MP illustrated in FIG. 24A is an example of a circuit that can be used as the circuit MP in FIG. 5F.

The circuit MP in FIG. 24A includes the circuit MC, the circuit MCr, and the transistor MZ.

The circuit MCr of the circuit MP in FIG. 24A has substantially the same circuit configuration as that of the circuit MC. Thus, the reference numerals of the circuit elements of the circuit MCr include "r" so that the circuit elements of the circuit MCr are distinguished from those of the circuit MC.

The circuit MC includes the holding portion HC and a transistor M8, and the circuit MCr includes the holding portion HCr and a transistor M8r.

The holding portion HC included in the circuit MC of the circuit MP in FIG. 24A can have a structure similar to that of the holding portion HC included in the circuit MC of the circuit MP in FIG. 9A to FIG. 9C, FIG. 10A, FIG. 10B, FIG. 11A, FIG. 11B, FIG. 12A, FIG. 12B, or the like, for example.

A first terminal of the transistor M8 is electrically connected to the first terminal of the transistor MZ, a gate of the transistor M8 is electrically connected to the second terminal of the transistor M1 and the first terminal of the capacitor C1, and a second terminal of the transistor M8 is electrically connected to the wiring OL. The second terminal of the capacitor C1 is electrically connected to a wiring CVL. The first terminal of the transistor M1 is electrically connected to the wiring IL.

A first terminal of the transistor M8r is electrically connected to the first terminal of the transistor MZ, a gate of the transistor M8r is electrically connected to a second terminal of the transistor M1r and a first terminal of the capacitor C1r, and a second terminal of the transistor M8r is electrically connected to the wiring OLB. A second terminal of the capacitor C1r is electrically connected to the wiring CVL. The first terminal of the transistor M1 is electrically connected to the wiring ILB.

The wiring CVL functions as a wiring for supplying a constant voltage, for example. The constant voltage can be, for example, a high-level potential, a low-level potential, a ground potential, or the like.

Like the holding portion HC and the holding portion HCr included in the circuit MP illustrated in FIG. 9A or the like, the holding portion HC and the holding portion HCr included in the circuit MP in FIG. 24A can hold a potential corresponding to a weight coefficient. Specifically, for example, a predetermined potential is supplied to the wiring WL to bring the transistor M1 and the transistor M1r into an on state, a potential is supplied from the wiring IL to the first terminal of the capacitor C1, and a potential is supplied from the wiring ILB to the first terminal of the capacitor C1r. After that, a predetermined potential is supplied to the wiring WL to bring the transistor M1 and the transistor M1r into an off state.

Here, for example, a weight coefficient set to the circuit MP in FIG. 24A is "+1" when a high-level potential is held at the node nd1 of the holding portion HC and a low-level potential is held at the node nd1r of the holding portion HCr, "−1" when a low-level potential is held at the node nd1 of the holding portion HC and a high-level potential is held at the node nd1r of the holding portion HCr, and "0" when a low-level potential is held at the node nd1 of the holding portion HC and a low-level potential is held at the node nd1r of the holding portion HCr.

A potential corresponding to a weight coefficient is held in each of the holding portion HC and the holding portion HCr, whereby the potentials of the gates of the transistor M8 and the transistor M8r are determined. Here, when a potential corresponding to the value of a signal of a neuron is supplied to the wiring XL, for example, a current flowing from the circuit MP to the wiring IL and/or the wiring ILB is determined. For example, when a high-level potential is supplied as the second data of "1" to the wiring XL, the constant voltage supplied by the wiring VL is supplied to each of the first terminal of the transistor M8 and the first terminal of the transistor M8r. Here, when the potential of the gate of the transistor M8 is a high-level potential, a current flows between the first terminal and the second terminal of the transistor M8, and when the potential of the gate of the transistor M8 is a low-level potential, a current does not flow between the first terminal and the second terminal of the transistor M8. Similarly, when the potential of the gate of the transistor M8r is a high-level potential, a current flows between the first terminal and the second terminal of the transistor M8r, and when the potential of the gate of the transistor M8r is a low-level potential, a current does not flow between the first terminal and the second terminal of the transistor M8r. Moreover, for example, when a low-level potential is supplied as the second data of "0" to the wiring XL, the constant voltage supplied by the wiring VL is not supplied to each of the first terminal of the transistor M8 and the first terminal of the transistor M8r; thus, a current does not flow between the first terminal and the second terminal of each transistor.

That is, the summary of the above description is as follows: when the product of a weight coefficient and a signal of a neuron is "+1", a predetermined current flows from the circuit MC to the wiring OL and a predetermined current does not flow from the circuit MCr to the wiring OLB. When the product of a weight coefficient and a signal of a neuron is "−1", a predetermined current flows from the circuit MCr to the wiring OLB and a predetermined current does not flow from the circuit MC to the wiring OL. When the product of a weight coefficient and a signal of a neuron is "0", a current does not flow from the circuit MC to the wiring OL and a predetermined current does not flow from the circuit MCr to the wiring OLB.

As described above, like the circuit MP described in Configuration example 7, the circuit MP in FIG. 24A can calculate the product of a weight coefficient having three levels "+1", "−1", and "0" and a signal of a neuron (an arithmetic value) having two levels "+1" and "0". Alternatively, in the circuit MP in FIG. 24A, the weight coefficient may be an analog value or a multi-bit (multilevel) digital value as in the circuit MP described in Configuration example 7.

In addition, the circuit MP in FIG. 24A that can be used for the arithmetic circuit that is a semiconductor device of one embodiment of the present invention may be changed as appropriate according to circumstances.

Figure 24B:
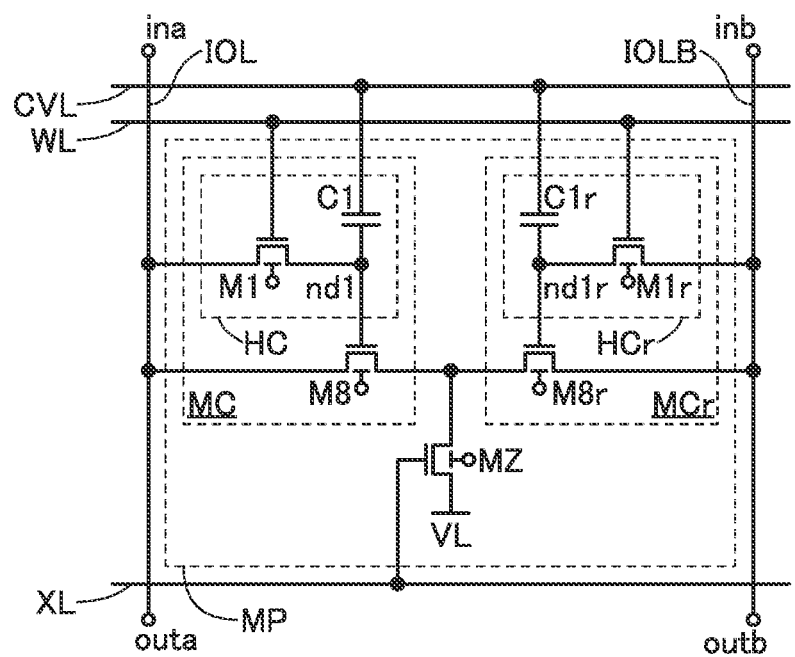

In the case where the circuit MP in FIG. 24A is used for the arithmetic circuit 130 in FIG. 7, for example, the configuration of the circuit MP in FIG. 24A may be changed into that of the circuit MP illustrated in FIG. 24B. The circuit MP in FIG. 24B has a configuration in which the wiring OL and the wiring IL are combined into one wiring which is the wiring $I_{OL}$, and the wiring OLB and the wiring ILB are combined into one wiring which is the wiring $I_{OLB}$ in the circuit MP in FIG. 24A. Note that the wiring XL illustrated in FIG. 24B corresponds to any one of the wiring XLS[1] to the wiring XLS[m] illustrated in FIG. 7, and the wiring WL illustrated in FIG. 24B corresponds to any one of the wiring WLS[1] to the wiring WLS[m] illustrated in FIG. 7.

A circuit that can be used as the circuit MP in FIG. 5A is not limited to the circuit MP in FIG. 24A.

Figure 25A:
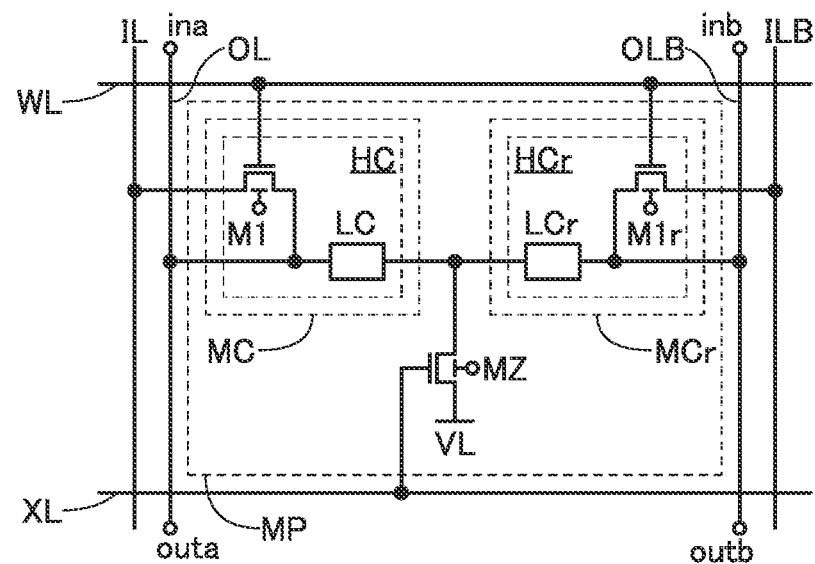
FIG. 25A and FIG. 25B are circuit diagrams showing configuration examples of a circuit included in a semiconductor device.

For example, the circuit MP in FIG. 18A described in Configuration example 4 can be modified into a circuit that can be used as the circuit MP in FIG. 5A. The circuit MP illustrated in FIG. 25A is a circuit that can be used as the circuit MP in FIG. 5A, and includes the holding portion HC including the load circuit LC and the holding portion HCr including the load circuit LCr as in FIG. 18A. Note that for the operation of FIG. 25A, the description of the operation example of the circuit MP in FIG. 24A, the circuit MP in FIG. 18A, or the like is referred to.

Figure 25B:
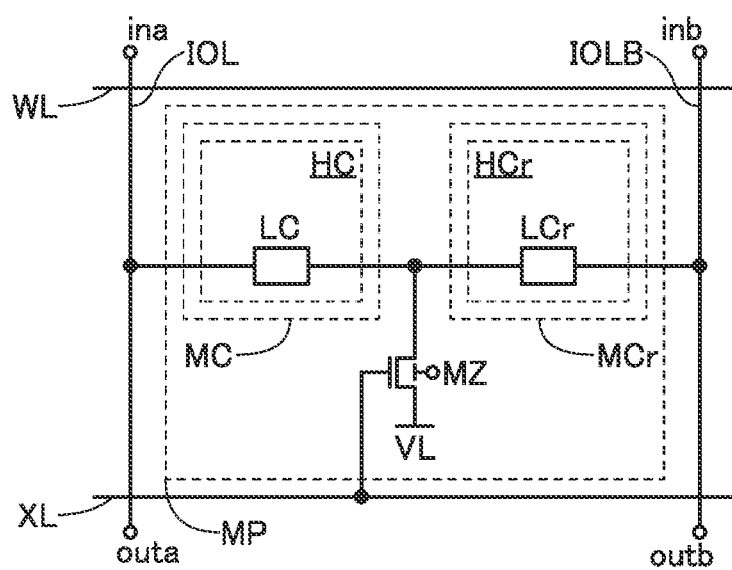

In the case where the circuit MP in FIG. 25A is used for the arithmetic circuit 130 in FIG. 7, for example, the configuration of the circuit MP in FIG. 25A may be changed into that of the circuit MP illustrated in FIG. 25B. The circuit MP in FIG. 25B has a configuration in which the wiring OL and the wiring IL are combined into one wiring which is the wiring $I_{OL}$, the wiring OLB and the wiring ILB are combined into one wiring which is the wiring $I_{OLB}$, and the transistor M1 and the transistor M1r are not provided in the circuit MP in FIG. 25A. Note that the wiring XL illustrated in FIG. 25B corresponds to any one of the wiring XLS[1] to the wiring XLS[m] illustrated in FIG. 7, and the wiring WL illustrated in FIG. 25B corresponds to any one of the wiring WLS[1] to the wiring WLS[m] illustrated in FIG. 7.

Figure 26A:
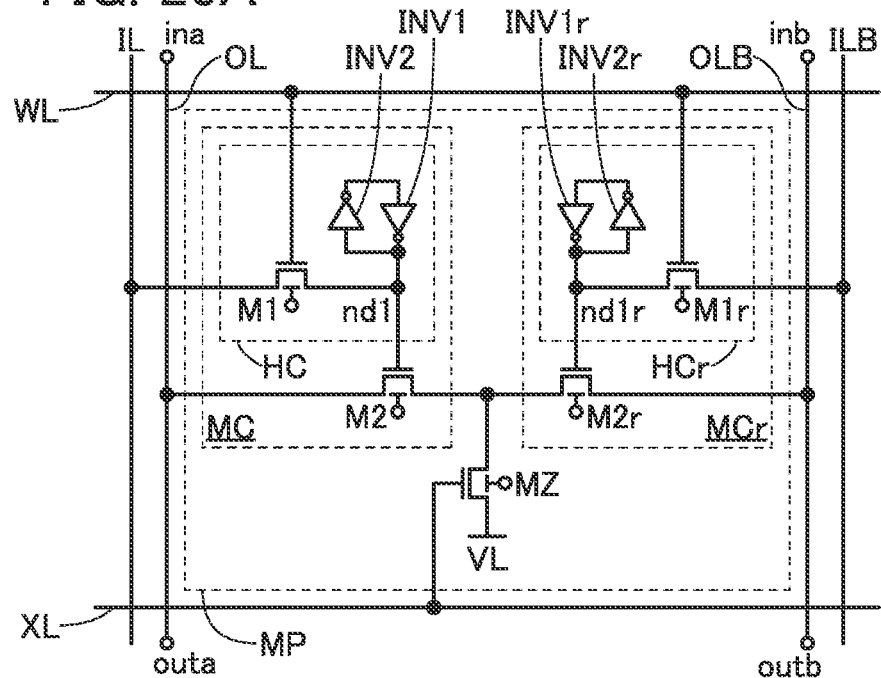
FIG. 26A and FIG. 26B are circuit diagrams showing configuration examples of a circuit included in a semiconductor device.

For example, the circuit MP in FIG. 20A described in Configuration example 5 can be modified into a circuit that can be used as the circuit MP in FIG. 5A. The circuit MP illustrated in FIG. 26A is a circuit that can be used as the circuit MP in FIG. 5A, and includes the holding portion HC including the inverter circuit INV1 and the inverter circuit INV2 and the holding portion HCr including the inverter circuit INV1r and the inverter circuit INV2r as in FIG. 20A. Note that the circuit MP in FIG. 26A is not provided with the transistor M3, the transistor M3r, the transistor M4, and the transistor M4r. Note that for the operation of FIG. 26A, the description of the operation example of the circuit MP in FIG. 24A, the circuit MP in FIG. 20A, or the like is referred to.

Figure 26B:
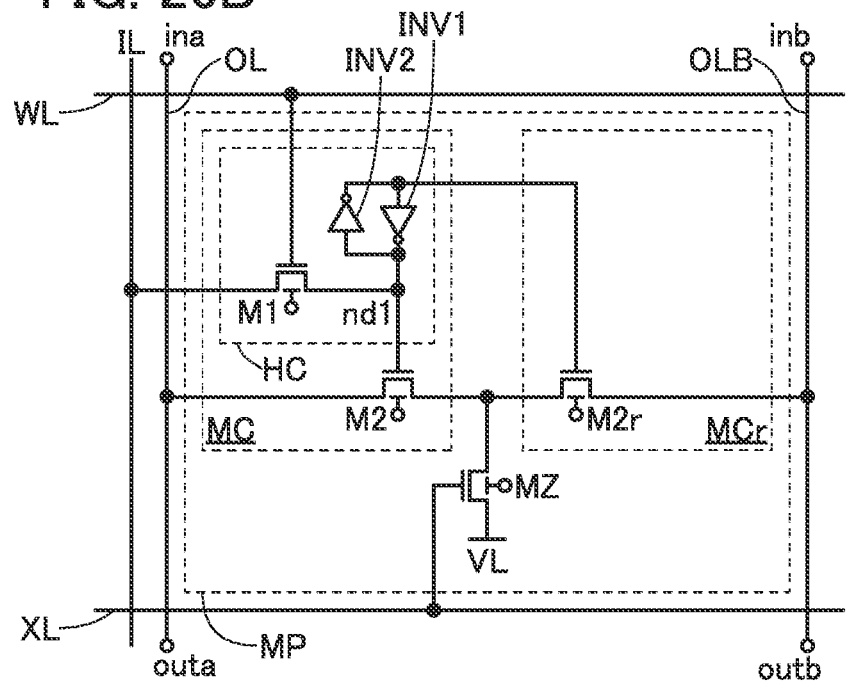

For example, the circuit MP in FIG. 20B described in Configuration example 5 can be modified into a circuit that can be used as the circuit MP in FIG. 5A. The circuit MP illustrated in FIG. 26B is a circuit that can be used as the circuit MP in FIG. 5A, and includes the holding portion HC including the inverter circuit INV1 and the inverter circuit INV2 as in FIG. 20B. Note that the circuit MP in FIG. 26B is not provided with the transistor M3, the transistor M3r, the transistor M4, and the transistor M4r. Note that for the operation of FIG. 26B, the description of the operation example of the circuit MP in FIG. 24A, the circuit MP in FIG. 20B, or the like is referred to.

Figure 27A:
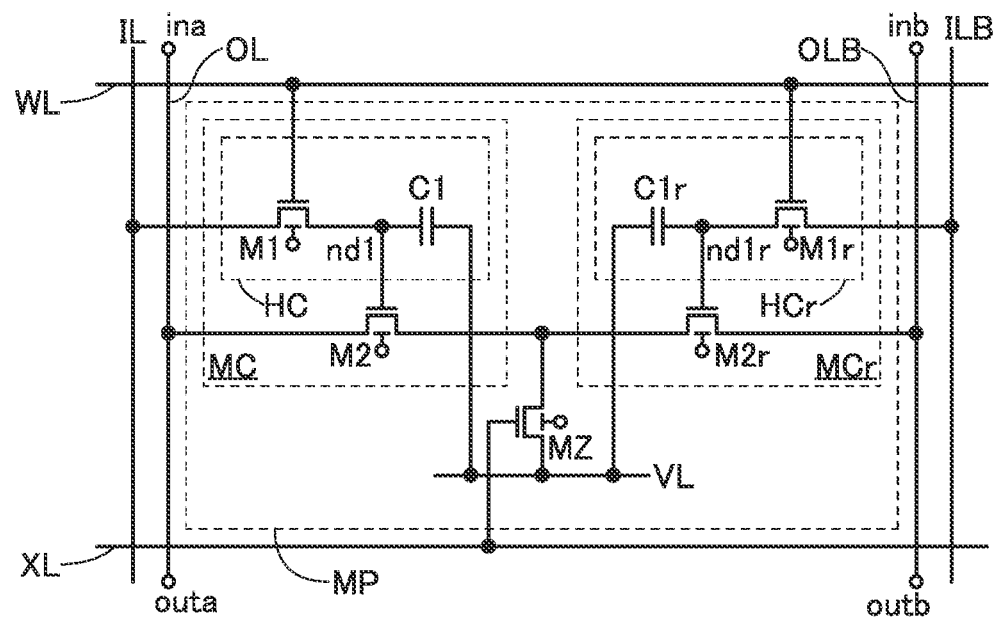
FIG. 27A and FIG. 27B are circuit diagrams showing configuration examples of a circuit included in a semiconductor device.

For example, the circuit MP in FIG. 22A described in Configuration example 7 can be modified into a circuit that can be used as the circuit MP in FIG. 5A. The circuit MP illustrated in FIG. 27A is a circuit that can be used as the circuit MP in FIG. 5A, and is a modification example of the circuit MP in FIG. 22A. Note that the circuit MP in FIG. 22A is different from the circuit MP in FIG. 22A in that the second terminal of the capacitor C1 is electrically connected to the wiring VL, the second terminal of the capacitor C1r is electrically connected to the wiring VL, the first terminal of the transistor M2 and the first terminal of the transistor M2 are electrically connected to the first terminal of the transistor MZ, and the transistor M3 and the transistor M3r are not provided, for example. Note that for the operation of FIG. 27A, the description of the operation example of the circuit MP in FIG. 24A, the circuit MP in FIG. 22A, or the like is referred to.

Figure 27B:
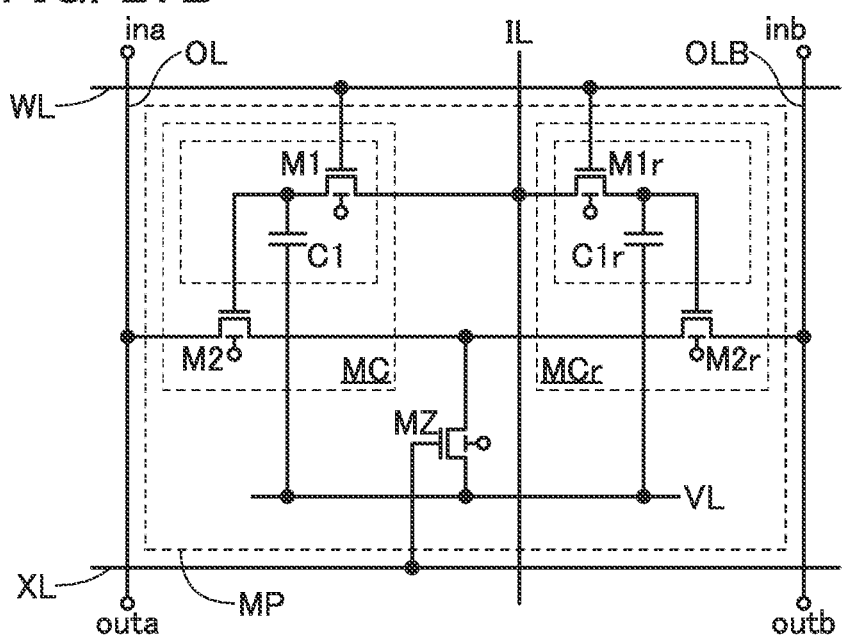

In the case where the circuit MP in FIG. 27A is used for the arithmetic circuit 120 in FIG. 6, for example, the configuration of the circuit MP in FIG. 27A may be changed into that of the circuit MP illustrated in FIG. 27B. The circuit MP in FIG. 27B has a configuration in which the wiring IL and the wiring ILB are combined into one wiring which is the wiring IL in the circuit MP in FIG. 27A. Note that the wiring XL illustrated in FIG. 27B corresponds to any one of the wiring XLS[1] to the wiring XLS[m] illustrated in FIG. 6, and the wiring WL illustrated in FIG. 27B corresponds to any one of the wiring WLS[1] to the wiring WLS[m] illustrated in FIG. 6.

Note that this embodiment can be combined with other embodiments in this specification as appropriate.

Embodiment 3

In this embodiment, an example of a structure of an OS transistor that can be used in the semiconductor device described in the above embodiment will be described.

<Structure Example of Semiconductor Device>

Figure 28:
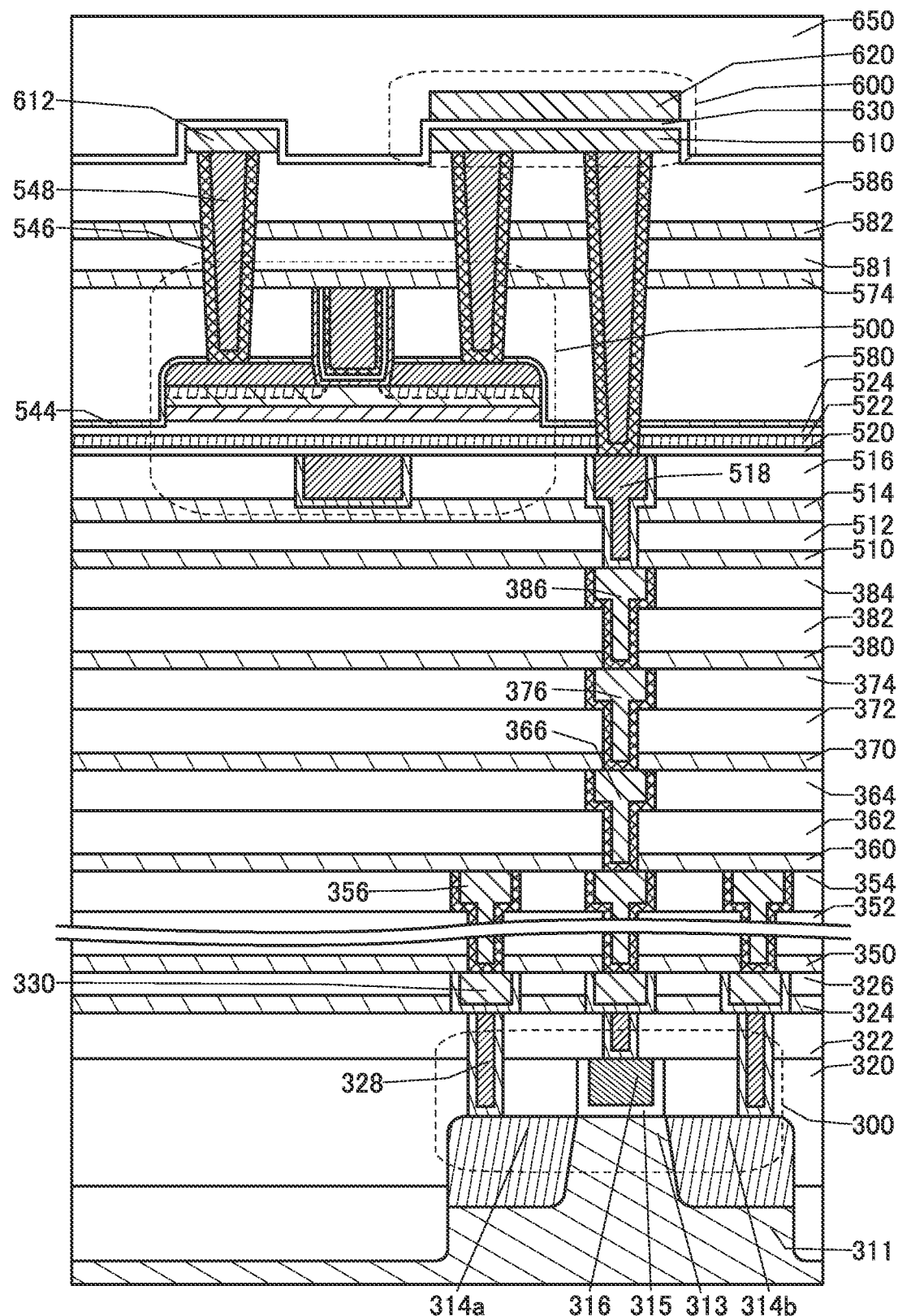
FIG. 28 is a cross-sectional view showing a structure example of a semiconductor device.
Figure 30A:
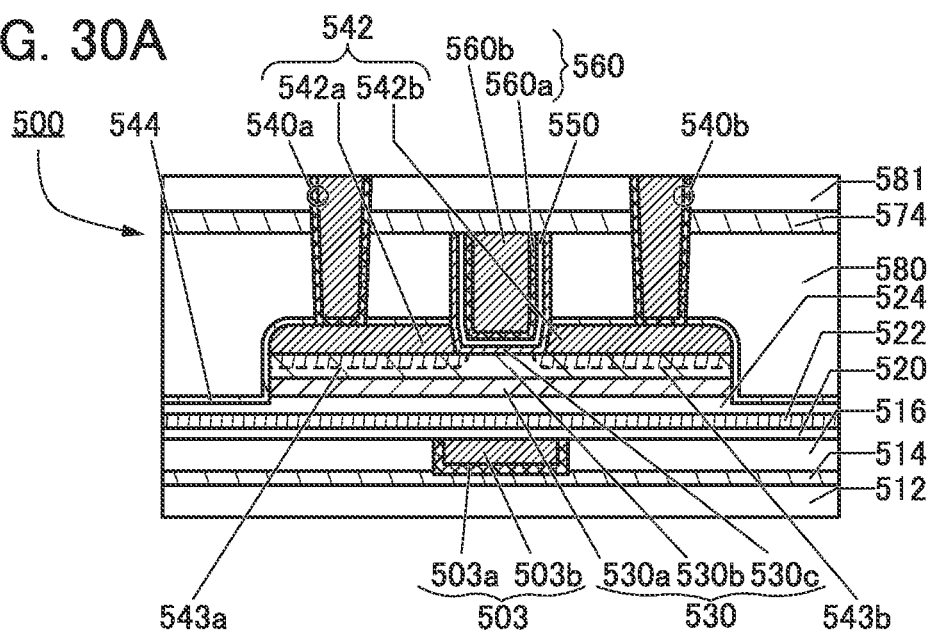
FIG. 30A, FIG. 30B, and FIG. 30C are cross-sectional views showing a structure example of a transistor.
Figure 30B:
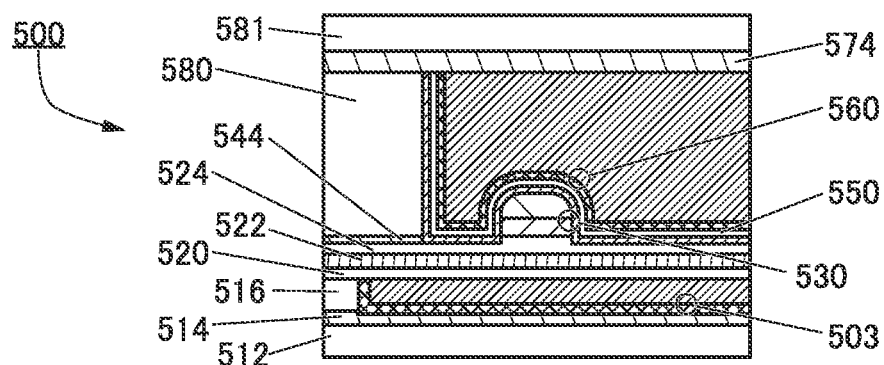
Figure 30C:
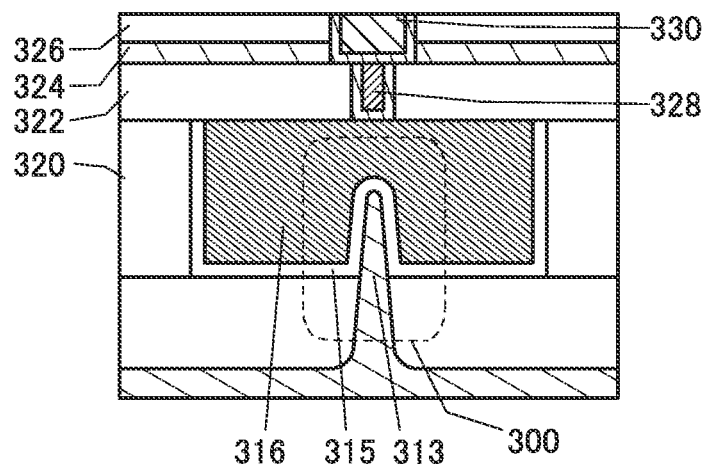

A semiconductor device illustrated in FIG. 28 includes a transistor 300, a transistor 500, and a capacitor 600. FIG. 30A is a cross-sectional view of the transistor 500 in the channel length direction, FIG. 30B is a cross-sectional view of the transistor 500 in the channel width direction, and FIG. 30C is a cross-sectional view of the transistor 300 in the channel width direction.

The transistor 500 is a transistor including a metal oxide in its channel formation region (an OS transistor). Since the off-state current of the transistor 500 is low, the use of the transistor 500 in a semiconductor device, particularly as the transistor M1, the transistor M3, the transistor M4, and the like in the circuit MP included in the arithmetic circuit 110, enables long-term retention of written data. In other words, power consumption of the semiconductor device can be reduced because the semiconductor device has a low frequency of refresh operation or requires no refresh operation.

The transistor 500 is provided above the transistor 300, and the capacitor 600 is provided above the transistor 300 and the transistor 500. Note that as the capacitor 600, the capacitor C1 or the capacitor C1r in the circuit MP can be used, for example.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistor in the above embodiment, for example.

In the transistor 300, the top surface and the side surface in the channel width direction of the semiconductor region 313 are covered with the conductor 316 with the insulator 315 positioned therebetween, as illustrated in FIG. 30C. Such a FIN-type transistor 300 can have an increased effective channel width, and thus the transistor 300 can have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 29:
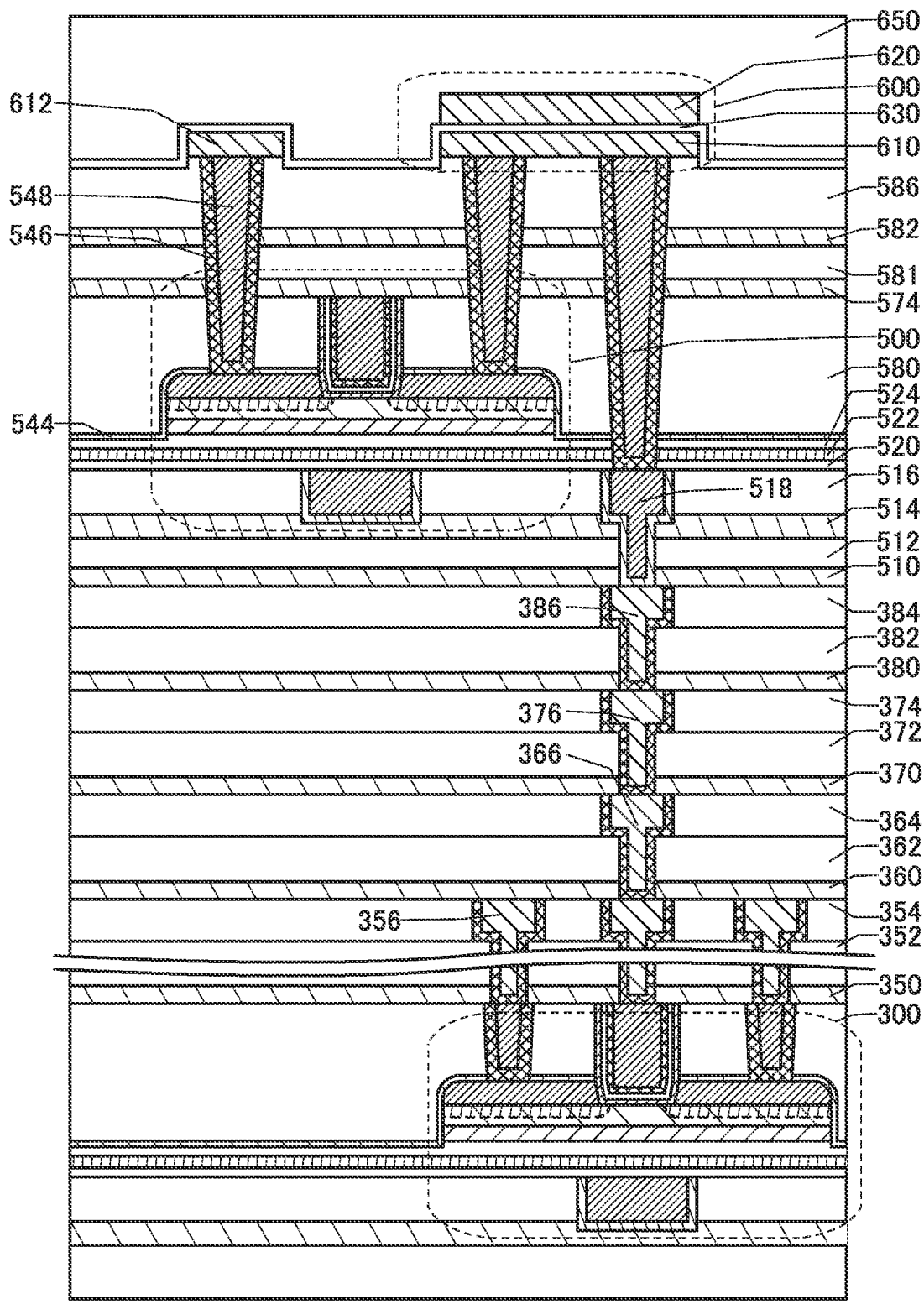
FIG. 29 is a cross-sectional view showing a structure example of a semiconductor device.

Note that the transistor 300 illustrated in FIG. 28 is just an example and is not limited to having the structure shown therein; an appropriate transistor can be used in accordance with a circuit configuration or a driving method. For example, when a semiconductor device is configured as a single-polarity circuit using only OS transistors, the transistor 300 employs a structure similar to that of the transistor 500 using an oxide semiconductor, as illustrated in FIG. 29. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents hydrogen or impurities from the substrate 311, the transistor 300, or the like from diffusing into a region where the transistor 500 is provided.

For the film having a barrier property against hydrogen, silicon nitride formed by a CVD method can be used, for example. The diffusion of hydrogen into a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 28, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, as the insulator 350, an insulator having a barrier property against hydrogen, like the insulator 324 is preferably used. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 into the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 28, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, as the insulator 360, an insulator having a barrier property against hydrogen, like the insulator 324 is preferably used. Furthermore, the conductor 366 preferably includes a conductor having a barrier property against hydrogen. The conductor having a barrier property against hydrogen is formed particularly in an opening of the insulator 360 having a barrier property against hydrogen. With this structure, the transistor 300 and the transistor 500 can be separated by the barrier layer, so that the diffusion of hydrogen from the transistor 300 into the transistor 500 can be inhibited.

A wiring layer may be provided over the insulator 364 and the conductor 366. For example, in FIG. 28, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, as the insulator 370, an insulator having a barrier property against hydrogen, like the insulator 324 is preferably used. Furthermore, the conductor 376 preferably includes a conductor having a barrier property against hydrogen. The conductor having a barrier property against hydrogen is formed particularly in an opening of the insulator 370 having a barrier property against hydrogen. With this structure, the transistor 300 and the transistor 500 can be separated by the barrier layer, so that the diffusion of hydrogen from the transistor 300 into the transistor 500 can be inhibited.

A wiring layer may be provided over the insulator 374 and the conductor 376. For example, in FIG. 28, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, as the insulator 380, an insulator having a barrier property against hydrogen, like the insulator 324 is preferably used. Furthermore, the conductor 386 preferably includes a conductor having a barrier property against hydrogen. The conductor having a barrier property against hydrogen is formed particularly in an opening of the insulator 380 having a barrier property against hydrogen. With this structure, the transistor 300 and the transistor 500 can be separated by the barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or the number of wiring layers similar to the wiring layer including the conductor 356 may be five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents hydrogen or impurities from the substrate 311, a region where the transistor 300 is provided, or the like from diffusing into the region where the transistor 500 is provided. Therefore, a material similar to that for the insulator 324 can be used.

For the film having a barrier property against hydrogen, silicon nitride formed by a CVD method can be used, for example. The diffusion of hydrogen into a semiconductor element including an oxide semiconductor, such as the transistor 500, may result in degradation of the characteristics of the semiconductor element. Thus, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided over the insulator 516.

As illustrated in FIG. 30A and FIG. 30B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and has an opening between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As illustrated in FIG. 30A and FIG. 30B, an insulator 544 is preferably provided between the insulator 580 and the oxide 530a, the oxide 530b, the conductor 542a, and the conductor 542b. As illustrated in FIG. 30A and FIG. 30B, the conductor 560 preferably includes a conductor 560a provided on the inner side of the insulator 550 and a conductor 560b provided to be embedded on the inner side of the conductor 560a. As illustrated in FIG. 30A and FIG. 30B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure in which the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 illustrated in FIG. 28 and FIG. 30A is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of the opening in the insulator 514 and the insulator 516, and a conductor 503b is formed further inside. Although the transistor 500 in which the conductor 503a and the conductor 503b are stacked is illustrated, the present invention is not limited thereto. For example, the conductor 503 may be provided as a single-layer structure or to have a stacked-layer structure of three or more layers.

Here, for the conductor 503a, it is preferable to use a conductive material having a function of inhibiting diffusion of impurities such as a hydrogen atom, a hydrogen molecule, a water molecule, and a copper atom (a conductive material through which the above impurities are less likely to pass). Alternatively, it is preferable to use a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, for the conductor 503b, it is preferable to use a conductive material that has high conductivity and contains tungsten, copper, or aluminum as its main component. Note that the conductor 503b is a single layer in the diagram but may have a stacked-layer structure, for example, a stack of titanium or titanium nitride and any of the above conductive materials.

The insulator 520, the insulator 522, the insulator 524, and the insulator 550 have a function of a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of VoH→Vo+H occurs. Part of hydrogen generated at this time is bonded to oxygen to be H$_2$O, and removed from the oxide 530 or an insulator in the vicinity of the oxide 530 in some cases. Part of hydrogen is diffused into or gettered (also referred to as gettering) by the conductor 542 (the conductor 542a and the conductor 542b) in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (V$_O$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of V$_O$+O→null. Furthermore, hydrogen remaining in the oxide 530 reacts with supplied oxygen, so that the hydrogen can be removed as H$_2$O (dehydrogenation). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be lowered while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500 in FIG. 30A and FIG. 30B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC-OS or a CAC-OS each of which will be described in Embodiment 4. Alternatively, an In—Ga oxide or an In—Zn oxide may be used as the oxide 530.

Furthermore, a metal oxide with a low carrier concentration is preferably used for the transistor 500. In the case where the carrier concentration of the metal oxide is reduced, the concentration of impurities in the metal oxide is reduced so that the density of defect states is reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier. Thus, a transistor using a metal oxide containing much hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is reduced enough. When a metal oxide in which impurities such as VoH are sufficiently reduced is used for a channel formation region of a transistor, the transistor can have stable electrical characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with sufficiently reduced concentration of impurities such as hydrogen is used for a channel formation region of a transistor, the transistor can have stable electrical characteristics.

When a metal oxide is used as the oxide 530, the carrier density of the metal oxide in the channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used as the oxide 530, contact between the conductor 542 (the conductor 542a and the conductor 542b) and the oxide 530 may diffuse oxygen in the oxide 530 into the conductor 542, resulting in oxidation of the conductor 542. It is highly possible that oxidation of the conductor 542 lowers the conductivity of the conductor 542. Note that diffusion of oxygen from the oxide 530 into the conductor 542 can be interpreted as absorption of oxygen in the oxide 530 by the conductor 542.

When oxygen in the oxide 530 is diffused into the conductor 542 (the conductor 542a and the conductor 542b), an insulating region is sometimes formed at the interface between the conductor 542a and the oxide 530b and the vicinity of the interface, and at the interface between the conductor 542b and the oxide 530b and the vicinity of the interface. Since the region contains a larger amount of oxygen than the conductor 542, the region seems to have a higher electric resistance than the conductor 542a and the conductor 542b. In this case, a three-layer structure of the conductor 542, the region, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

The above insulating region is not necessarily formed between the conductor 542 and the oxide 530b, but the insulating region may be formed between the conductor 542 and the oxide 530c, or between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than the atomic proportion of the element M to the constituent elements in the metal oxide used as the oxide 530b. The atomic proportion of the element M to In in the metal oxide used as the oxide 530a is preferably greater than the atomic proportion of the element M to In in the metal oxide used as the oxide 530b. The atomic proportion of In to the element M in the metal oxide used as the oxide 530b is preferably greater than the atomic proportion of In to the element Min the metal oxide used as the oxide 530a. As the oxide 530c, a metal oxide that can be used as the oxide 530a or the oxide 530b can be used.

The energy of the conduction band minimum of the oxide 530a and the oxide 530c is preferably higher than the energy of the conduction band minimum of the oxide 530b. In other words, the electron affinity of the oxide 530a and the oxide 530c is preferably smaller than the electron affinity of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen. Furthermore, a metal nitride film of tantalum nitride or the like is preferable because it has a barrier property against hydrogen or oxygen.

Although the conductor 542a and the conductor 542b having a single-layer structure are illustrated in FIG. 30, they may have a stacked-layer structure of two or more layers. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 30A, a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose the conductivity even after absorbing oxygen. Design is appropriately determined in consideration of required transistor characteristics.

With the insulator 544, diffusion of impurities such as water and hydrogen contained in the insulator 580 into the oxide 530b through the oxide 530c and the insulator 550 can be inhibited. Moreover, oxidation of the conductor 560 due to excess oxygen contained in the insulator 580 can be inhibited.

The insulator 550 functions as a first gate insulating film. The insulator 550 is preferably provided in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 into the conductor 560. Providing the metal oxide that inhibits oxygen diffusion suppresses diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high dielectric constant.

Although the conductor 560 functioning as the first gate electrode has a two-layer structure in FIG. 30A and FIG. 30B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. In addition, for the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

For the conductor 560b, it is preferable to use a conductive material containing tungsten, copper, or aluminum as its main component. The conductor 560b also functions as a wiring and thus a conductor having high conductivity is preferably used. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is formed to be embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when the conductor 560 has a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film deposited by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that will be described later.

An insulator 582 is provided over the insulator 581. A material having a barrier property against oxygen and hydrogen is preferably used for the insulator 582. Thus, the insulator 582 can be provided using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be provided using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be provided using a material similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. The insulator having a high barrier property against hydrogen or water is provided using a material similar to that for the insulator 522, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 28; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a semiconductor device using a transistor including an oxide semiconductor can be miniaturized or highly integrated.

<<Structure Examples of Transistors>>

The structure of the transistor 500 in the semiconductor device described in this embodiment is not limited to the above. Structure examples that can be used for the transistor 500 will be described below. Note that transistors described below are modification examples of the above transistor; therefore, differences from the above transistor are mainly described below and the description of portions identical to the above is sometimes omitted.

Transistor Structure Example 1

Figure 31A:
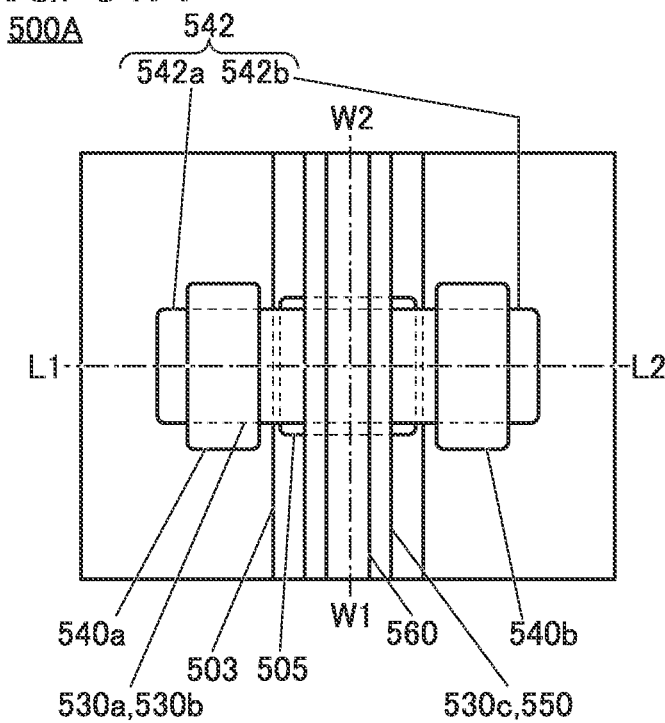
FIG. 31A, FIG. 31B, and FIG. 31C are a top view and cross-sectional views showing a structure example of a transistor.
Figure 31C:
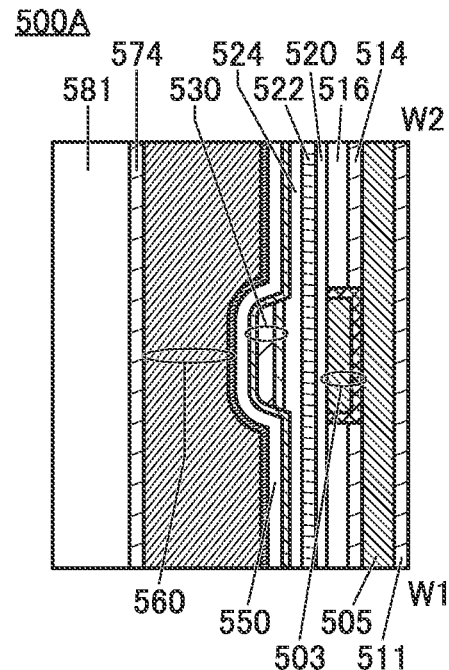
Figure 31B:
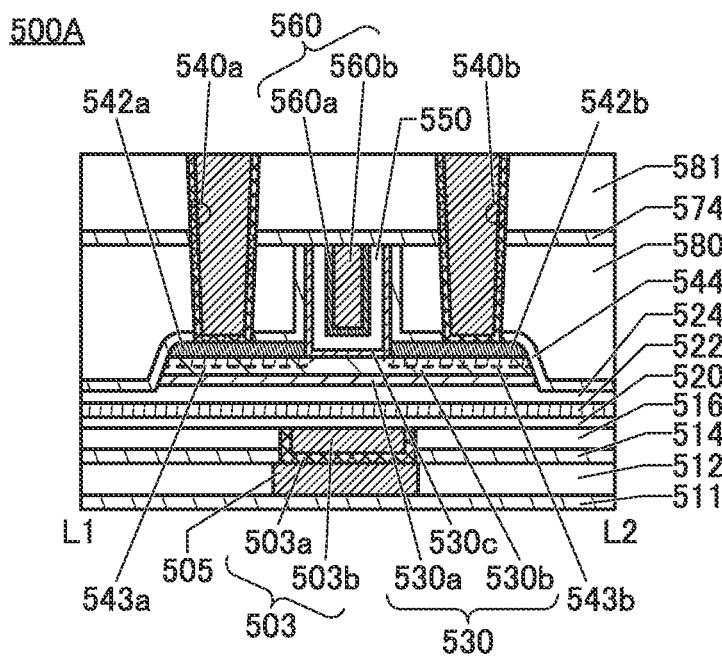

A structure example of a transistor 500A will be described with reference to FIG. 31A to FIG. 31C. FIG. 31A is a top view of the transistor 500A. FIG. 31B is a cross-sectional view of a portion along the dashed-dotted line L1-L2 in FIG. 31A. FIG. 31C is a cross-sectional view of a portion along the dashed-dotted line W1-W2 in FIG. 31A. Note that for simplification of the drawing, some components are not illustrated in the top view in FIG. 31A.

The transistor 500A illustrated in FIG. 31A to FIG. 31C has a structure in which an insulator 511 functioning as an interlayer film and the conductor 505 functioning as a wiring are added to the transistor 500 illustrated in FIG. 30A.

In the transistor 500A illustrated in FIG. 31A to FIG. 31C, the oxide 530c, the insulator 550, and the conductor 560 are provided in an opening in the insulator 580 with the insulator 544 positioned therebetween. Moreover, the oxide 530c, the insulator 550, and the conductor 560 are provided between the conductor 542a and the conductor 542b.

As the insulator 511, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

For example, the insulator 511 preferably functions as a barrier film for inhibiting impurities such as water or hydrogen from entering the transistor 500A from the substrate side. Accordingly, for the insulator 511, it is preferable to use an insulating material having a function of inhibiting diffusion of impurities such as a hydrogen atom, a hydrogen molecule, a water molecule, and a copper atom (an insulating material through which the above impurities are less likely to pass). Alternatively, it is preferable to use an insulating material having a function of inhibiting diffusion of oxygen (e.g., at least one of oxygen atoms, oxygen molecules, and the like) (an insulating material through which the above oxygen is less likely to pass). Further alternatively, aluminum oxide or silicon nitride, for example, may be used for the insulator 511. This structure can inhibit diffusion of impurities such as hydrogen or water to the transistor 500A side from the substrate side through the insulator 511.

For example, the permittivity of the insulator 512 is preferably lower than that of the insulator 511. The use of a material having a low permittivity for the interlayer film can reduce the parasitic capacitance between wirings.

The conductor 505 is formed to be embedded in the insulator 512. Here, the top surface of the conductor 505 and the top surface of the insulator 512 can be at substantially the same level. Although the conductor 505 is shown as a single layer, the present invention is not limited to this. For example, the conductor 505 may have a multilayer film structure of two or more layers. The conductor 505 is preferably formed using a conductive material that has high conductivity and contains tungsten, copper, or aluminum as its main component.

Like the insulator 511 or the insulator 512, the insulator 514 and the insulator 516 function as interlayer films. For example, the insulator 514 preferably functions as a barrier film for inhibiting impurities such as water or hydrogen from entering the transistor 500A from the substrate side. This structure can inhibit diffusion of impurities such as hydrogen or water to the transistor 500A side from the substrate side through the insulator 514. Moreover, for example, the insulator 516 preferably has a lower permittivity than the insulator 514. The use of a material having a low permittivity for the interlayer film can reduce the parasitic capacitance between wirings.

The insulator 522 preferably has a barrier property. The insulator 522 having a barrier property functions as a layer that inhibits entry of impurities such as hydrogen into the transistor 500A from the surroundings of the transistor 500A.

The oxide 530c is preferably provided in the opening in the insulator 580 with the insulator 544 positioned therebetween. When the insulator 544 has a barrier property, diffusion of impurities from the insulator 580 into the oxide 530 can be inhibited.

A barrier layer may be provided over the conductor 542a and the conductor 542b. The barrier layer is preferably formed using a material having a barrier property against oxygen or hydrogen. This structure can inhibit oxidation of the conductor 542a and the conductor 542b at the time of depositing the insulator 544.

For the barrier layer, for example, a metal oxide can be used. In particular, an insulating film of aluminum oxide, hafnium oxide, gallium oxide, or the like, which has a barrier property against oxygen and hydrogen, is preferably used. Alternatively, silicon nitride deposited by a CVD method may be used.

When the barrier layer is included, the range of choices for the material of the conductor 542a and the conductor 542b can be expanded. For example, for the conductor 542a and the conductor 542b, it is possible to use a material with a low oxidation resistance and high conductivity, such as tungsten or aluminum. Furthermore, a conductor that can be easily deposited or processed can be used, for example.

The insulator 550 functions as a first gate insulating film. The insulator 550 is preferably provided in the opening in the insulator 580 with the oxide 530c and the insulator 544 positioned therebetween.

Like the conductor 503, the conductor 540a and the conductor 540b can be a single layer or stacked layers using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, by employing a stacked-layer structure of tantalum nitride or the like, which is a conductor having a barrier property against hydrogen and oxygen, and tungsten, which has high conductivity, the conductor 540a and the conductor 540b can inhibit diffusion of impurities from the outside while maintaining conductivity as wirings.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, stable electrical characteristics, and high reliability can be provided.

Transistor Structure Example 2

Figure 32A:
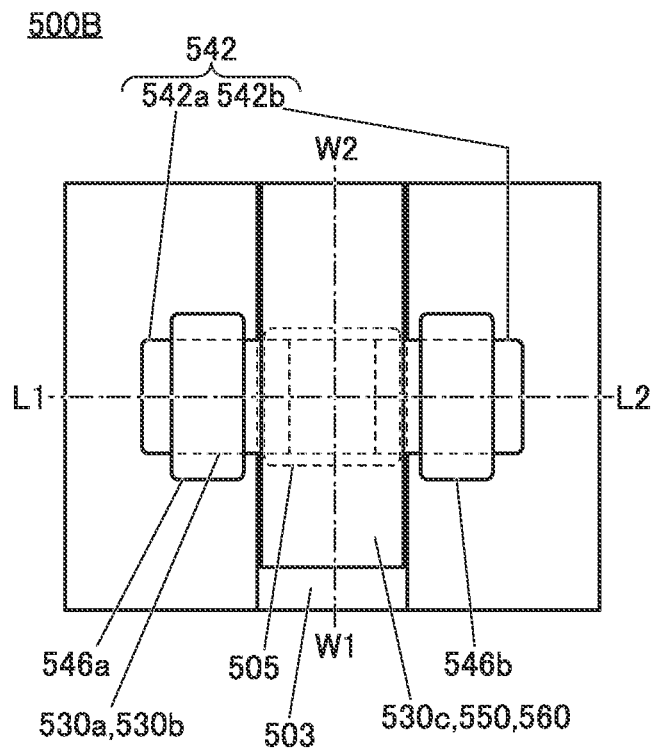
FIG. 32A, FIG. 32B, and FIG. 32C are a top view and cross-sectional views showing a structure example of a transistor.
Figure 32C:
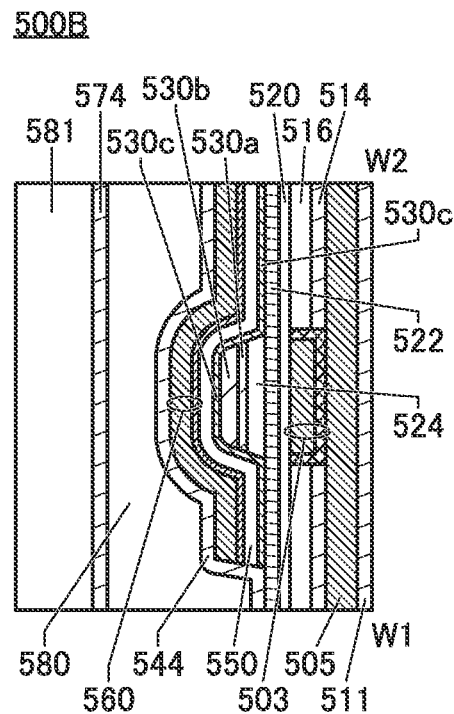
Figure 32B:
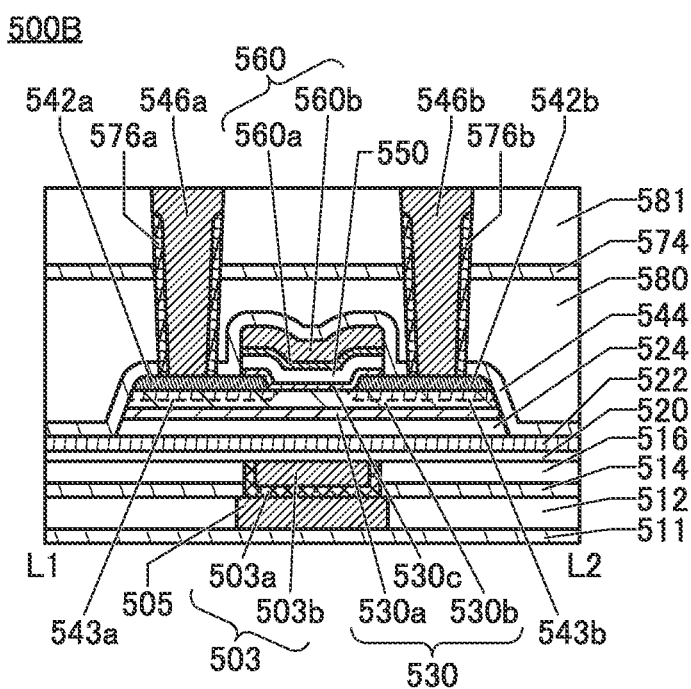

A structure example of a transistor 500B will be described with reference to FIG. 32A to FIG. 32C. FIG. 32A is a top view of the transistor 500B. FIG. 32B is a cross-sectional view of a portion along the dashed-dotted line L1-L2 in FIG. 32A. FIG. 32C is a cross-sectional view of a portion along the dashed-dotted line W1-W2 in FIG. 32A. Note that for simplification of the drawing, some components are not illustrated in the top view in FIG. 32A.

The transistor 500B is a modification example of the transistor 500A. Therefore, differences from the transistor 500A are mainly described to avoid repeated description.

The transistor 500B includes a region where the conductor 542a (the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover a top surface and a side surface of the conductor 560, a side surface of the insulator 550, and a side surface of the oxide 530c.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576a (an insulator 576b) having a barrier property is provided between the insulator 580 and the conductor 546a (the conductor 546b) serving as a contact plug. Providing the insulator 576a (the insulator 576b) can inhibit oxygen in the insulator 580 from reacting with the conductor 546 and oxidizing the conductor 546.

Furthermore, with the insulator 576a (the insulator 576b) having a barrier property, the range of choices for the materials for the conductors used as plugs and wirings can be expanded. The use of a metal material having an oxygen absorbing property and high conductivity for the conductor 546a (the insulator 546b), for example, can provide a semiconductor device with low power consumption. Specifically, it is possible to use a material with a low oxidation resistance and high conductivity, such as tungsten or aluminum. Furthermore, a conductor that can be easily deposited or processed can be used, for example.

Transistor Structure Example 3

Figures 33A, 33B, 33C:
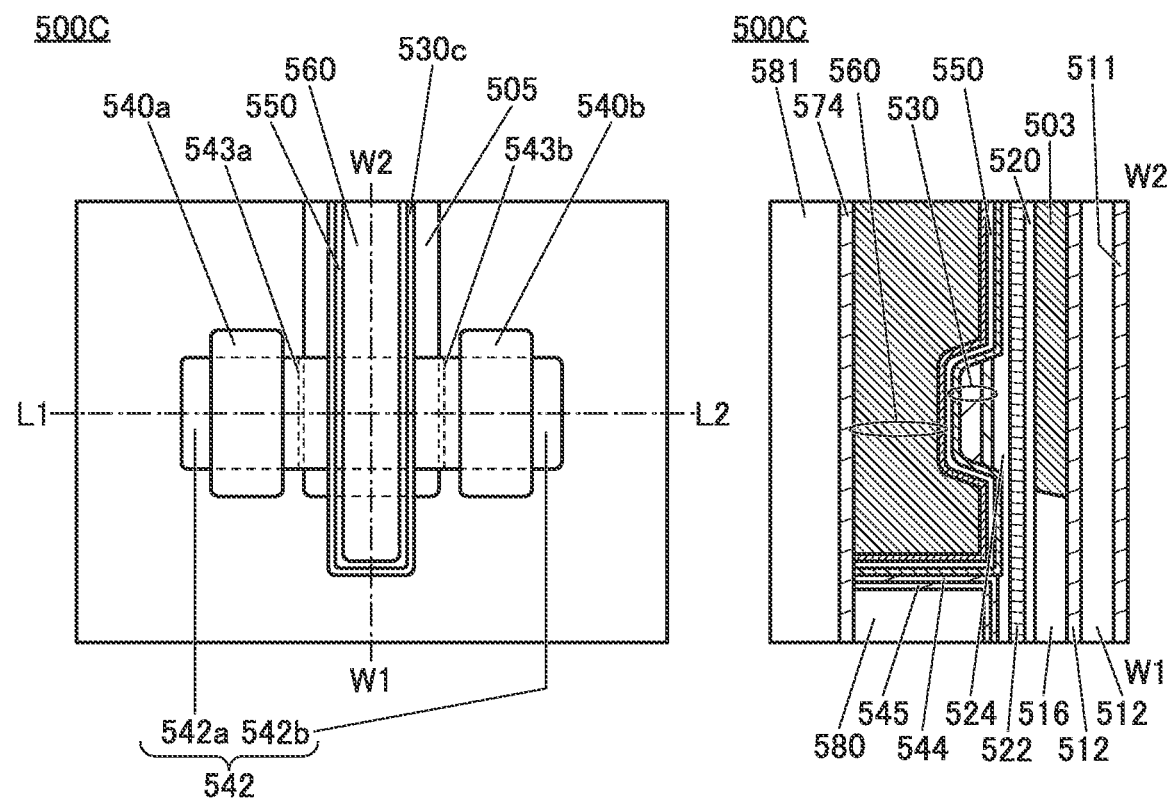
FIG. 33A, FIG. 33B, and FIG. 33C are a top view and cross-sectional views showing a structure example of a transistor.

A structure example of a transistor 500C will be described with reference to FIG. 33A to FIG. 33C. FIG. 33A is a top view of the transistor 500C. FIG. 33B is a cross-sectional view of a portion along the dashed-dotted line L1-L2 in FIG. 33A. FIG. 33C is a cross-sectional view of a portion along the dashed-dotted line W1-W2 in FIG. 33A. Note that for simplification of the drawing, some components are not illustrated in the top view in FIG. 33A.

The transistor 500C is a modification example of the transistor 500A. Therefore, differences from the transistor 500A are mainly described to avoid repeated description.

The transistor 500C illustrated in FIG. 33A to FIG. 33C includes a conductor 547a between the conductor 542a and the oxide 530b, and a conductor 547b between the conductor 542b and the oxide 530b. The conductor 542a (the conductor 542b) has a region that extends beyond the top surface of the conductor 547a (the conductor 547b) and its side surface close to the conductor 560 and is in contact with the top surface of the oxide 530b. Here, the conductor 547a and the conductor 547b are formed using a conductor that can be used as the conductor 542a and the conductor 542b. Furthermore, the conductor 547a and the conductor 547b are preferably thicker than at least the conductor 542a and the conductor 542b.

In the transistor 500C illustrated in FIG. 33A to FIG. 33C, because of the above structure, the conductor 542a and the conductor 542b can be closer to the conductor 560 than in the transistor 500A. Alternatively, the conductor 560 and the end portion of the conductor 542a and the end portion of the conductor 542b can overlap with each other. Accordingly, the effective channel length of the transistor 500C can be shortened, and the on-state current and the frequency characteristics can be improved.

The conductor 547a (the conductor 547b) is preferably provided to overlap with the conductor 542a (the conductor 542b). With this structure, the conductor 547a (the conductor 547b) can function as a stopper to prevent over-etching of the oxide 530b in etching for forming the opening in which the conductor 540a (the conductor 540b) is to be embedded.

The transistor 500C illustrated in FIG. 33A to FIG. 33C has a structure in which an insulator 545 is positioned on and in contact with the insulator 544. The insulator 544 preferably functions as a barrier insulating film for inhibiting impurities such as water or hydrogen and excess oxygen from entering the transistor 500C from the insulator 580 side. As the insulator 545, an insulator that can be used as the insulator 544 can be used. As the insulator 544, a nitride insulator such as aluminum nitride, aluminum titanium nitride, titanium nitride, silicon nitride, or silicon nitride oxide may be used, for example.

Unlike in the transistor 500A in FIG. 31A to FIG. 31C, the conductor 503 has a single-layer structure in the transistor 500C in FIG. 33A to FIG. 33C. In this case, an insulating film to be the insulator 516 is deposited over the patterned conductor 503, and an upper portion of the insulating film is removed by a CMP method or the like until the top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of the insulating layer formed over the conductor 503 and the increase in crystallinity of the oxide 530b and the oxide 530c.

Transistor Structure Example 4

Figure 34A:
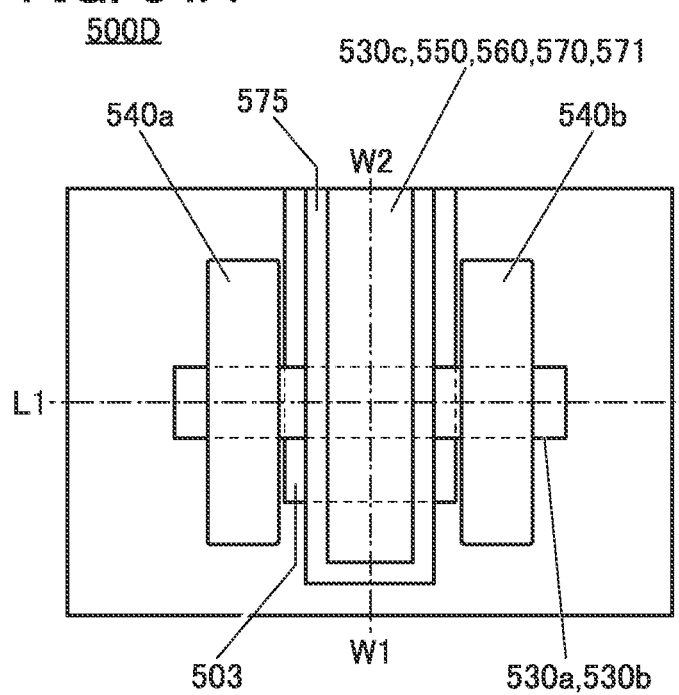
FIG. 34A, FIG. 34B, and FIG. 34C are a top view and cross-sectional views showing a structure example of a transistor.
Figure 34C:
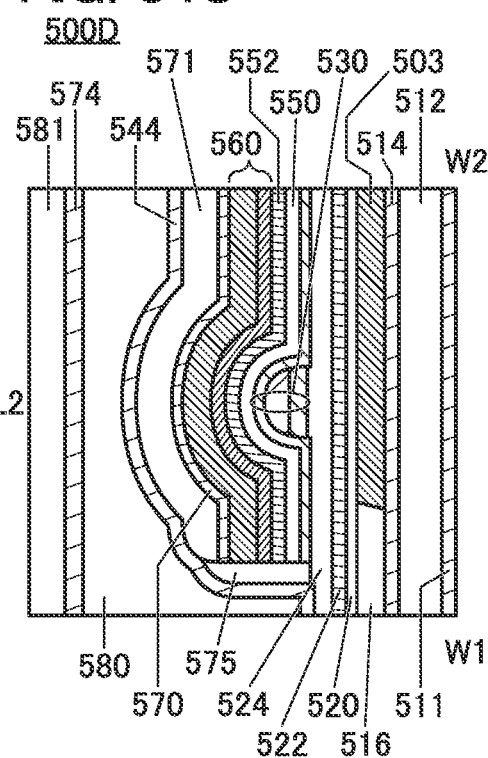
Figure 34B:
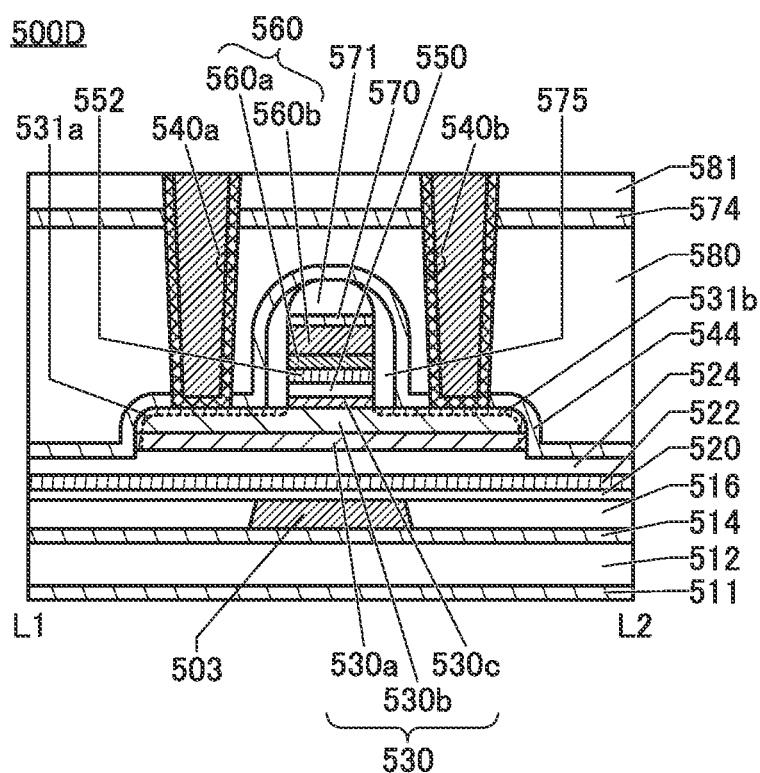

A structure example of a transistor 500D will be described with reference to FIG. 34A to FIG. 34C. FIG. 34A is a top view of the transistor 500D. FIG. 34B is a cross-sectional view of a portion along the dashed-dotted line L1-L2 in FIG. 34A. FIG. 34C is a cross-sectional view of a portion along the dashed-dotted line W1-W2 in FIG. 34A. Note that for simplification of the drawing, some components are not illustrated in the top view in FIG. 34A.

The transistor 500D is a modification example of the above transistors. Therefore, differences from the above transistors are mainly described to avoid repeated description.

The transistor 500D illustrated in FIG. 34A to FIG. 34C differs from the transistor 500 and the transistor 500A to the transistor 500C in not having the conductor 542a and the conductor 542b and in including a region 531a and a region 531b on part of the exposed surface of the oxide 530b. One of the region 531a and the region 531b functions as a source region, and the other functions as a drain region.

Moreover, in the transistor 500D, the conductor 505 is not provided as in the transistor 500C in FIG. 33A to FIG. 33C, and the conductor 503 having a function of a second gate also functions as a wiring. The transistor 500D includes the insulator 550 over the oxide 530c and a metal oxide 552 over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be suppressed.

Note that the metal oxide 552 may have a function of part of the first gate. For example, an oxide semiconductor that can be used as the oxide 530 can be used as the metal oxide 552. In this case, when the conductor 560 is deposited by a sputtering method, the electrical resistance of the metal oxide 552 is lowered so that the metal oxide 552 can be a conductive layer. Such a conductor can be referred to as an OC (Oxide Conductor) electrode.

The metal oxide 552 may have a function of part of a gate insulating film. For that reason, when silicon oxide, silicon oxynitride, or the like is used for the insulator 550, the metal oxide 552 is preferably a metal oxide that is a high-k material with a high dielectric constant. Such a stacked-layer structure can have thermal stability and a high dielectric constant. Accordingly, a gate potential that is applied during operation of the transistor can be lowered while the physical thickness is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 500D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one or more selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately determined in consideration of required transistor characteristics.

The insulator 570 is preferably formed using an insulating material having a function of inhibiting transmission of oxygen and impurities such as water or hydrogen. For example, aluminum oxide or hafnium oxide is preferably used. Thus, oxidation of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed so that the side surface of the conductor 560 is substantially perpendicular; specifically, the angle formed by the side surface of the conductor 560 and the substrate surface can be greater than or equal to 75° and less than or equal to 100°, preferably greater than or equal to 80° and less than or equal to 95°.

For the insulator 571, an insulating material having a function of inhibiting transmission of oxygen and impurities such as water or hydrogen may be used so that the insulator 571 also functions as a barrier layer. In this case, the insulator 570 is not necessarily provided.

Parts of the insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 500D includes the region 531a and the region 531b on part of the exposed surface of the oxide 530b. One of the region 531a and the region 531b functions as the source region, and the other functions as the drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an impurity element refers to an element other than main constituent elements.

Alternatively, the region 531a and the region 531b can be formed in such manner that, after part of the surface of the oxide 530b is exposed, a metal film is deposited and then heat treatment is performed so that the element contained in the metal film is diffused into the oxide 530b.

The electrical resistivity of some regions of the oxide 530b to which the impurity element has been added decreases. For that reason, the region 531a and the region 531b are sometimes referred to impurity regions or low-resistance regions.

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between the channel formation region and the source/drain region (the region 531a or the region 531b). The formation of the region 531a and the region 531b in a self-aligned manner achieves a higher on-state current, a lower threshold voltage, and a higher operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 575. In this case, the insulator 575 serves as a mask like the insulator 571 or the like. Thus, the impurity element is not added to the region of the oxide 530b overlapping with the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. The insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably deposited by a sputtering method. When a sputtering method is used, an insulator containing few impurities such as water or hydrogen can be deposited. For example, aluminum oxide is preferably used for the insulator 544.

Note that an oxide film deposited by a sputtering method may extract hydrogen from the component over which the oxide film is deposited. For that reason, the hydrogen concentration in the oxide 530 and the insulator 575 can be reduced when the insulator 544 absorbs hydrogen and water from the oxide 530 and the insulator 575.

Transistor Structure Example 5

Figure 35A:
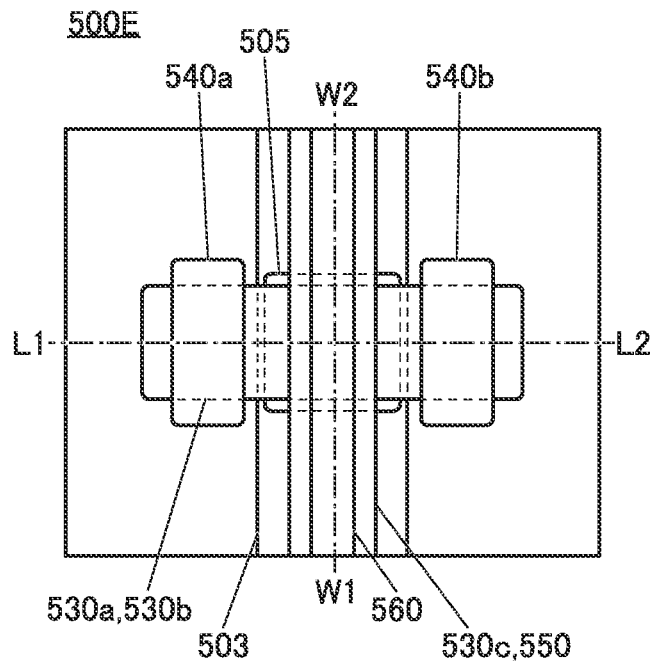
FIG. 35A, FIG. 35B, and FIG. 35C are a top view and cross-sectional views showing a structure example of a transistor.
Figure 35C:
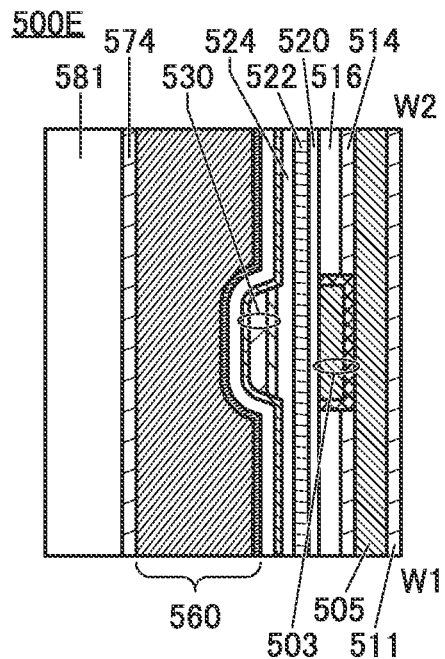
Figure 35B:
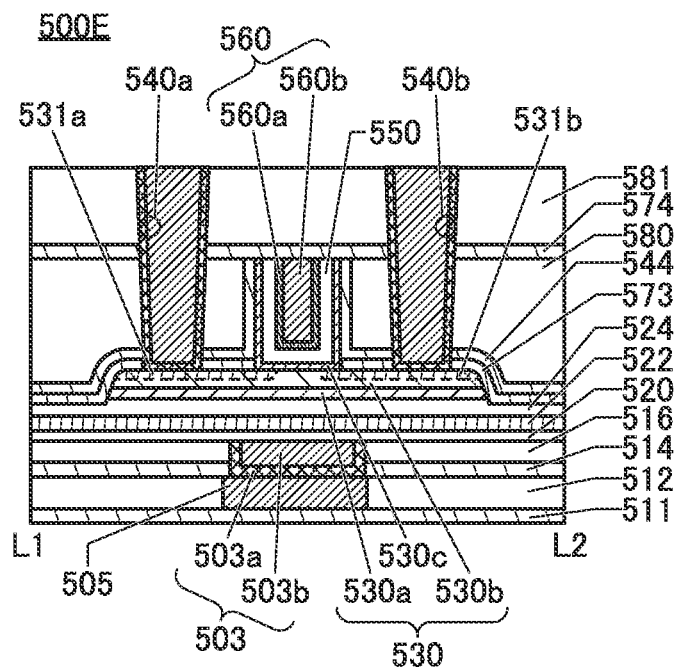

A structure example of a transistor 500E will be described with reference to FIG. 35A to FIG. 35C. FIG. 35A is atop view of the transistor 500E. FIG. 35B is a cross-sectional view of a portion along the dashed-dotted line L1-L2 in FIG. 35A. FIG. 35C is a cross-sectional view of a portion along the dashed-dotted line W1-W2 in FIG. 35A. Note that for simplification of the drawing, some components are not illustrated in the top view in FIG. 35A.

The transistor 500E is a modification example of the above transistors. Therefore, differences from the above transistors are mainly described to avoid repeated description.

In FIG. 35A to FIG. 35C, as in the transistor 500D, the conductor 542a and the conductor 542b are not provided, and part of the exposed surface of the oxide 530b includes the region 531a and the region 531b. One of the region 531a and the region 531b functions as a source region, and the other functions as a drain region. Moreover, an insulator 573 is provided between the oxide 530b and the insulator 544.

The region 531a and the region 531b illustrated in FIG. 35A to FIG. 35C are regions where an element described below is added to the oxide 530b. The region 531a and the region 531b can be formed using a dummy gate, for example.

Specifically, a dummy gate is provided over the oxide 530b, and an element that reduces the resistance of some regions of the oxide 530b is added using the dummy gate as a mask. That is, the element is added to regions of the oxide 530 that do not overlap with the dummy gate, whereby the region 531a and the region 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of some regions of the oxide 530b are boron and phosphorus. Moreover, hydrogen, carbon, nitrogen, fluorine, sulfur, chlorine, titanium, a rare gas element, or the like may be used. Typical examples of rare gas elements include helium, neon, argon, krypton, and xenon. The concentration of the element can be measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530b can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be deposited over the oxide 530b and the dummy gate. Stacking the insulating film to be the insulator 573 and the insulating film to be the insulator 544 can provide a region where the region 531a or the region 531b, the oxide 530c, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at the side surface of the opening provided in the insulator 580, and the region 531a and the region 531b provided in the oxide 530b are partly exposed at the bottom surface of the opening. Next, an oxide film to be the oxide 530c, an insulating film to be the insulator 550, and a conductive film to be the conductor 560 are formed in this order in the opening, and then parts of the oxide film to be the oxide 530c, the insulating film to be the insulator 550, and the conductive film to be the conductor 560 are removed by CMP treatment or the like until the insulator 580 is exposed; consequently, the transistor illustrated in FIG. 35 can be formed.

Note that the insulator 573 and the insulator 544 are not essential components. Design is appropriately determined in consideration of required transistor characteristics.

Since the transistor illustrated in FIG. 35A to FIG. 35C is not provided with the conductor 542a and the conductor 542b, the cost can be reduced.

Transistor Structure Example 6

Although FIG. 30A and FIG. 30B illustrate the structure example in which the conductor 560 functioning as the gate is formed inside the opening in the insulator 580, it is possible to employ a structure in which the insulator is provided above the conductor, for example. FIG. 36A, FIG. 36B, FIG. 37A, and FIG. 37B illustrate a structure example of such a transistor.

Figure 36A:
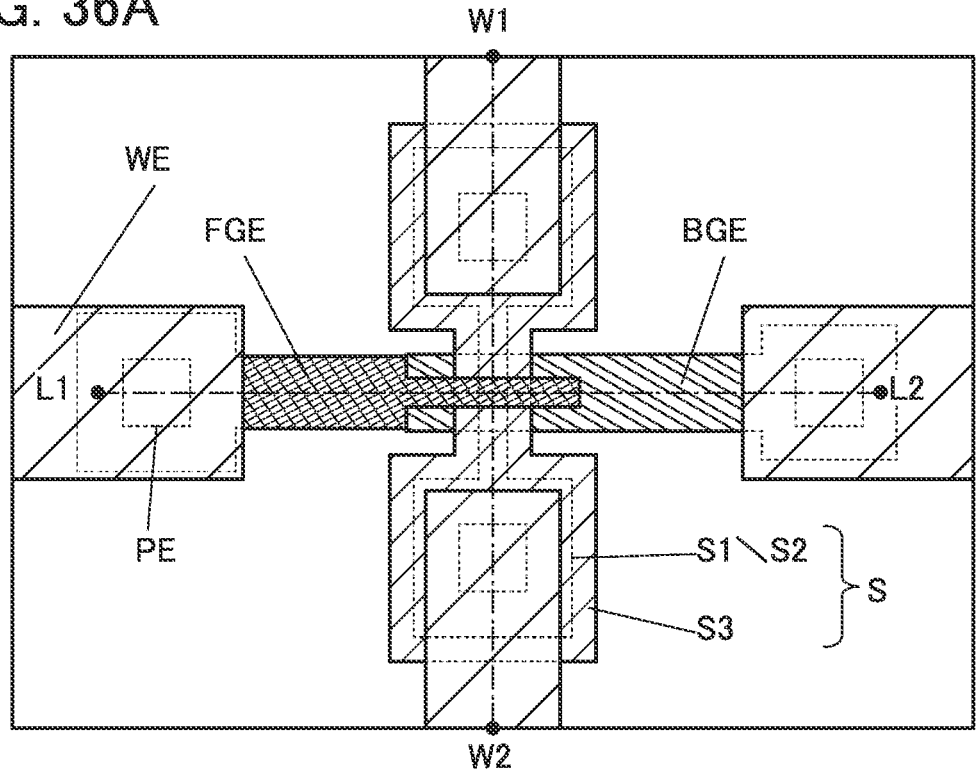
FIG. 36A and FIG. 36B are a top view and a cross-sectional view showing a structure example of a transistor.
Figure 36B:
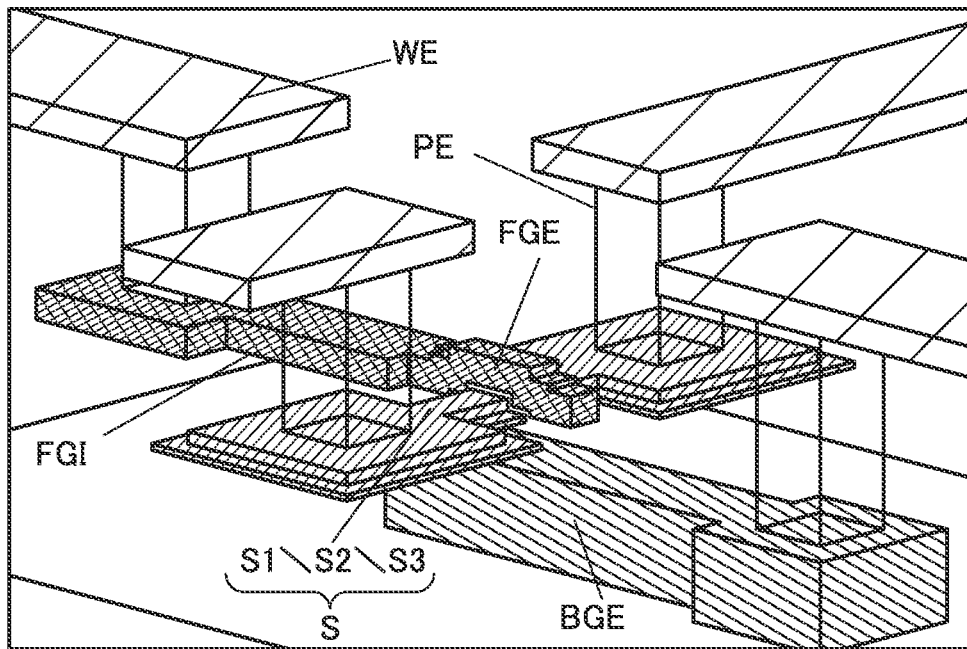
Figure 37A:
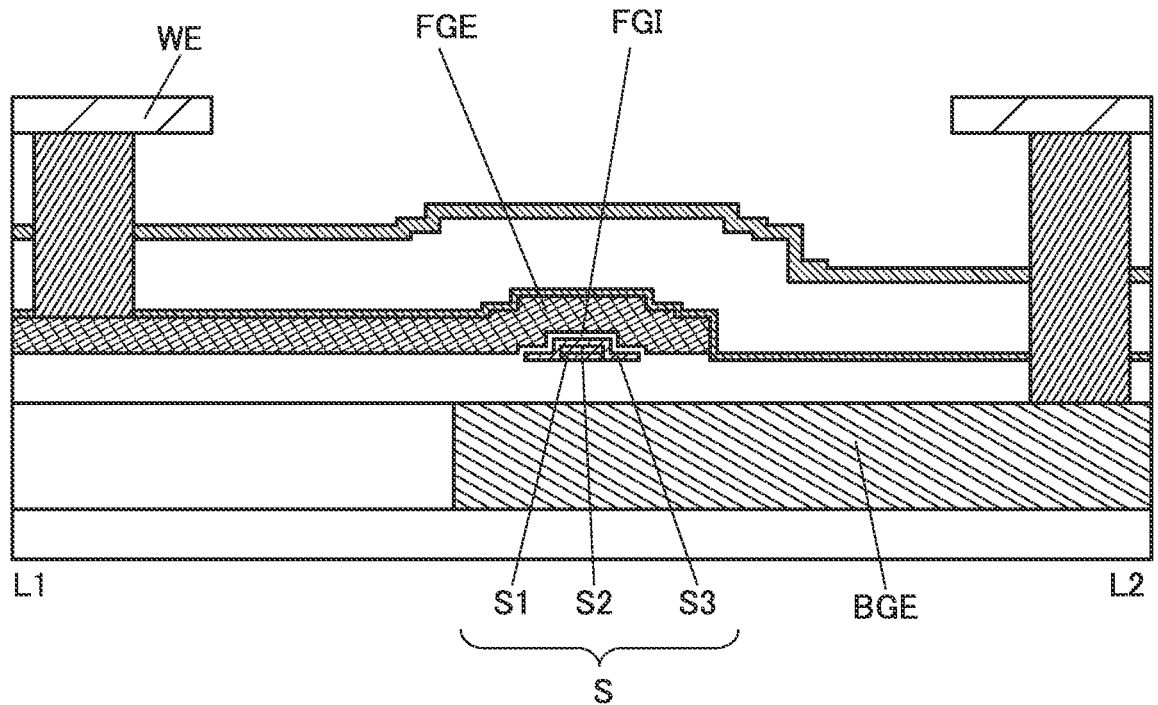
FIG. 37A and FIG. 37B are a top view and a cross-sectional view showing a structure example of a transistor.
Figure 37B:
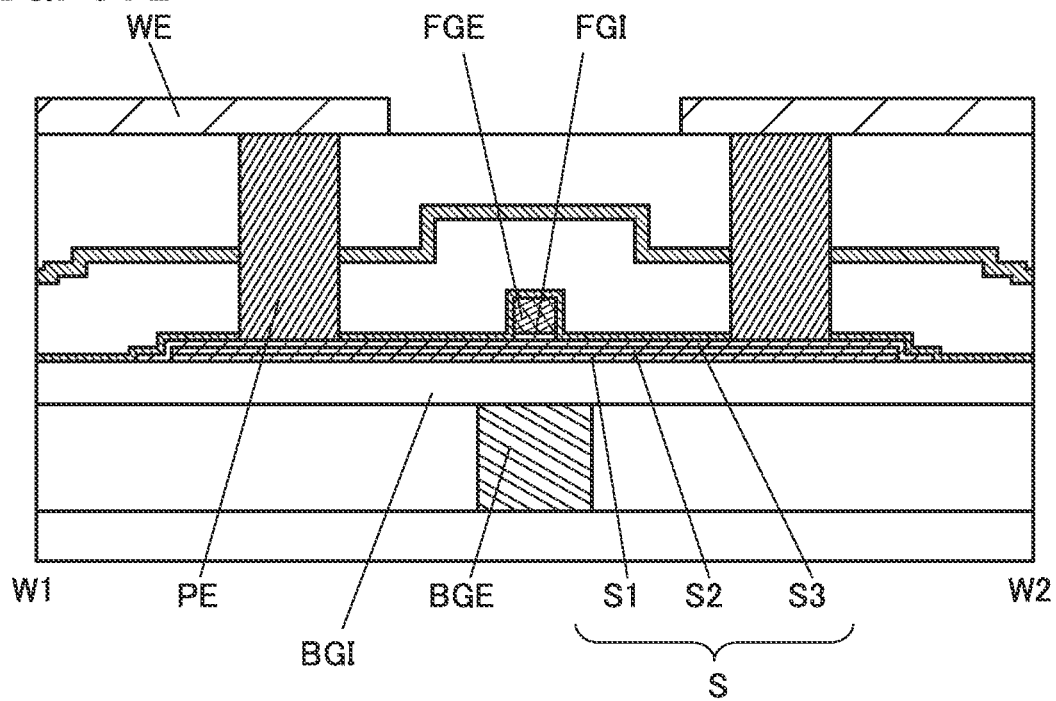

FIG. 36A is a top view of the transistor, and FIG. 36B is a perspective view of the transistor. FIG. 37A shows a cross-sectional view along L1-L2 in FIG. 36A, and FIG. 37B shows a cross-sectional view along W1-W2.

The transistor illustrated in FIG. 36A, FIG. 36B, FIG. 37A, and FIG. 37B includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S, the conductor BGE, or the conductor FGE. An example where the oxide semiconductor S includes three layers of oxides S1, S2, and S3 is shown here.

<<Structure Example of Capacitor>>

Figure 38A:
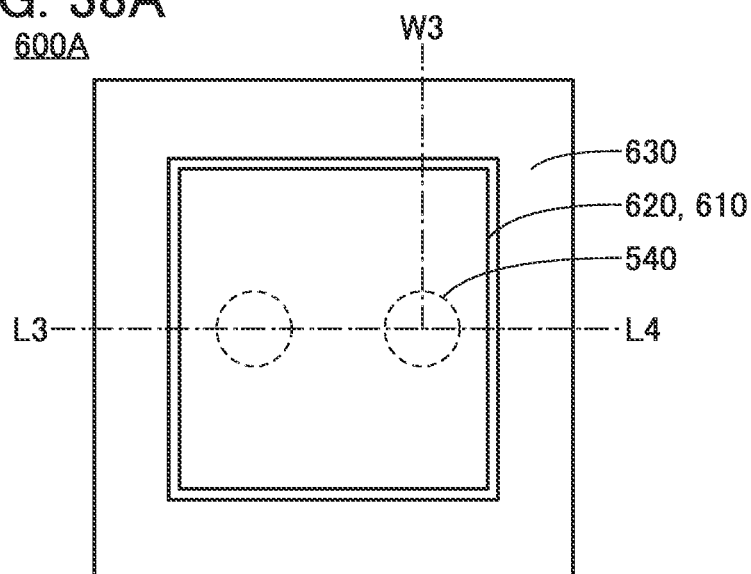
FIG. 38A, FIG. 38B, and FIG. 38C are a top view and cross-sectional views showing a structure example of a capacitor.
Figure 38B:
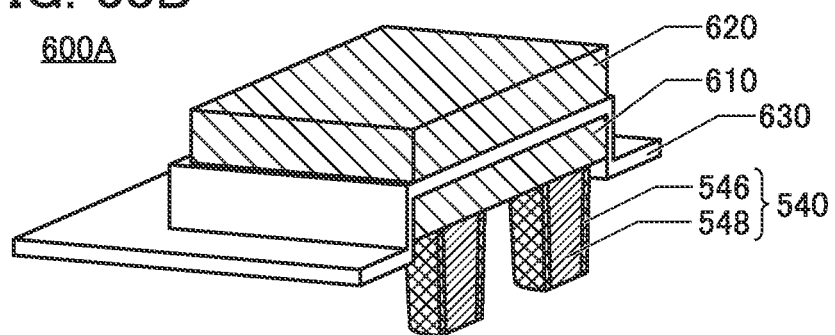
Figure 38C:
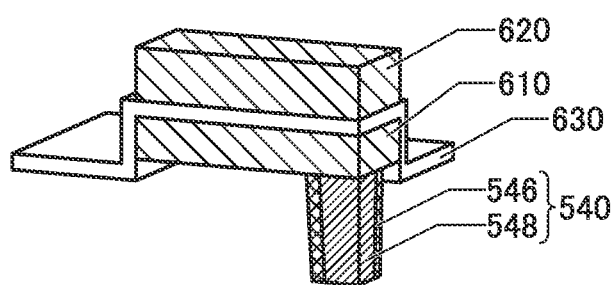

FIG. 38A to FIG. 38C illustrate a capacitor 600A as an example of the capacitor 600 that can be used in the semiconductor device shown in FIG. 28. FIG. 38A is a top view of the capacitor 600A, FIG. 38B is a perspective view illustrating a cross section of the capacitor 600A along the dashed-dotted line L3-L4, and FIG. 38C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

A bottom portion of the conductor 610 in the capacitor 600 is electrically connected to the conductor 546 and the conductor 548. The conductor 546 and the conductor 548 function as plugs or wirings for connecting to another circuit element. In FIG. 38A to FIG. 38C, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 38A to FIG. 38C.

Although the capacitor 600 illustrated in each of FIG. 28, FIG. 29, and FIG. 38A to FIG. 38C is a planar capacitor, the shape of the capacitor is not limited thereto. For example, the capacitor 600 may be a cylindrical capacitor 600B illustrated in FIG. 39A to FIG. 39C.

Figure 39A:
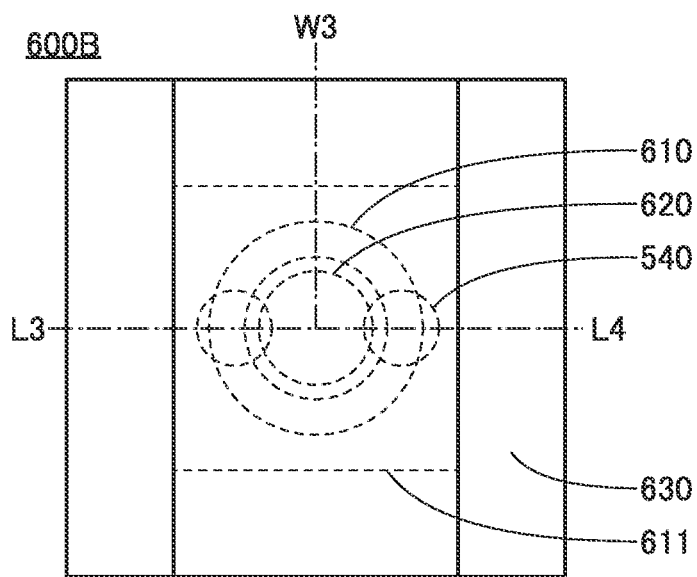
FIG. 39A, FIG. 39B, and FIG. 39C are a top view and cross-sectional views showing a structure example of a capacitor.
Figure 39B:
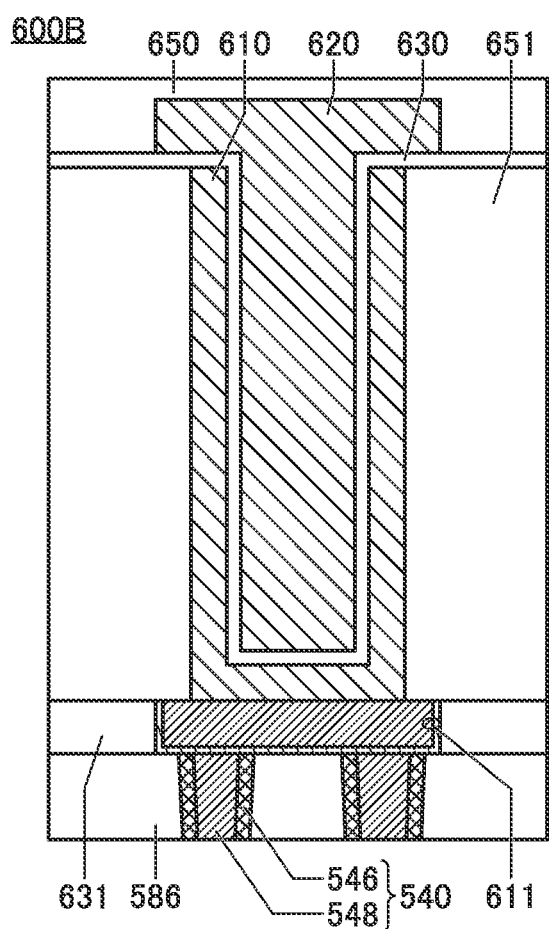
Figure 39C:
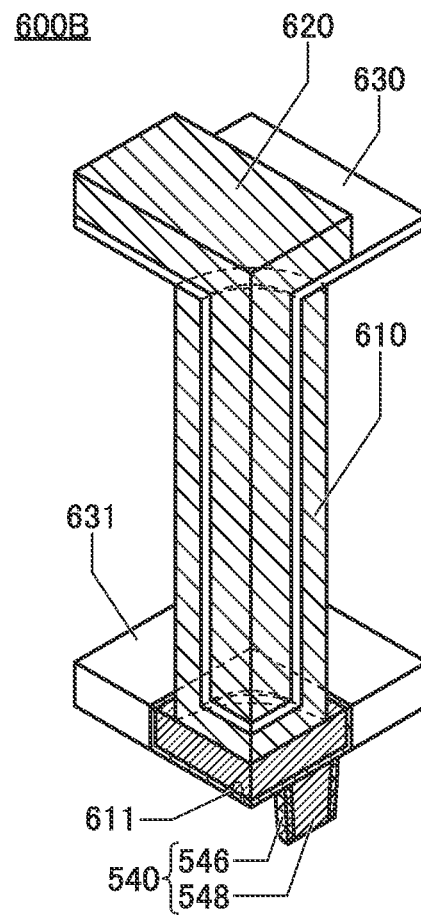

FIG. 39A is a top view of the capacitor 600B, FIG. 39B is a perspective view illustrating a cross section of the capacitor 600B along the dashed-dotted line L3-L4, and FIG. 39C is a perspective view illustrating a cross section of the capacitor 600B along the dashed-dotted line W3-L4.

In FIG. 39B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For clarification of the drawing, the insulator 586, the insulator 650, and the insulator 651 are omitted in FIG. 39C.

The insulator 631 can be provided using a material similar to that for the insulator 586, for example.

A conductor 611 is embedded in the insulator 631 to be electrically connected to the conductor 540. The conductor 611 can be provided using a material similar to that for the conductor 330 and the conductor 518, for example.

For the insulator 651, a material similar to that for the insulator 586 can be used, for example.

The insulator 651 has an opening as described above, and the opening overlaps with the conductor 611.

The conductor 610 is formed on the bottom portion and the side surface of the opening. In other words, the conductor 621 overlaps with the conductor 611 and is electrically connected to the conductor 611.

The conductor 610 is formed in such a manner that an opening is formed in the insulator 651 by an etching method or the like, and then the conductor 610 is deposited by a sputtering method, an ALD method, or the like. After that, the conductor 610 deposited over the insulator 651 is removed by a CMP (Chemical Mechanical Polishing) method or the like while the conductor 610 deposited in the opening is left.

The insulator 630 is positioned over the insulator 651 and over the formation surface of the conductor 610. Note that the insulator 630 functions as a dielectric between the pair of electrodes in the capacitor.

The conductor 620 is formed over the insulator 630 so as to fill the opening of the insulator 651.

The insulator 650 is formed to cover the insulator 630 and the conductor 620.

The capacitance of the cylindrical capacitor 600B illustrated in FIG. 39 can be higher than that of the planar capacitor 600A. Thus, when the capacitor 600B is used as the capacitor C1 and the capacitor Clr described in the above embodiment, for example, a voltage between the terminals of the capacitor can be maintained for long time.

Note that this embodiment can be combined with other embodiments in this specification as appropriate.

Embodiment 4

In this embodiment, the compositions of a CAC-OS (Cloud-Aligned Composite Oxide Semiconductor) and a CAAC-OS (c-axis Aligned Crystalline Oxide Semiconductor) which are metal oxides that can be used in the OS transistor described in the above embodiment is described. Note that in this specification and the like, CAC refers to an example of a function or a material composition and CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS (c-axis aligned crystal crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier density is preferably used for a transistor. In the case where the carrier density of an oxide semiconductor film is reduced, the impurity concentration in the oxide semiconductor film is reduced so that the density of defect states is reduced. In this specification and the like, a state with a low impurity concentration and a low density of defect states is referred to as a highly purified intrinsic or substantially highly purified intrinsic state. For example, the carrier density of the oxide semiconductor is lower than $8\times10^{11}/cm^3$, preferably lower than $1\times10^{11}/cm^3$, further preferably lower than $1\times10^{10}/cm^3$, and greater than or equal to $1\times10^{-9}/cm^3$.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with other embodiments in this specification as appropriate.

Embodiment 5

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 40A.

Figure 40A:
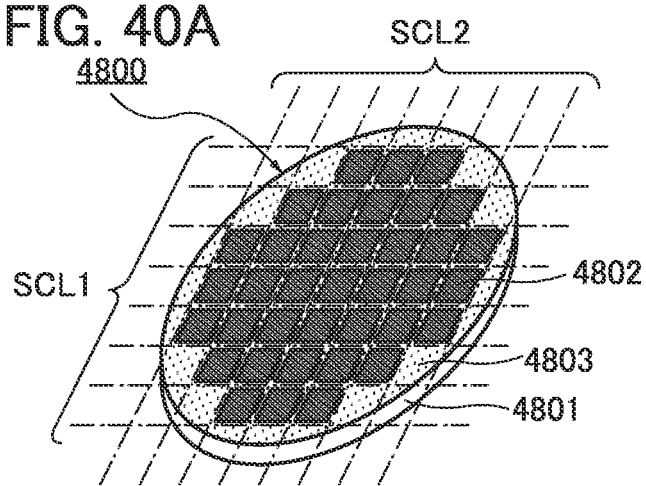
FIG. 40A, FIG. 40B, FIG. 40C, and FIG. 40D are perspective views showing examples of a semiconductor wafer and an electronic component.

A semiconductor wafer 4800 illustrated in FIG. 40A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as a dicing line or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 40B:
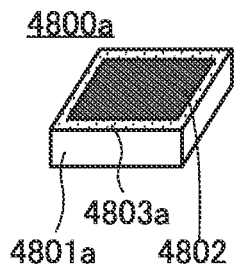

With the dicing step, a chip 4800a as illustrated in FIG. 40B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 40A. The element substrate may be a rectangular semiconductor wafer, for example. The shape of the element substrate can be changed as appropriate, depending on a manufacturing process of an element and an apparatus for manufacturing the element.

<Electronic Components>

Next, examples of electronic components incorporating the chip 4800a are described with reference to FIG. 40C and FIG. 40D.

Figure 40C:
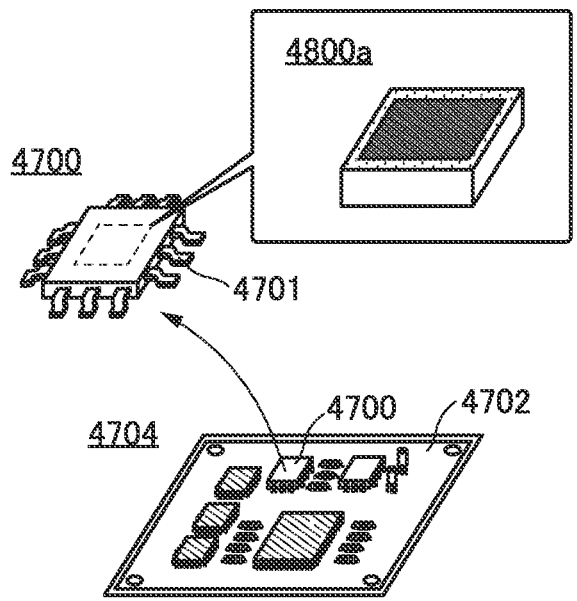

FIG. 40C is a perspective view of an electronic component 4700 and a substrate (a mounting board 4704) on which the electronic component 4700 is mounted. The electronic component 4700 illustrated in FIG. 40C includes a lead 4701 and the above-described chip 4800a, and functions as an IC chip or the like. In particular, in this specification and the like, the electronic component 4700 including the semiconductor device such as the arithmetic circuit 110 described in the above embodiment is referred to as a brain-morphic processor (BMP).

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 40C, the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 40D:
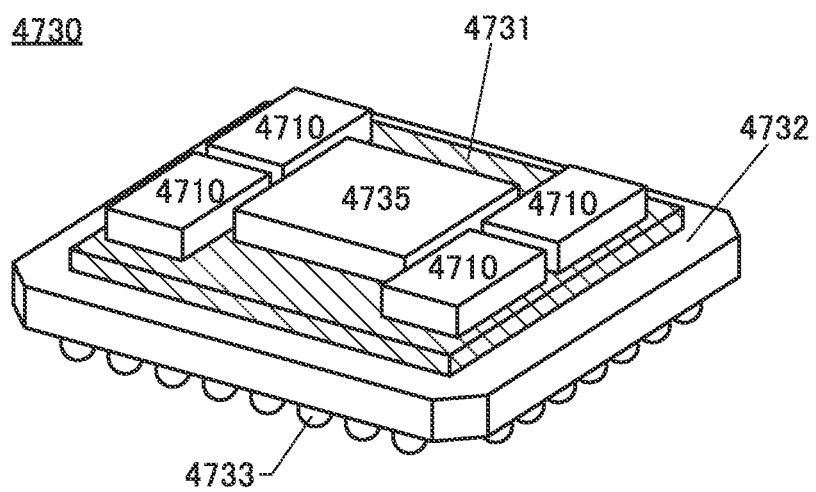

FIG. 40D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode may be provided in the interposer 4731 and used to electrically connect an integrated circuit and the package substrate 4732. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 40D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with other embodiments in this specification as appropriate.

Embodiment 6

Figure 41:
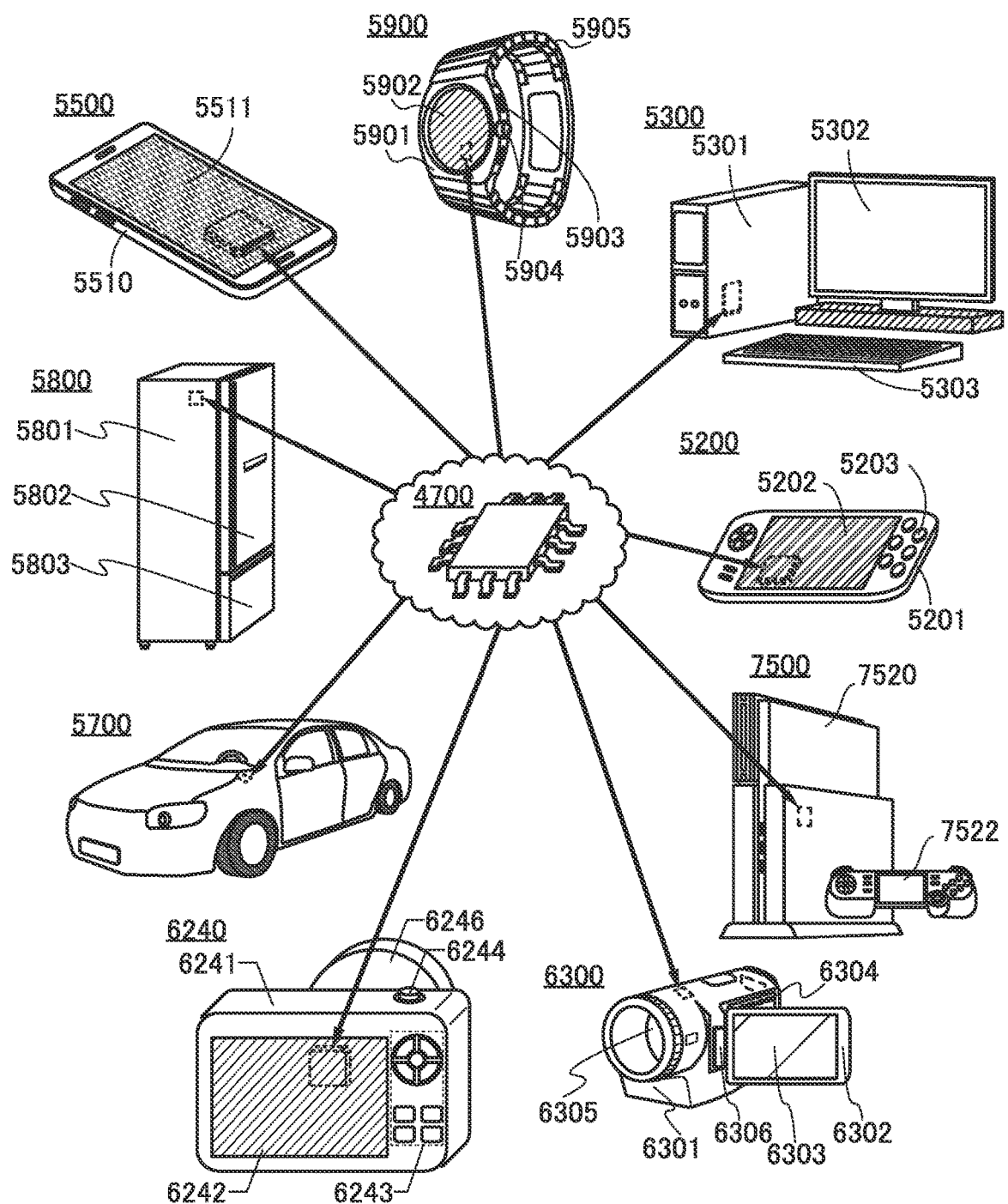
FIG. 41 shows perspective views showing examples of electronic devices.

This embodiment will show examples of electronic devices including the semiconductor device described in the above embodiment. FIG. 41 illustrates electronic devices each of which includes the electronic component 4700 (BMP) including the semiconductor device.

[Mobile Phone]

An information terminal 5500 illustrated in FIG. 41 is a mobile phone (smartphone), which is a type of information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 41 illustrates an information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application that manages the health condition of the user of the wearable terminal and a navigation system that selects the optimal route and navigates the user on the basis of the input of the destination.

[Information Terminal]

FIG. 41 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 41 illustrates the smartphone, the wearable terminal, and the desktop information terminal as examples of the electronic device, one embodiment of the present invention can also be applied to information terminals other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

FIG. 41 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

The electric refrigerator-freezer is described in this example as a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 41 illustrates a portable game machine 5200 as an example of a game machine. The portable game machine 5200 includes a housing 5201, a display portion 5202, a button 5203, and the like.

FIG. 41 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 41, the controller 7522 can include a display portion that displays a game image, and an input interface besides a button, such as a touch panel, a stick, a rotating knob, and a sliding knob, for example. The shape of the controller 7522 is not limited to that in FIG. 41, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Moreover, heat generation from a circuit can be reduced owing to low power consumption; thus, the influence of heat generation on the circuit, the peripheral circuit, and the module can be reduced.

Furthermore, when the semiconductor device described in the above embodiment is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although FIG. 41 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 41 illustrates an automobile 5700 as an example of a moving vehicle.

An instrument panel that displays a speedometer, a tachometer, a mileage, the fuel level, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying an image taken by an imaging device (not illustrated) provided on the exterior of the automobile 5700, which improves safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Although an automobile is described above as an example of a moving vehicle, moving vehicles are not limited to an automobile. Examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

[Camera]

The semiconductor device described in the above embodiment can be used for a camera.

FIG. 41 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

When the semiconductor device described in the above embodiment is used in the digital camera 6240, the digital camera 6240 with low power consumption can be achieved. Moreover, heat generation from a circuit can be reduced owing to low power consumption; thus, the influence of heat generation on the circuit, the peripheral circuit, and the module can be reduced.

Furthermore, when the semiconductor device described in the above embodiment is used in the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used for a video camera.

FIG. 41 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is used to calculate a difference in the human, the animal, the object, and the like between continuously taken image data, so that the data can be compressed.

[Extension Device for PC]

The semiconductor device described in the above embodiment can be used for a calculator such as a PC (Personal Computer) and an extension device for an information terminal.

Figure 42A:
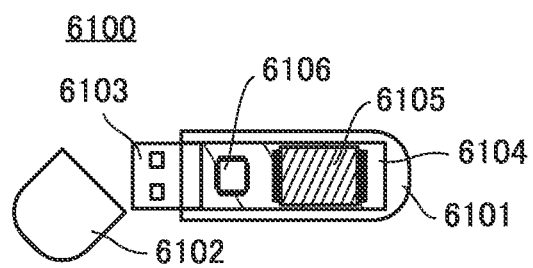
FIG. 42A is a front view showing an example of an electronic device.

FIG. 42A illustrates, as an example of the extension device, a portable extension device 6100 that includes a chip capable of arithmetic processing and is externally attached to a PC. The extension device 6100 can perform arithmetic processing using the chip when connected to a PC with a USB (Universal Serial Bus), for example. FIG. 42A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device described in the above embodiment or the like. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the extension device 6100 for a PC and the like can increase the arithmetic processing capability of the PC. Thus, a PC with insufficient processing capability can perform arithmetic operation of artificial intelligence, moving image processing, and the like.

[Broadcasting System]

The semiconductor device described in the above embodiment can be used for a broadcasting system.

Figure 42B:
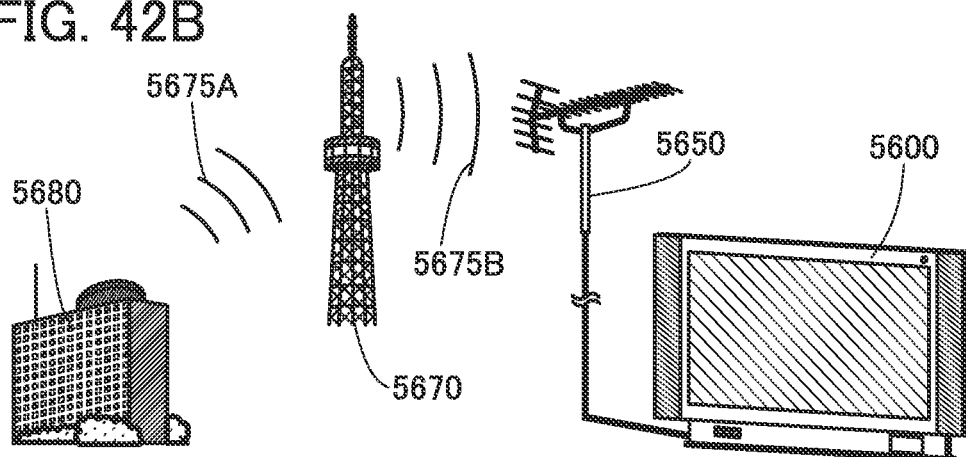
FIG. 42B and FIG. 42C are perspective views showing examples of electronic devices.

FIG. 42B schematically illustrates data transmission in a broadcasting system. Specifically, FIG. 42B illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 42B, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 42B and may be satellite broadcasting using an artificial satellite, data broadcasting using an optical line, or the like.

The above-described broadcasting system may utilize artificial intelligence by including the semiconductor device described in the above embodiment. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, by making the artificial intelligence in the recording device learn the user's preference, TV programs that suit the user's preference can be recorded automatically.

[Authentication System]

The semiconductor device described in the above embodiment can be used for an authentication system.

Figure 42C:
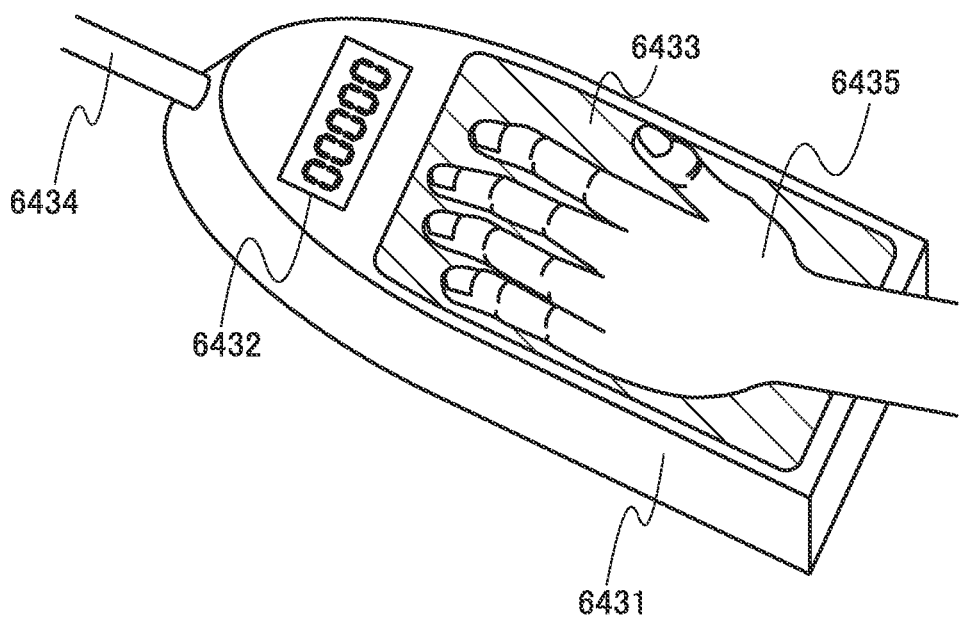

FIG. 42C illustrates a palm print authentication device including a housing 6431, a display portion 6432, a palm print reading portion 6433, and a wiring 6434.

In FIG. 42C, a palm print of a hand 6435 is obtained by the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with other embodiments in this specification as appropriate.

REFERENCE NUMERALS

ALP: array portion, ILD: circuit, WLD: circuit, XLD: circuit, AFP: circuit, MP: circuit, MP[1,1]: circuit, MP[m,1]: circuit, MP[i,j]: circuit, MP[1,n]: circuit, MP[m,n]: circuit, MC: circuit, MCr: circuit, HC: holding portion, HCr: holding portion, HCs: holding portion, HCsr: holding portion, ACTF[1]: circuit, ACTF[j]: circuit, ACTF[n]: circuit, TRF: converter circuit, CMP: comparator, CMPa: comparator, CMPb: comparator, OP: operation amplifier, OPa: operation amplifier, OPb: operation amplifier, INV1: inverter circuit, INV1r: inverter circuit, INV2: inverter circuit, INV2r: inverter circuit, INV3: inverter circuit, VinT: terminal, VrefT: terminal, VoutT: terminal, IL: wiring, IL[1]: wiring, IL[j]: wiring, IL[n]: wiring, ILB: wiring, ILB[1]: wiring, ILB[j]: wiring, ILB[n]: wiring, OL: wiring, OL[1]: wiring, OL[j]: wiring, OL[n]: wiring, OLB: wiring, OLB[1]: wiring, OLB[j]: wiring, OLB[n]: wiring, IOL[1]: wiring, IOL[j]: wiring, IOL[n]: wiring, IOLB[1]: wiring, IOLB[k]: wiring, IOLB[n]: wiring, WLS[1]: wiring, WLS[i]: wiring, WLS[m]: wiring, WL: wiring, WL[i]: wiring, W1L: wiring, W2L: wiring, W1L[i]: wiring, W2L[i]: wiring, XLS[1]: wiring, XLS[i]: wiring, XLS[m]: wiring, X1L: wiring, X2L: wiring, X1LB: wiring, X2LB: wiring, XL[i]: wiring, X1L[i]: wiring, X2L[i]: wiring, S1L: wiring, S2L: wiring, VrefL: wiring, Vref1L: wiring, Vref2L: wiring, VAL: wiring, VL: wiring, VLr: wiring, VLm: wiring, VLmr: wiring, VLs: wiring, VLsr: wiring, CVL: wiring, ina: node, inb: node, outa: node, outb: node, nd1: node, nd1r: node, nd1s: node, nd1sr: node, nd2: node, M1: transistor, M1r: transistor, M1s: transistor, M1sr: transistor, M2: transistor, M2r: transistor, M2m: transistor, M2mr: transistor, M2p: transistor, M2pr: transistor, M3: transistor, M3r: transistor, M4: transistor, M4r: transistor, M4p: transistor, M4pr: transistor, M5: transistor, M5r: transistor, M5s: transistor, M5sr: transistor, M6: transistor, M6r: transistor, M7: transistor, M7r: transistor, M8: transistor, M8r: transistor, MZ: transistor, S01a: switch, S01b: switch, S02a: switch, S02b: switch, S03: switch, A3: analog switch, A3r: analog switch, A4: analog switch, A4r: analog switch, C1: capacitor, C1r: capacitor, C1s: capacitor, C1sr: capacitor, C2: capacitor, C2r: capacitor, C2s: capacitor, C2sr: capacitor, CE: capacitor, CEB: capacitor, CC: capacitor, RE: resistor, REB: resistor, DE: diode element, DEB: diode element, ADCa: analog-digital converter circuit, ADCb: analog-digital converter circuit, LC: load circuit, LCr: load circuit, VR: variable resistor, VC: circuit, MR: MTJ element, PCM: phase-change memory, BGI: insulator, FGI: insulator, BGE: conductor, FGE: conductor, PE: conductor, WE: conductor, $N_1^{(1)}$: neuron, $N_p^{(1)}$: neuron, $N_1^{(k-1)}$: neuron, $N_i^{(k-1)}$: neuron, $N_m^{(k-1)}$: neuron, $N_1^{(k)}$: neuron, $N_j^{(k)}$: neuron, $N_n^{(k)}$: neuron, $N_1^{(R)}$: neuron, $N_q^{(R)}$: neuron, 100: neural network, 110: arithmetic circuit, 120: arithmetic circuit, 130: arithmetic circuit, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 500A: transistor, 500B: transistor, 500C: transistor, 500D: transistor, 500E: transistor, 503: conductor, 503a: conductor, 503b: conductor, 505: conductor, 510: insulator, 511: insulator, 512: insulator, 514: insulator, 516: insulator, 518: conductor, 520: insulator, 522: insulator, 524: insulator, 530: oxide, 530a: oxide, 530b: oxide, 530c: oxide, 531a: region, 531b: region, 540: conductor, 540a: conductor, 540b: conductor, 542: conductor, 542a: conductor, 542b: conductor, 543a: region, 543b: region, 544: insulator, 545: insulator, 546: conductor, 546a: conductor, 546b: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576a: insulator, 576b: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: extension device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7520: main body, 7522: controller

What is claimed is:

1. A semiconductor device comprising a first circuit and a second circuit,
the first circuit comprises:
first to fourth transistors; and
a first capacitor,
the second circuit comprises:
fifth to eighth transistors; and
a second capacitor,
wherein a first terminal of the first transistor is electrically connected to a gate of the second transistor,
wherein a first terminal of the second transistor is electrically connected to a first terminal of the third transistor and a first terminal of the fourth transistor,
wherein the first terminal of the third transistor is electrically connected to the first terminal of the fourth transistor,
wherein a second terminal of the third transistor is electrically connected to a first wiring,
wherein a gate of the third transistor is electrically connected to a first input wiring,
wherein a second terminal of the fourth transistor is electrically connected to a second wiring, and
wherein a gate of the fourth transistor is electrically connected to a second input wiring.

2. An electronic device comprising the semiconductor device according to claim 1, configured to perform arithmetic operation of a neural network using the semiconductor device.

3. A semiconductor device comprising a first circuit and a second circuit,
the first circuit comprises:
first to fourth transistors; and
a first capacitor,
the second circuit comprises:
fifth to eighth transistors; and
a second capacitor,
wherein a first terminal of the first transistor is electrically connected to a gate of the second transistor and a first terminal of the first capacitor,
wherein a first terminal of the second transistor is electrically connected to a second terminal of the first capacitor,
wherein a second terminal of the second transistor is electrically connected to a first terminal of the third transistor and a second terminal of the fourth transistor,
wherein the first terminal of the third transistor is electrically connected to the first terminal of the fourth transistor,
wherein a second terminal of the third transistor is electrically connected to a first wiring,
wherein a gate of the third transistor is electrically connected to a first input wiring,
wherein a second terminal of the fourth transistor is electrically connected to a second wiring, and
wherein a gate of the fourth transistor is electrically connected to a second input wiring.

4. An electronic device comprising the semiconductor device according to claim 3, configured to perform arithmetic operation of a neural network using the semiconductor device.

5. A semiconductor device comprising a first circuit and a second circuit,
the first circuit comprises:
first to fourth transistors; and
a first capacitor,
the second circuit comprises:
fifth to eighth transistors; and
a second capacitor,
wherein a first terminal of the first transistor is electrically connected to a gate of the second transistor,
wherein a first terminal of the second transistor is electrically connected to a first terminal of the third transistor and a first terminal of the fourth transistor,
wherein the first terminal of the third transistor is electrically connected to a first terminal of the fourth transistor,
wherein a second terminal of the third transistor is electrically connected to a first wiring,
wherein a gate of the third transistor is electrically connected to a first input wiring,
wherein a second terminal of the fourth transistor is electrically connected to a second wiring,
wherein a gate of the fourth transistor is electrically connected to a second input wiring,
wherein a first terminal of the fifth transistor is electrically connected to a gate of the sixth transistor,
wherein a first terminal of the sixth transistor is electrically connected to a first terminal of the seventh transistor and a first terminal of the eighth transistor,
wherein the first terminal of the seventh transistor is electrically connected to the first terminal of the eighth transistor,
wherein a second terminal of the seventh transistor is electrically connected to the second wiring,
wherein a gate of the seventh transistor is electrically connected to the first input wiring,
wherein a second terminal of the eighth transistor is electrically connected to the first wiring, and
wherein a gate of the eighth transistor is electrically connected to the second input wiring.

6. An electronic device comprising the semiconductor device according to claim 5, configured to perform arithmetic operation of a neural network using the semiconductor device.

* * * * *